(12) United States Patent
Myung et al.

(10) Patent No.: US 11,044,042 B2
(45) Date of Patent: *Jun. 22, 2021

(54) APPARATUS AND METHOD FOR ENCODING AND DECODING CHANNEL IN COMMUNICATION OR BROADCASTING SYSTEM

(71) Applicant: Samsung Electronics Co., Ltd., Suwon-si (KR)

(72) Inventors: Seho Myung, Seoul (KR); Kyungjoong Kim, Seoul (KR); Min Jang, Seongnam-si (KR); Hongsil Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

This patent is subject to a terminal disclaimer.

(21) Appl. No.: 16/458,830

(22) Filed: Jul. 1, 2019

(65) Prior Publication Data

US 2019/0334652 A1  Oct. 31, 2019

Related U.S. Application Data

(63) Continuation of application No. 15/390,100, filed on Dec. 23, 2016, now Pat. No. 10,341,050.

(30) Foreign Application Priority Data

Dec. 23, 2015 (KR) ......................... 10-2015-0185457
Jan. 8, 2016 (KR) ......................... 10-2016-0002902
(Continued)

(51) Int. Cl.
*H03M 13/00* (2006.01)
*H04L 1/00* (2006.01)
(Continued)

(52) U.S. Cl.
CPC ....... *H04L 1/0041* (2013.01); *H03M 13/1102* (2013.01); *H03M 13/116* (2013.01);
(Continued)

(58) Field of Classification Search
CPC ............ H04L 1/0041; H03M 13/1102; H03M 13/116; H03M 13/618
See application file for complete search history.

(56) References Cited

U.S. PATENT DOCUMENTS 5,404,355 A * 4/1995 Raith .................... H04W 48/12
                                                      370/311
5,943,344 A * 8/1999 Keller ................. H04L 12/6418
                                                      370/468
(Continued)

FOREIGN PATENT DOCUMENTS

JP   2015-177289 A   10/2015
WO   2014/200280 A2  12/2014

OTHER PUBLICATIONS

Kschischang et al., "Factor Graphs and the Sum-Product Algorithm", IEEE Transactions on Information Theory, vol. 47, No. 2, Feb. 2001, pp. 498-519.
(Continued)

*Primary Examiner* — Esaw T Abraham
(74) *Attorney, Agent, or Firm* — Jefferson IP Law, LLP

(57) ABSTRACT

The present invention related to a 5G or pre-5G communication system to be provided to support a higher data transmission rate since 4G communication systems like LTE. The present invention relates to a method and an apparatus for encoding a channel in a communication or broadcasting system supporting parity-check matrices having various sizes are provided. The method for encoding a channel includes determining a block size of the parity-check matrix; reading a sequence for generating the parity-check matrix, and transforming the sequence by applying a
(Continued)

previously defined operation to the sequence based on the determined block size.

22 Claims, 28 Drawing Sheets

(30) Foreign Application Priority Data

| | | | |
|---|---|---|---|
| Jan. 18, 2016 | (KR) | ......................... | 10-2016-0006138 |
| Feb. 16, 2016 | (KR) | ......................... | 10-2016-0018016 |
| May 30, 2016 | (KR) | ......................... | 10-2016-0066749 |

(51) Int. Cl.
    *H03M 13/11* (2006.01)
    *H04W 84/04* (2009.01)

(52) U.S. Cl.
    CPC ....... *H03M 13/616* (2013.01); *H03M 13/618* (2013.01); *H03M 13/6306* (2013.01); *H04L 1/0057* (2013.01); *H04L 1/0058* (2013.01); *H04L 1/0009* (2013.01); *H04W 84/042* (2013.01)

(56) References Cited

U.S. PATENT DOCUMENTS

| | | | |
|---|---|---|---|
| 7,002,900 B2 | 2/2006 | Walton et al. | |
| 7,055,086 B2 | 5/2006 | Lam | |
| 7,139,959 B2 | 11/2006 | Hocevar | |
| 7,178,080 B2 | 2/2007 | Hocevar | |
| 7,409,001 B2 | 8/2008 | Ionescu et al. | |
| 7,698,623 B2 | 4/2010 | Hedberg et al. | |
| 7,721,680 B2 * | 5/2010 | Radke | ..................... F22B 37/24 |
| | | | 122/510 |
| 8,196,012 B2 | 6/2012 | Lau et al. | |
| 8,509,051 B2 * | 8/2013 | Ling | ..................... H04L 5/0007 |
| | | | 370/203 |
| 8,605,705 B2 * | 12/2013 | Vijayan | ................. H04L 1/0065 |
| | | | 370/344 |
| 8,826,093 B2 * | 9/2014 | Walker | .................. H04L 1/0057 |
| | | | 714/748 |
| 9,143,284 B2 * | 9/2015 | Mikami | ................ H04L 1/1829 |
| 9,225,470 B2 * | 12/2015 | Kim | ....................... H04L 1/0071 |
| 9,509,452 B2 * | 11/2016 | Liang | .................... H04L 1/1854 |
| 9,590,765 B2 * | 3/2017 | Pi | ............................... H04L 1/04 |
| 2002/0085486 A1 * | 7/2002 | Ehrmann-Patin | ........................... |
| | | | H04L 27/2604 |
| | | | 370/210 |
| 2003/0086366 A1 * | 5/2003 | Branlund | ........... H04B 1/71052 |
| | | | 370/208 |
| 2003/0097629 A1 | 5/2003 | Moon et al. | |
| 2004/0148560 A1 | 7/2004 | Hocevar | |
| 2004/0266351 A1 * | 12/2004 | Chuah | ................... H04W 16/04 |
| | | | 455/62 |
| 2007/0086539 A1 | 4/2007 | Hocevar | |
| 2008/0204286 A1 | 8/2008 | Kose | |
| 2011/0197106 A1 | 8/2011 | Kishigami et al. | |
| 2013/0013976 A1 | 1/2013 | Earnshaw et al. | |
| 2016/0119677 A1 | 4/2016 | Oh et al. | |

OTHER PUBLICATIONS

"IEEE Standard for Information Technology—Telecommunications and information exchange between systems—Local and metropolitan area networks—Specific requirements Part 11: Wireless LAN Medium Access Control (MAC) and Physical Layer (PHY) Specifications Amendment 5: Enhancements for Higher Throughput", IEEE Std 802.11n™—2009, Oct. 29, 2009, pp. 482-502.

Myung et al., "Quasi-Cyclic LDPC Codes for Fast Encoding", IEEE Transactions on Information Theory, vol. 51, Aug. 2005, pp. 2894-2901.

Myung et al., "Lifting Methods for Quasi-Cyclic LDPC Codes", IEEE Communications Letters, vol. 10, No. 6, Jun. 2006, pp. 489-491.

DVB Organization: Analysis on 3GPP E-MBMS; XP017838635; DVB-NGH Physical Layer Convergence.pdf, DVB, Digital Video Broadcasting, C/O EBU—17A Ancienne Route—CH—1218 Grand Saconnex; Feb. 9, 2012, Geneva—Switzerland.

Extended European Search Report dated Mar. 5, 2019, issued in a counterpart European application No. 16879426.1-1220/3378164.

\* cited by examiner

FIG. 3

| Partial matrix 1 [information word] | | | | | Partial matrix 2 [first parity] | Partial matrix 3 [second parity] | | | | | |
|---|---|---|---|---|---|---|---|---|---|---|---|
| $p^{a_{11}}$ | $p^{a_{12}}$ | $p^{a_{13}}$ | ... | $p^{a_{1k}}$ | $p^{b_1}$ | $I$ | $0$ | $0$ | ... | $0$ | $0$ |
| $p^{a_{21}}$ | $p^{a_{22}}$ | $p^{a_{23}}$ | ... | $p^{a_{2k}}$ | $0$ | $p^{b_2}$ | $I$ | $0$ | ... | $0$ | $0$ |
| $p^{a_{31}}$ | $p^{a_{32}}$ | $p^{a_{33}}$ | ... | $p^{a_{3k}}$ | ... | $0$ | $p^{b_3}$ | $I$ | ... | $0$ | $0$ |
| $p^{a_{41}}$ | $p^{a_{42}}$ | $p^{a_{43}}$ | ... | $p^{a_{4k}}$ | $p^y$ | $0$ | ... | $0$ | ... | $0$ | $0$ |
| $p^{a_{51}}$ | $p^{a_{52}}$ | $p^{a_{53}}$ | ... | $p^{a_{5k}}$ | $0$ | $0$ | ... | $0$ | ... | $I$ | $0$ |
| ... | ... | ... | ... | ... | ... | ... | ... | ... | ... | $p^{b_{m-1}}$ | $I$ |
| $p^{a_{m1}}$ | $p^{a_{m2}}$ | $p^{a_{m3}}$ | ... | $p^{a_{mk}}$ | $p^x$ | $0$ | $0$ | $0$ | ... | $0$ | $p^{b_m}$ |

FIG. 11A

FIG. 11B
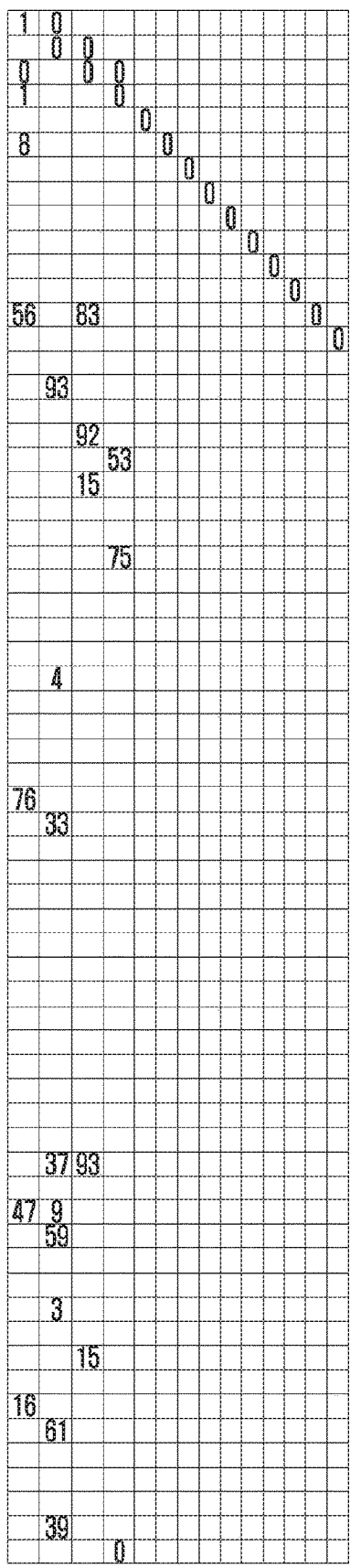
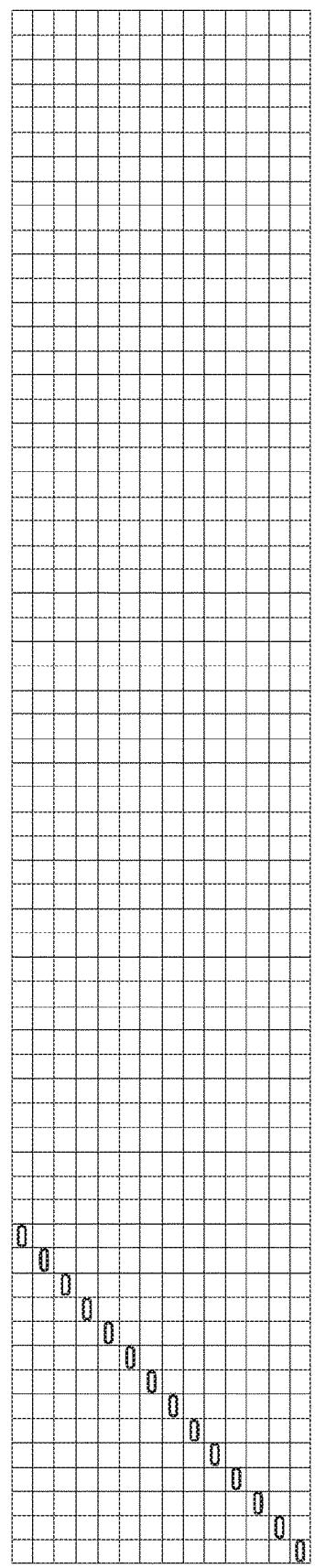

FIG. 12A

| 29 | 86 | 48 | 36 | 34 | 14 |    |    |    |    | 52 |    |    | 64 | 1  |    | 37 | 28 |    | 1  | 0  |    |    |
|----|----|----|----|----|----|----|----|----|----|----|----|----|----|----|----|----|----|----|----|----|----|----|
| 54 | 34 | 78 | 3  | 10 | 24 | 9  |    | 13 | 29 |    |    | 34 | 60 |    |    |    |    |    | 0  | 0  |    |    |
| 9  | 94 | 75 | 58 | 83 | 62 |    | 21 |    |    |    | 68 |    | 14 |    |    | 17 |    | 53 |    | 0  | 0  |    |
| 42 | 48 | 67 | 30 | 65 | 66 |    |    | 94 |    | 17 |    | 77 |    | 45 | 88 |    |    |    |    |    | 0  | 0  |
| 10 | 10 | 3  | 57 | 45 | 8  |    | 49 | 31 |    |    |    |    |    | 38 |    |    |    | 82 |    |    | 0  | 0  |
| 36 | 44 | 45 | 58 | 6  | 3  | 25 |    |    |    | 76 |    | 8  | 35 |    |    |    | 31 |    |    |    |    | 0  |
| 57 | 64 | 44 | 53 | 94 | 77 |    |    | 94 |    | 55 | 86 |    | 84 |    |    |    |    |    | 0  |    |    |    |
| 39 | 2  | 73 | 41 | 54 | 71 | 63 |    |    |    |    | 83 |    |    | 37 |    | 91 |    | 89 |    |    |    |    |
| 27 | 85 | 39 | 42 | 58 | 40 |    | 9  |    | 3  | 89 |    |    |    |    | 69 |    |    | 95 |    |    |    |    |
| 66 | 80 | 22 | 36 | 54 | 49 |    |    | 43 |    |    |    |    | 13 |    | 52 | 22 |    | 16 |    |    |    |    |
| 62 | 41 | 83 | 43 | 72 | 61 |    | 22 |    |    |    |    |    |    |    | 50 |    | 93 |    | 40 |    |    |    |
| 20 | 1  | 52 | 81 | 76 | 60 |    | 27 |    |    |    | 89 |    |    |    |    |    |    | 1  |    |    |    |    |
| 28 |    |    | 36 |    |    | 51 |    |    |    |    |    |    |    |    |    |    |    |    |    | 28 |    | 93 |
|    | 49 | 23 |    | 77 | 51 |    |    |    |    |    |    |    | 3  |    |    |    | 63 |    |    |    |    |    |
|    |    | 40 |    | 41 |    |    |    |    |    |    | 39 |    |    |    |    |    |    |    | 81 |    | 40 |    |
| 34 | 80 |    | 48 |    | 20 |    |    |    |    |    |    |    |    |    |    |    |    |    |    |    |    |    |
|    | 40 | 1  |    |    | 11 |    |    |    |    |    |    |    |    |    |    |    |    | 68 |    | 48 |    |    |
| 69 |    |    | 62 | 88 |    |    |    | 39 | 66 |    |    |    |    |    |    |    |    |    |    |    |    |    |
|    |    | 39 |    |    | 59 |    |    |    |    |    | 67 |    |    |    |    |    |    |    | 58 | 30 |    |    |
| 26 | 14 |    | 59 | 19 |    | 52 |    | 25 |    |    |    |    |    |    |    |    |    | 94 |    |    |    |    |
|    |    | 94 |    | 57 |    |    | 17 |    |    |    |    |    |    |    |    |    |    |    | 55 |    |    |    |
| 43 | 39 |    |    |    |    |    |    |    | 82 |    |    |    |    |    |    |    |    |    |    |    |    | 18 |
|    |    | 71 | 46 |    | 30 |    |    |    |    |    | 40 |    |    |    |    |    |    |    |    |    |    |    |
|    | 26 |    | 52 |    |    |    |    |    |    |    |    |    |    | 24 |    |    |    |    |    |    |    |    |
|    |    |    |    | 70 |    |    |    |    |    | 21 |    |    |    |    |    |    |    | 95 |    |    |    | 94 |
| 84 |    |    | 60 |    |    | 68 |    |    |    |    |    |    |    |    |    | 17 |    |    |    |    |    |    |
|    | 90 | 78 |    | 9  |    |    | 42 |    |    |    |    |    |    |    |    |    |    |    |    |    |    |    |
| 16 |    |    |    | 66 |    |    | 62 |    |    |    |    |    |    |    |    |    |    |    |    |    |    |    |
| 49 |    |    | 83 | 74 |    |    |    |    |    |    |    |    |    |    |    |    |    | 67 |    | 79 |    |    |
|    | 7  |    |    | 54 |    |    |    |    |    | 58 |    |    |    |    |    |    |    |    |    |    |    |    |
|    |    |    | 77 | 65 | 56 |    |    |    |    |    |    |    |    |    |    |    |    |    |    | 13 |    |    |
| 43 |    | 70 | 71 |    |    |    |    |    |    |    |    |    |    |    |    |    |    | 78 |    |    |    | 82 |
|    |    |    | 69 | 69 |    |    |    |    |    |    |    |    |    | 30 |    |    |    |    | 54 |    |    |    |
| 86 | 54 |    | 1  |    |    | 34 |    |    |    |    |    |    |    |    |    |    |    |    |    |    |    |    |
|    |    |    |    | 28 | 22 |    |    |    |    |    |    |    |    |    |    |    |    | 32 | 27 |    |    |    |
|    |    | 50 | 21 |    |    |    |    |    |    |    |    |    |    |    |    |    | 0  |    |    |    | 54 |    |
| 7  | 80 |    |    | 16 |    |    |    |    |    |    |    |    |    |    |    |    |    |    | 40 |    |    |    |
|    |    | 50 | 41 |    | 74 |    |    |    |    |    |    |    |    |    |    |    |    |    |    |    | 52 |    |
|    |    |    | 23 |    |    |    |    |    |    | 14 |    |    |    |    |    |    |    |    |    |    |    |    |
|    | 52 |    |    |    |    |    |    |    |    |    |    |    |    |    |    |    |    | 57 |    | 14 |    |    |
| 66 |    |    |    | 66 |    |    | 31 |    |    |    |    |    |    |    |    | 7  |    |    |    |    |    |    |
|    |    |    | 52 |    |    |    |    | 39 |    |    |    |    |    |    |    |    |    |    |    | 3  |    |    |
| 27 |    |    |    | 63 |    |    |    |    |    |    |    |    | 2  |    |    |    |    |    |    |    |    |    |
|    |    |    | 34 |    |    | 41 |    |    |    |    |    |    |    |    |    |    |    |    |    |    |    |    |
| 9  |    |    |    | 71 |    |    |    |    |    |    |    |    |    |    | 24 |    | 6  |    |    |    |    |    |
|    |    | 38 | 60 |    | 31 |    |    |    |    |    |    |    |    |    |    |    |    |    |    |    |    |    |
|    |    |    | 54 |    |    |    |    |    |    |    |    |    |    |    |    |    |    | 26 |    | 43 |    |    |
|    | 70 |    |    | 34 |    |    | 65 |    |    |    |    |    |    |    |    |    |    |    |    |    |    |    |

FIG. 13A

| 50 | 39 |    | 22 | 49 |    |    |    | 43 |    |    |    |    |    | 1  | 0  |    |    |
|    |    | 23 | 23 |    |    |    | 39 | 82 |    |    |    |    | 85 |    | 0  | 0  |    |
|    |    |    |    |    | 28 |    |    |    | 85 |    | 32 | 45 | 29 |    |    | 0  | 0  |
| 63 |    | 29 |    | 56 |    |    | 0  |    | 93 |    |    |    |    |    |    | 0  | 0  |
| 13 | 80 |    | 68 |    |    |    | 68 |    | 88 |    |    |    |    |    |    |    | 0  |
|    |    | 88 |    | 44 | 89 | 33 |    |    |    |    |    | 91 |    |    |    |    |    |
| 53 | 86 | 42 | 40 |    |    |    |    | 89 |    |    |    |    |    |    |    |    |    |
|    |    |    | 60 | 85 | 55 | 58 |    |    |    |    |    | 82 |    |    |    |    |    |
|    | 37 | 82 | 91 | 9  | 36 |    |    |    |    |    |    |    |    |    |    |    |    |
| 46 |    | 48 | 14 | 72 |    |    |    |    |    |    |    |    | 17 |    |    |    |    |
| 71 | 16 | 21 |    |    | 78 |    |    |    |    |    |    |    | 0  |    |    |    |    |
| 45 | 33 | 39 |    | 61 |    |    |    | 4  |    |    |    |    |    |    |    |    |    |
|    | 75 | 28 |    | 46 |    |    |    |    |    | 85 |    |    |    |    |    |    |    |
| 13 | 93 | 92 | 31 |    |    |    | 16 |    |    |    |    |    |    |    |    |    |    |
| 42 |    | 74 | 45 | 52 |    |    | 53 |    |    |    |    |    |    |    |    |    |    |
|    |    |    |    | 65 | 76 | 91 |    |    |    | 55 |    | 34 |    |    |    |    |    |
| 78 | 34 | 41 |    | 48 |    | 27 |    |    |    |    |    |    |    |    |    |    |    |
| 72 | 83 |    | 24 | 53 |    |    |    |    |    |    |    | 2  |    |    |    |    |    |
| 54 | 40 |    | 7  | 73 |    | 87 |    |    |    |    |    |    |    |    |    |    |    |
|    | 20 | 54 |    | 7  | 14 |    |    |    |    | 60 |    |    |    | 1  |    |    |    |
| 56 | 35 | 11 |    | 4  |    |    |    |    |    |    |    |    |    |    |    |    |    |
|    |    |    |    |    |    |    |    |    |    |    |    |    |    | 12 | 55 |    | 93 |
|    |    |    | 42 | 34 |    |    |    |    |    |    |    |    |    |    |    |    |    |
|    | 78 |    |    |    |    |    |    |    |    |    |    |    |    | 56 |    |    | 15 |
| 9  |    |    |    |    |    |    |    |    |    |    |    |    |    |    |    |    | 50 |
|    |    | 62 |    |    |    |    |    |    |    |    |    |    |    | 82 |    |    |    |
|    |    | 62 | 70 |    |    |    |    |    |    |    |    | 16 |    |    |    |    |    |
| 53 | 71 |    |    | 38 |    |    |    |    |    |    |    |    |    | 41 |    |    | 67 |
|    | 11 | 37 |    | 47 |    |    |    |    |    |    |    |    |    |    |    |    |    |
| 39 |    |    | 92 |    |    |    |    |    |    |    |    |    |    |    |    | 88 | 33 |
|    |    |    |    |    |    |    |    |    | 95 |    |    |    |    |    |    | 20 |    |
| 93 | 95 |    |    |    |    |    |    | 29 |    |    |    |    |    |    |    |    |    |

| 50 | 51 | 94 | 93 |    |    | 38 |    |    |    |    |    |    |    | 1  | 0  |    |    |
|----|----|----|----|----|----|----|----|----|----|----|----|----|----|----|----|----|----|
| 23 |    | 37 | 93 |    | 69 | 39 |    |    |    |    |    |    |    |    | 0  | 0  |    |
| 90 |    |    | 93 |    |    | 28 |    |    |    |    |    |    |    |    |    | 0  | 0  |
| 93 |    | 19 | 75 |    |    |    | 37 | 23 |    |    |    |    |    |    |    | 0  | 0  |
| 32 |    |    |    |    |    |    |    |    | 47 | 25 |    | 41 | 10 |    |    |    | 0  |
| 89 | 81 | 41 | 83 |    |    |    |    |    |    |    | 36 |    |    |    |    |    |    |
| 81 |    | 3  |    |    |    |    |    | 21 |    |    |    |    |    |    |    |    |    |
| 72 | 48 |    |    | 7  |    |    |    |    |    |    | 92 | 14 |    |    |    |    |    |
| 58 | 49 | 86 |    | 57 |    |    |    |    |    |    |    |    | 89 |    |    |    |    |
| 32 | 90 |    | 22 |    | 44 |    |    |    |    |    |    |    |    |    |    |    |    |
| 86 |    | 75 |    | 59 | 11 |    |    |    |    |    |    |    |    | 0  |    |    |    |
| 24 | 7  |    |    | 53 |    | 32 | 89 |    |    |    |    |    |    |    |    |    |    |
| 3  | 12 | 62 | 79 |    | 41 |    |    |    |    |    |    |    |    |    |    |    |    |
| 85 |    | 70 | 5  |    | 55 |    | 81 |    |    |    |    |    |    |    |    |    |    |
| 68 |    |    | 16 | 69 |    |    | 74 |    | 5  |    |    |    |    |    |    |    |    |
| 52 | 39 | 7  | 4  |    |    |    |    | 21 |    |    |    |    |    |    |    |    |    |
| 33 | 41 | 14 |    |    |    |    |    |    | 88 |    | 58 |    |    |    |    |    |    |
| 27 | 93 |    | 80 |    |    |    |    |    |    | 19 |    | 60 |    |    |    |    |    |
| 24 | 50 |    | 82 | 3  |    |    |    |    |    | 82 |    |    |    |    |    |    |    |
| 45 | 49 | 16 | 54 |    |    |    |    |    |    |    |    | 56 |    |    |    |    |    |
| 7  |    |    |    | 50 |    |    | 3  |    | 81 |    |    |    | 1  |    |    |    |    |
|    | 48 | 29 |    |    |    |    |    |    |    |    |    |    |    |    |    |    | 83 |
| 17 |    |    | 52 |    |    |    |    |    |    |    |    |    |    |    | 10 |    |    |
| 40 | 9  | 56 |    |    |    |    |    |    |    |    |    |    |    |    |    |    |    |
|    |    |    | 84 |    |    |    |    |    |    |    |    |    |    |    | 43 |    |    |
| 58 |    |    |    |    |    |    |    |    |    |    |    |    |    |    |    |    |    |
|    | 14 |    |    |    |    |    |    |    |    |    |    |    |    |    |    |    |    |
| 24 |    |    |    |    |    |    |    |    |    |    |    |    |    |    |    |    | 48 |
|    |    | 3  |    |    |    |    | 59 |    |    |    |    |    |    |    |    |    |    |
| 32 |    | 5  |    |    |    |    |    |    |    |    |    |    |    |    |    |    |    |
|    | 7  |    | 65 |    |    |    |    |    |    |    |    |    |    |    | 37 | 19 |    |
|    |    |    |    |    |    |    |    |    |    |    |    |    |    | 37 |    | 71 |    |
| 85 |    |    | 69 |    |    |    |    |    |    |    |    |    |    |    |    |    |    |

| 54 | 19 | 24 | 68 | 12 | 2  | 18 | 16 | 13 | 46 | 66 | 52 | 21 | 9  |    | 80 | 24 |    | 3  | 11 | 1  | 0  |    |    |
|----|----|----|----|----|----|----|----|----|----|----|----|----|----|----|----|----|----|----|----|----|----|----|----|
| 10 | 76 | 29 | 30 | 8  | 28 | 16 | 35 | 62 | 53 | 57 | 53 | 15 | 38 | 72 | 73 |    | 45 | 38 | 71 |    | 0  | 0  |    |
| 70 | 71 | 31 | 35 | 20 | 21 | 6  | 56 | 36 | 52 | 22 | 37 | 50 | 27 | 58 | 16 | 56 | 41 |    |    | 0  |    | 0  | 0  |
| 41 | 24 | 25 | 49 | 28 | 6  | 28 | 60 | 22 | 70 | 11 | 27 | 1  |    | 67 |    | 22 | 78 | 76 | 5  | 1  |    |    | 0  |
| 27 | 70 | 45 | 45 | 28 | 9  | 29 | 30 | 39 | 29 | 56 | 80 | 29 |    |    |    |    |    |    |    |    |    |    |    |
|    | 77 | 8  | 69 | 49 | 68 | 78 |    | 66 | 8  | 6  | 79 | 40 |    |    |    |    |    |    |    |    |    |    |    |
| 74 | 37 |    | 41 | 6  |    |    |    | 57 | 63 |    |    |    |    |    | 56 |    |    |    |    |    |    |    |    |
|    |    | 24 |    |    | 16 | 74 | 27 | 44 |    |    | 42 | 12 |    |    |    |    |    |    |    |    |    |    |    |
|    | 9  | 20 |    | 25 |    |    |    |    | 18 | 3  | 59 |    |    |    |    |    |    |    |    |    |    |    |    |
|    |    |    | 79 |    | 5  | 78 |    | 1  |    |    | 22 |    |    |    |    |    |    |    |    |    | 27 |    |    |
|    | 24 | 47 |    |    | 67 | 30 |    |    |    | 43 |    |    | 18 |    |    | 42 |    |    |    |    |    |    |    |
|    |    |    | 78 |    |    |    | 58 | 51 | 70 |    | 35 |    |    |    |    |    |    |    |    |    | 64 |    |    |
|    | 0  |    | 78 |    | 39 |    | 66 | 38 |    |    |    |    | 4  |    |    |    |    |    | 63 |    |    |    |    |
|    |    | 45 |    | 3  |    |    |    |    | 12 | 11 | 38 |    |    |    |    | 80 |    |    |    |    |    |    |    |
|    |    | 62 | 57 | 12 |    |    | 26 |    |    |    |    |    |    |    |    |    |    | 27 | 35 |    |    |    |    |
|    | 29 |    |    |    | 34 |    |    | 23 |    | 51 | 3  |    |    |    |    |    |    |    |    |    |    |    |    |
|    |    | 48 |    |    |    |    | 44 |    |    |    | 54 |    |    |    |    | 71 | 61 |    |    |    |    |    |    |
|    |    |    | 7  |    | 33 |    |    | 28 |    |    |    |    | 2  |    |    |    |    |    |    |    |    |    |    |
|    | 48 |    | 11 |    |    |    |    |    | 64 | 42 |    |    |    |    |    |    |    |    |    |    |    |    |    |
|    |    |    |    | 73 |    |    |    |    |    |    |    |    | 73 |    |    |    |    |    | 77 |    | 37 |    |    |
|    | 45 |    |    |    |    |    |    |    | 40 |    | 56 |    |    |    |    |    |    |    |    |    | 65 |    |    |
|    |    | 51 |    |    |    | 12 |    |    |    | 40 |    |    |    |    |    |    |    | 41 |    |    |    |    |    |
|    |    |    | 53 | 5  |    |    | 77 |    |    |    |    |    |    |    |    |    | 39 |    |    |    |    |    |    |
|    |    |    |    |    |    |    |    |    |    |    | 68 |    | 52 |    | 11 | 57 |    |    |    |    |    |    |    |
|    |    |    |    |    |    |    | 66 |    |    | 32 |    |    |    |    | 60 |    |    |    | 29 |    |    |    |    |
|    |    |    |    | 22 |    |    |    |    | 9  |    |    |    | 28 |    |    |    |    |    |    |    |    |    |    |
| 58 |    |    |    | 71 |    |    |    |    |    |    | 42 |    |    |    |    |    |    |    |    |    |    |    |    |
|    | 8  | 75 |    |    |    |    |    |    |    |    |    | 43 |    |    |    |    |    |    |    |    |    |    |    |
|    |    |    |    |    |    |    |    | 32 |    | 18 |    |    |    |    |    |    |    | 1  |    | 76 |    |    |    |
|    | 53 |    |    |    |    |    | 41 |    |    |    |    |    |    |    |    | 42 |    |    | 15 |    |    |    |    |
|    |    |    |    |    |    |    |    |    |    |    | 15 |    | 10 |    | 44 |    | 4  |    |    |    |    |    |    |
|    |    | 59 |    | 42 | 18 |    |    |    |    |    |    |    |    |    |    |    |    |    |    |    |    |    |    |
| 52 | 12 |    |    |    | 49 |    | 74 |    |    |    |    |    |    |    |    |    |    |    |    |    |    |    |    |
|    |    | 39 |    |    |    |    |    | 38 | 18 |    | 21 |    |    |    |    |    |    |    |    |    |    |    |    |
|    |    |    |    | 47 |    |    |    |    |    |    |    |    | 14 |    |    |    |    |    |    | 18 | 48 |    |    |
|    |    |    |    |    | 31 |    |    |    | 31 |    |    |    |    |    | 17 |    | 49 |    |    |    |    |    |    |
|    |    | 26 |    |    |    |    |    |    |    | 14 |    |    |    |    | 1  | 4  |    |    |    |    |    |    |    |
|    |    |    |    |    | 14 |    | 65 |    |    | 2  |    |    | 77 |    |    |    |    |    |    |    |    |    |    |
|    |    |    |    |    |    |    |    | 37 |    |    |    | 53 |    |    |    |    |    | 74 |    |    |    |    |    |
|    |    | 37 |    |    |    | 50 |    |    |    |    |    |    |    |    |    |    |    |    |    | 16 |    |    |    |

B

APPARATUS AND METHOD FOR ENCODING AND DECODING CHANNEL IN COMMUNICATION OR BROADCASTING SYSTEM

CROSS-REFERENCE TO RELATED APPLICATION(S)

This application is a continuation application of prior application Ser. No. 15/390,100, filed on Dec. 23, 2016, which has issued as U.S. Pat. No. 10,341,050 on Jul. 2, 2019, which was based on and claimed priority under 35 U.S.C. § 119(a) of a Korean patent application number 10-2015-0185457, filed on Dec. 23, 2015, in the Korean Intellectual Property Office, a Korean patent application number 10-2016-0002902, filed on Jan. 8, 2016, in the Korean Intellectual Property Office, a Korean patent application number 10-2016-0006138, filed on Jan. 18, 2016, in the Korean Intellectual Property Office, a Korean patent application number 10-2016-0018016, filed on Feb. 16, 2016, in the Korean Intellectual Property Office, and a Korean patent application number 10-2016-0066749, filed on May 30, 2016, in the Korean Intellectual Property Office, the disclosure of each of which is incorporated by reference herein in its entirety.

TECHNICAL FIELD

The present disclosure relates to an apparatus and a method for encoding and decoding a channel in a communication or broadcasting system.

BACKGROUND

To meet the demand for wireless data traffic having increased since deployment of fourth generation (4G) communication systems, efforts have been made to develop an improved fifth generation (5G) or pre-5G communication system. Therefore, the 5G or pre-5G communication system is also called a 'Beyond 4G Network' or a 'Post long term evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, hybrid frequency shift keying (FSK) and quadrature amplitude modulation (QAM) modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a communication/broadcasting system, link performance may remarkably deteriorate due to various types of noises, a fading phenomenon, and inter-symbol interference (ISI) of a channel. Therefore, to implement high-speed digital communication/broadcasting systems requiring high data throughput and reliability like next-generation mobile communications, digital broadcasting, and portable Internet, there is a need to develop technologies to overcome the noises, the fading, and the inter-symbol interference. As part of studies to overcome the noises, etc., a study on an error correcting code which is a method for increasing reliability of communications by efficiently recovering distorted information has been actively conducted recently.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is directed to provide a method and an apparatus for low-density parity-check (LDPC) encoding/decoding capable of supporting various input lengths and coding rates. Further, an object of the present disclosure is to provide a method and an apparatus for LDPC encoding/decoding capable of supporting various codeword lengths from a designed parity-check matrix.

Another aspect of the present disclosure is to provide a method for encoding a channel comprising determining a block size of a parity-check matrix, reading a sequence for generating the parity-check matrix, transforming the sequence based on the determined block size, and generating parity bits for information word bits based on the transformed sequence.

Another aspect of the present disclosure is to provide a method for encoding a channel, the method comprising identifying a size of an input bit, determining a number of code blocks based on the size of the input bit and a maximum number of information bits corresponding to a largest parity-check matrix, determining a size of a code block, determining a number of padding bits based on the size of the code block, determining the code block by applying padding according to the determined number of padding bits, determining a parity-check matrix based on the size of the code block, and encoding the code block based on the parity-check matrix.

Another aspect of the present disclosure is to provide a method for decoding a channel, the method comprising determining a size of an input bit before segmentation from a received signal, determining a number of code blocks based on the size of the input bit and the maximum number of information bits corresponding to a largest parity-check matrix, determining a size of a code block, determining the number of padding bits based on at least one of sizes of code blocks, determining the code block by applying padding according to the determined number of padding bits, determining a parity-check matrix based on the size of the code block, and decoding the code block based on the parity-check matrix.

Another aspect of the present disclosure is to provide an apparatus for encoding a channel, the apparatus comprising a transceiver at least one processor configured to identify a size of an input bit, determine a number of code blocks based on the size of the input bit and a maximum number of information bits corresponding to a largest parity-check matrix, determine a size of the code block, determine the number of code blocks and the number of padding bits based on the size of the code block, determine the code block by applying padding according to the determined number of padding bits, determine a parity-check matrix based on the size of the code block, and encode the code block based on the parity-check matrix.

Another aspect of the present disclosure is to provide an apparatus for decoding a channel, the apparatus comprising a transceiver for transmitting and receiving a signal, and at least one processor configured to determine a size of an input bit before segmentation is applied from a received signal, determine a number of code blocks based on the size of the input bit and the maximum number of information bits corresponding to the largest parity-check matrix, determine a size of a code block, determine the number of code blocks and a number of padding bits based on the size of the code block, determine the code block by applying padding according to the determined number of padding bits, determine a parity-check matrix based on the size of the code block, and decode the code block based on the parity-check matrix.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 is a diagram illustrating a basic structure of the parity-check matrix according to an embodiment of the present disclosure;

FIGS. 11A and 11B are diagrams illustrating a parity-check matrix according to an embodiment of the present disclosure;

FIGS. 12A and 12B are diagrams illustrating a parity-check matrix according to the embodiment of the present disclosure;

Figure 13B:
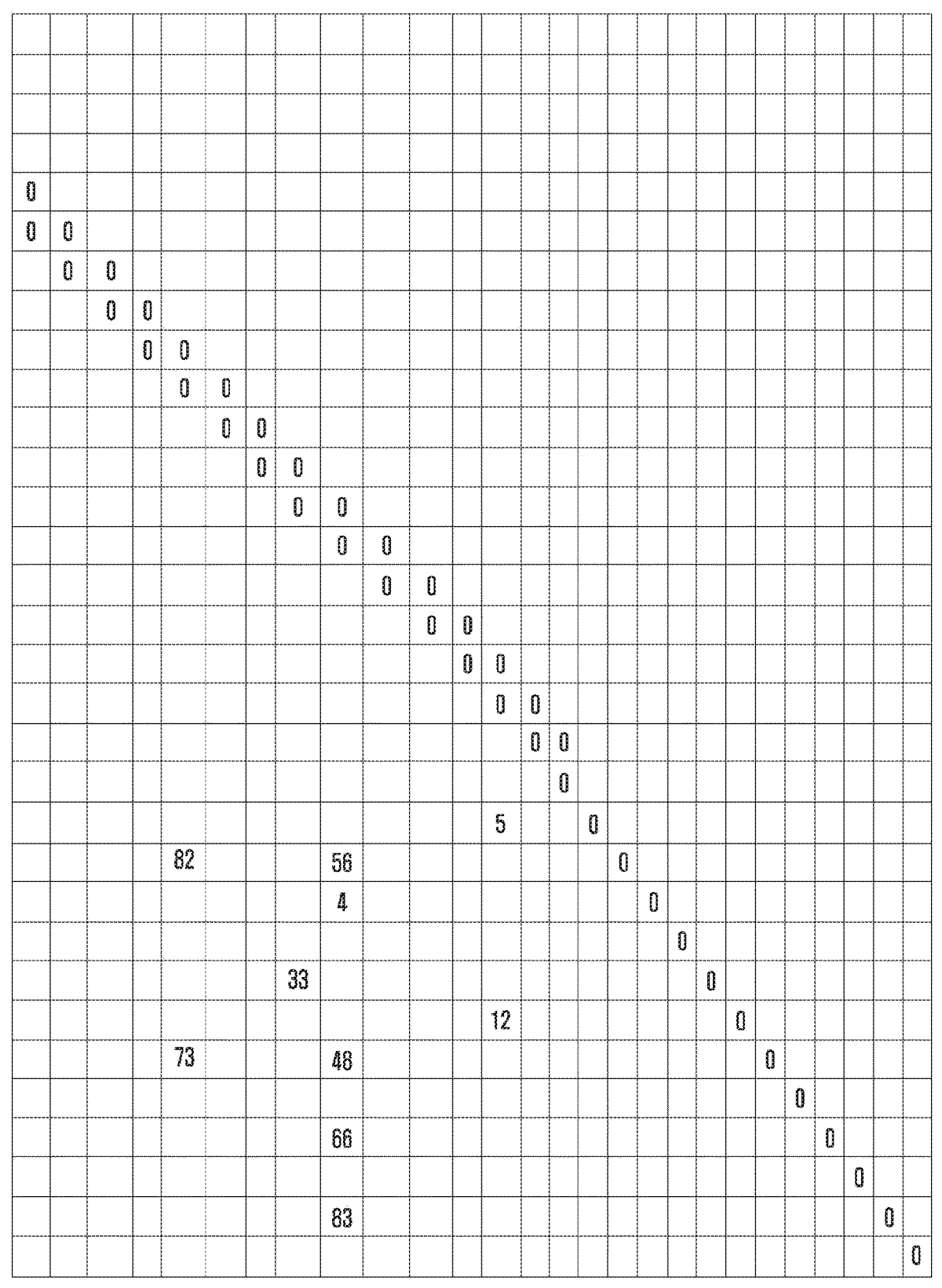

FIGS. 13A and 13B are diagrams illustrating a parity-check matrix according to the embodiment of the present disclosure;

Figure 14A:
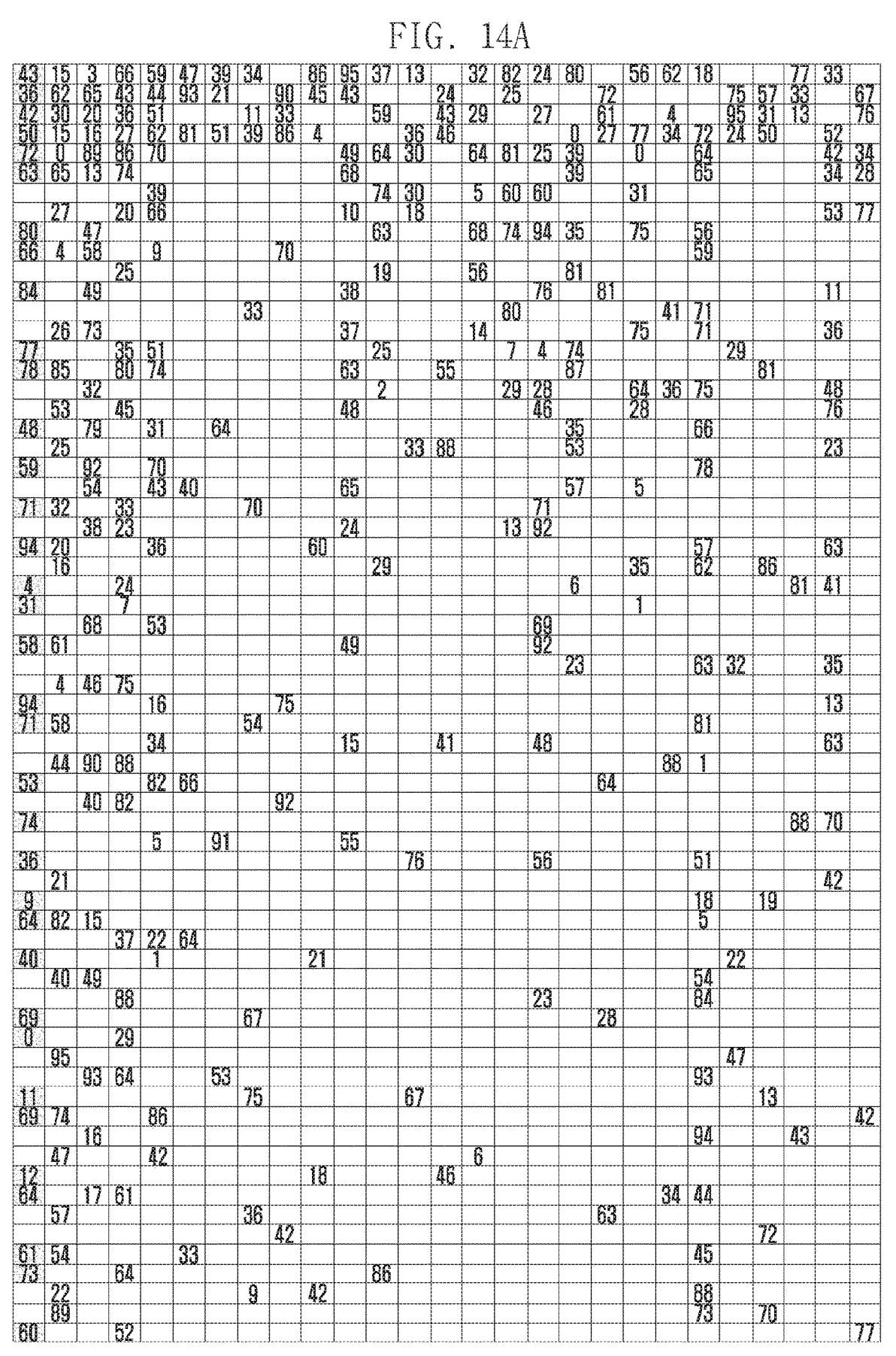
Figure 14B:
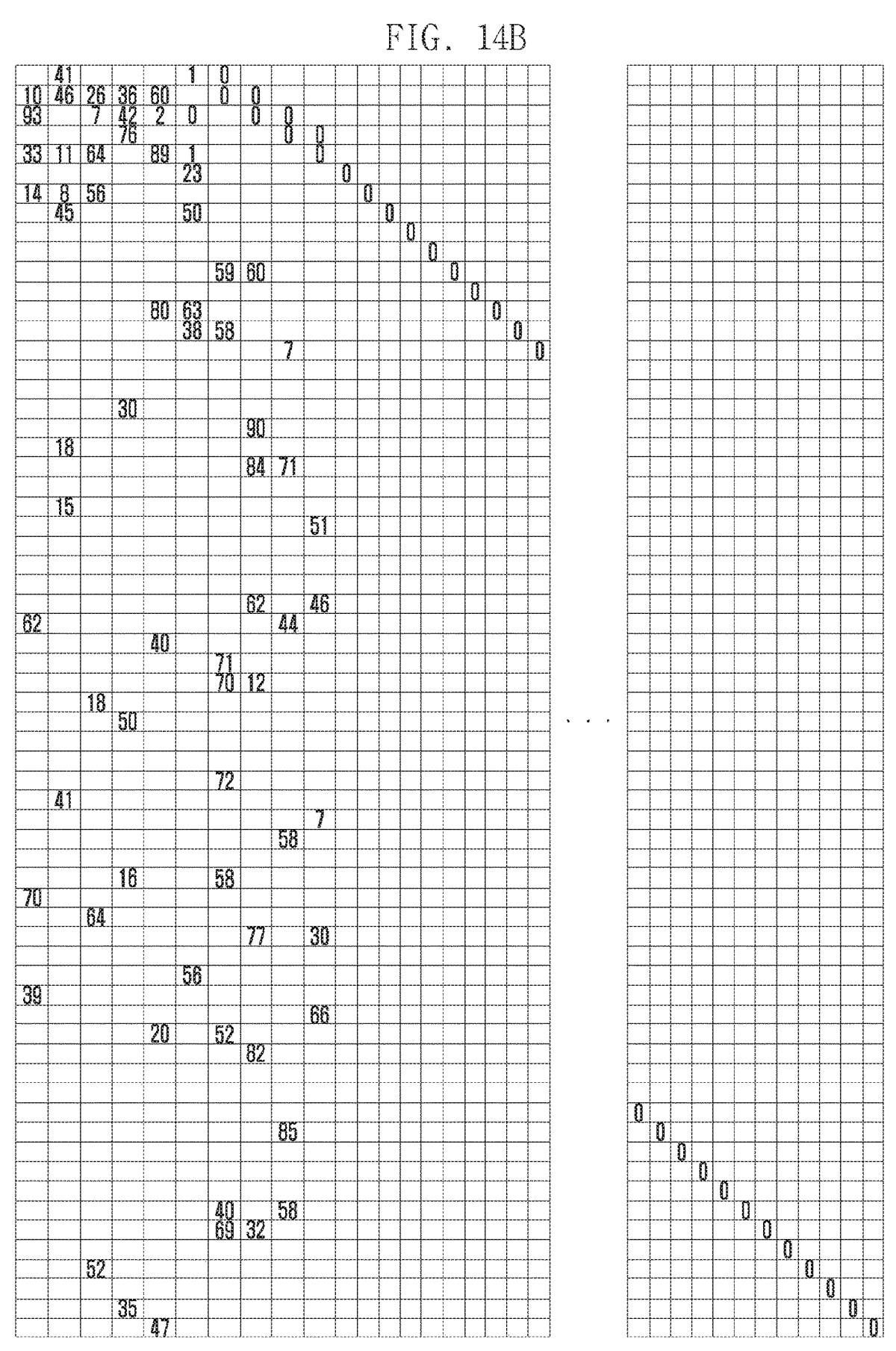

FIGS. 14A and 14B are diagrams illustrating a parity-check matrix according to the embodiment of the present disclosure;

FIGS. 15A and 15B are diagrams illustrating a parity-check matrix according to the embodiment of the present disclosure;

Figure 16B:
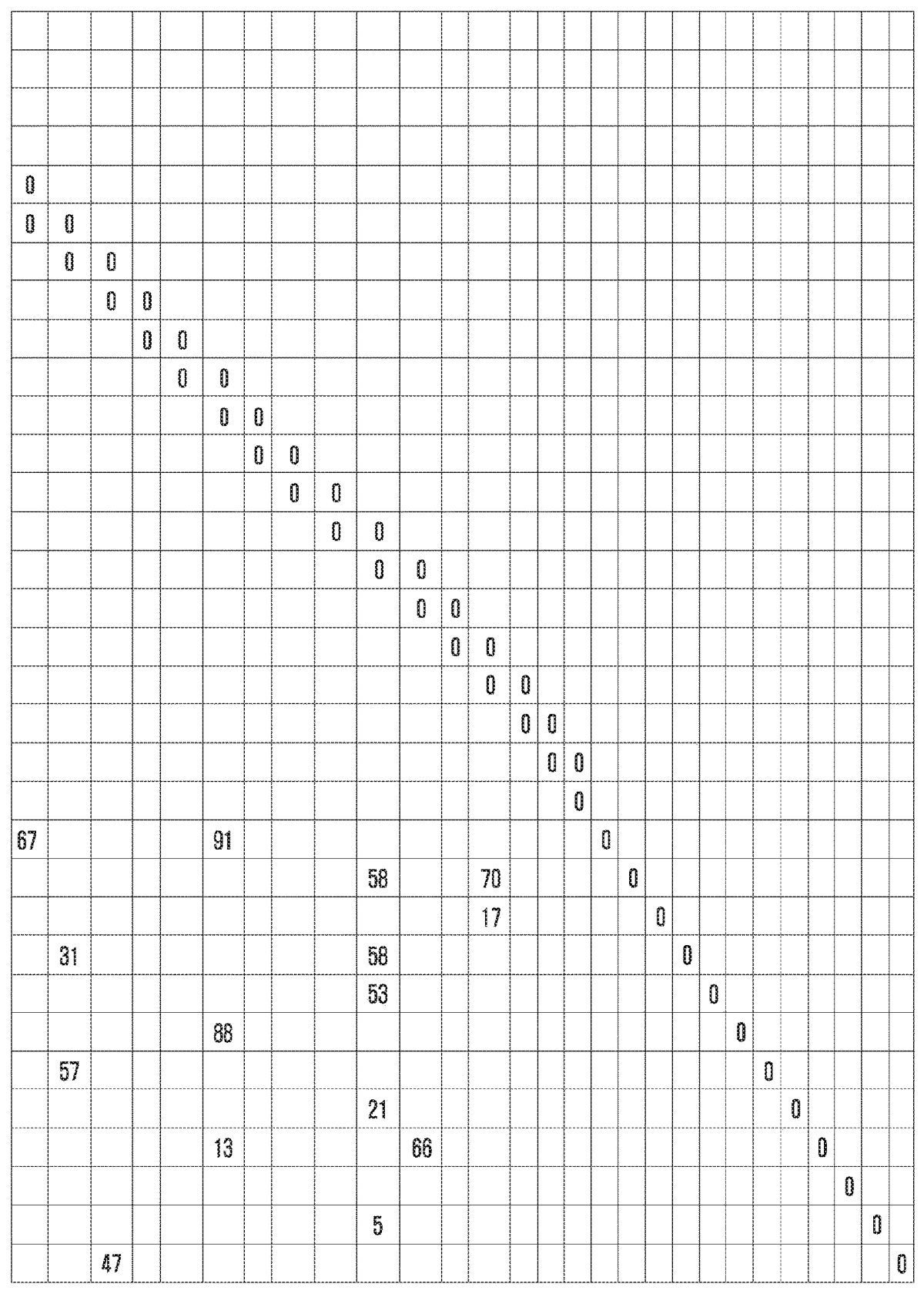

FIGS. 16A and 16B are diagrams illustrating a parity-check matrix according to the embodiment of the present disclosure;

FIGS. 17A and 17B are diagrams illustrating a parity-check matrix according to the embodiment of the present disclosure;

Throughout the drawings, like reference numerals will be understood to refer to like parts, components, and structures.

DETAILED DESCRIPTION

The following description, with reference to the accompanying drawings, is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The main gist of the present disclosure may also be applied to other communication systems having a similar technical background with a slight modification without greatly departing from the scope of the disclosure, which may be made by a determination by a person having ordinary skill in the art to which the present disclosure pertains.

Low-density parity-check (LDPC) codes that were first introduced by Gallager in the 1960s remain forgotten for a very long time due to their complexity and LDCP codes could not be practically implemented due to the technology level at that time. However, as performance of turbo codes proposed by Berrou, Glavieux, and Thitimajshima in 1993 approaches Shannon's channel capacity, many studies on channel encoding based on iterative decoding and a graph thereof by performing many different interpretations on performance and characteristics of the turbo codes have been conducted. As a result, when the LDPC code of the late 1990s is studied again, the LDPC code is decoded by applying sum-product algorithm based iterative decoding to the LDPC code on a tanner graph corresponding to the LDPC code, and it was found that the performance of the LDPC code also approaches the Shannon's channel capacity.

The LDPC code may generally be defined as a parity-check matrix and represented by using a bipartite graph commonly called the tanner graph.

Figure 1:
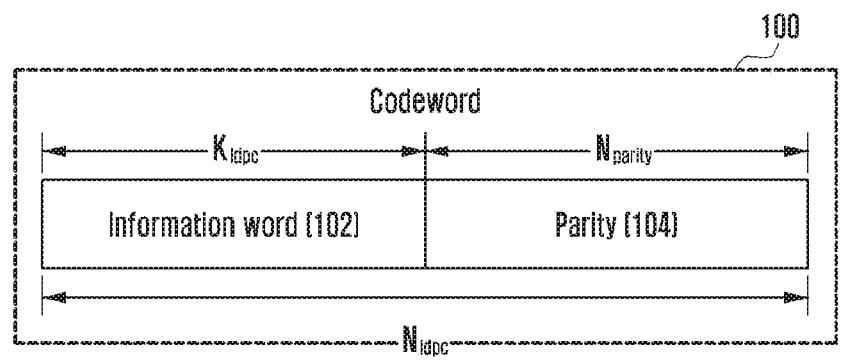
FIG. 1 is a structure diagram of a systematic low-density parity-check (LDPC) codeword according to an embodiment of the present disclosure.

FIG. 1 is a structure diagram of a systematic LDPC codeword according to an embodiment of the present disclosure.

Referring to FIG. 1, the LDPC code is LDPC encoded by receiving an information word 102 consisting of $K_{ldpc}$ bits or symbols to generate a codeword 100 consisting of $N_{ldpc}$ bits or symbols. Hereinafter, for convenience of explanation, it is assumed that the codeword 100 consisting of $N_{ldpc}$ bits is generated by receiving the information word 102 including $K_{ldpc}$ bits. That is, when the information word $I=[i_0, i_1, i_2, \ldots, i_{K_{ldpc}-1}]$ 102 which is formed of $K_{ldpc}$ input bits is LDPC encoded, the codeword $c=[c_0, c_1, c_2, \ldots, c_{N_{ldpc}-1}]$ 100 is generated. That is, the codeword is a bit string consisting of a plurality of bits and codeword bits represent each bit forming the codeword. Further, the information word is a bit string consisting of a plurality of bits and the information word bits represent each bit forming the information word. In this case, the systematic code consists of the codeword $C=[c_0, c_1, c_2, \ldots, c_{N_{ldpc}-1}]=[i_0, i_1, i_2, \ldots, i_{K_{ldpc}-1}, p_0, p_1, p_2, \ldots, p_{N_{ldpc}-K_{ldpc}-1}]$. Here, $P=[p_0, p_1, p_2, \ldots, p_{N_{ldpc}-K_{ldpc}-1}]$ is a parity bit 104 and the number $N_{parity}$ of parity bits is as follows. $N_{parity}=N_{ldpc}-K_{ldpc}$.

The LDPC code is a kind of linear block code(s) and includes a process of determining a codeword satisfying conditions of the following Equation 1.

$$H \cdot c^T = [h_1 \quad h_2 \quad h_3 \quad \ldots \quad h_{N_{ldpc}-1}] \cdot c^T = \sum_{i=0}^{N_{ldpc}} c_i \cdot h_i = 0 \quad \text{Equation 1}$$

In the above Equation, $c=[c_0, c_1, c_2, \ldots, c_{N_{ldpc}-1}]$.

In the above Equation 1, H represents the parity-check matrix, C represents the codeword, $c_i$ represents an i-th codeword bit, and $N_{ldpc}$ represents a codeword length. In the above Equation, hi represents an i-th column of the parity-check matrix H.

The parity-check matrix H consists of the $N_{ldpc}$ columns that are equal to the number of LDPC codeword bits. The above Equation 1 represents that since a sum of a product of the i-th column N and the i-th codeword bit $c_i$ of the parity check matrix becomes "0', the i-th column N has a relationship with the i-th codeword bit $c_i$.

A graph representation method of the LDPC code will be described with reference to FIG. 2.

Figure 2:
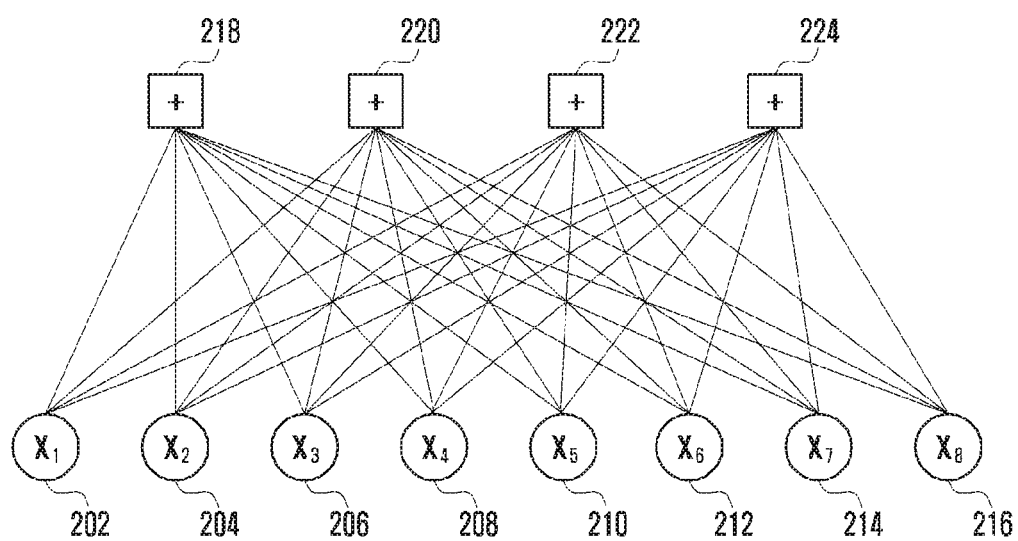
FIG. 2 is a tanner graph illustrating an example of a parity-check matrix H1 of an LDPC code consisting of 4 rows and 8 columns according to an embodiment of the present disclosure.

FIG. 2 is a tanner graph illustrating an example of a parity-check matrix $H_1$ of the LDPC code consisting of 4 rows and 8 columns according to an embodiment of the present disclosure.

Referring to FIG. 2, since the parity-check matrix $H_1$ has 8 columns, a codeword of which the length is 8 is generated, a code generated by the $H_1$ represents the LDPC code, and each column corresponds to encoded 8 bits.

Referring to FIG. 2, the tanner graph of the LDPC code encoded and decoded based on the parity-check matrix $H_1$ consists of 8 variable nodes, that is, $x_1(202)$, $x_2(204)$, $x_3(206)$, $x_4(208)$, $x_5(210)$, $x_6(212)$, $x_7(214)$, and $x_8(216)$ and 8 check nodes 218, 220, 222, and 224. Here, an i-th column and a j-th column of the parity-check matrix $H_1$ of the LDPC code each correspond to a variable node $x_1$ and a j-th check node. Further, a value of 1 at a point where the j-th column and the j-th row of the parity-check matrix $H_1$ of the LDPC code intersect each other, that a value other than 0 means that an edge connecting between the variable node $x_1$ and the j-th check node is present on the tanner graph as illustrated in FIG. 2.

A degree of the variable node and the check node on the tanner graph of the LDPC code means the number of edges connected to each node, which is equal to the number of entries other than 0 in the column or the row corresponding to the corresponding node in the parity-check matrix of the LDPC code. For example, in FIG. 2, degrees of the variable nodes $x_1(202)$, $x_2(204)$, $x_3(206)$, $x_4(208)$, $x_5(210)$, $x_6(212)$, $x_7(214)$, and $x_8(216)$ each become 4, 3, 3, 3, 2, 2, 2, and 2 in order and degrees of the check nodes 218, 220, 222, and 224 each become 6, 5, 5, and 5 in order. Further, the number of entries other than 0 in each column of the parity-check matrix $H_1$ of FIG. 2 corresponding to the variable node of FIG. 2 corresponds to the above-mentioned degrees 4, 3, 3, 3, 2, 2, 2, and 2 in order and the number of entries other than 0 in each row of the parity-check matrix $H_1$ of FIG. 2 corresponding to the check nodes of FIG. 2 corresponds to the above-mentioned degrees 6, 5, 5, and 5 in order.

The LDPC code may be decoded by an iterative decoding algorithm based on a sum-product algorithm on the bipartite graph, as illustrated in FIG. 2. Here, the sum-product algorithm is a kind of message passing algorithms. The message passing algorithm represents an algorithm of exchanging message using an edge on the bipartite graph and calculating an output message using the messages input to variable node or the check node and updating the calculated output message.

Herein, a value of an i-th encoding bit may be determined based on a message of an i-th variable node. The value of the i-th encoding bit may be applied with both of a hard decision and a soft decision. Therefore, the performance of the i-th bit $c_i$ of the LDPC codeword corresponds to the performance of the i-th variable node of the tanner graph, which may be determined depending on positions and the number of 1's of the i-th column of the parity-check matrix. In other words, the performance of $N_{ldpc}$ codeword bits of the codeword may rely on the positions and the number of 1's of the parity-check matrix, which means that the performance of the LDPC code is greatly affected by the parity-check matrix. Therefore, to design the LDPC code having excellent performance, a method for designing a good parity-check matrix is required.

To easily implement the parity-check matrix used in a communication and broadcasting system, generally, a quasi-cyclic LDPC code (hereinafter, QC-LDPC code) using the parity-check matrix of a quasi-cyclic (QC) form is mainly used.

The QC-LDPC code has the parity-check matrix consisting of a 0-matrix (zero matrix) having a small square matrix form or circulant permutation matrices. At this time, the permutation matrix means a matrix in which all elements of a square matrix are 0 or 1 and each row or column includes only one 1. Further, the circulant permutation matrix means a matrix in which each element of an identity matrix is circularly shifted to the right.

The QC-LDPC code will be described in more detail with reference to the following reference document [Myung2006].

Reference [Myung2006]

S. Myung, K. Yang, and Y. Kim, "Lifting Methods for Quasi-Cyclic LDPC Codes," IEEE Communications Letters. vol. 10, pp. 489-491, June 2006.

Describing the reference document [Myung2006], a permutation matrix $P=(P_{i,j})$ having a size of L×L is defined as the following Equation 2. Here, $P_{i,j}$ means entries of an i-th row and a j-th column in the matrix P ($0 \leq i, j < L$).

$$P_{i,j} = \begin{cases} 1 & \text{if } i+1 \equiv j \mod L \\ 0 & \text{otherwise} \end{cases} \quad \text{Equation 2}$$

For the permutation matrix P defined as described above, it can be appreciated that $P^i$ ($0 \leq i < L$) is the circulant permutation matrices in the form in which each entry of an identify matrix having the size of L×L is circularly shifted in a right direction i times.

The parity-check matrix H of the simplest QC-LDPC code may be represented by the following Equation 3.

$$H = \begin{bmatrix} P^{a_{11}} & P^{a_{12}} & \ldots & P^{a_{1n}} \\ P^{a_{21}} & P^{a_{22}} & \ldots & P^{a_{2n}} \\ \vdots & \vdots & \ddots & \vdots \\ P^{a_{m1}} & P^{a_{m2}} & \ldots & P^{a_{mn}} \end{bmatrix} \quad \text{Equation 3}$$

If $P^{-1}$ is defined as the 0-matrix having the size of L×L, each exponent of the circulant permutation matrices or the 0-matrix in the above Equation 3 has one of $\{-, 0, 1, 2, \ldots, L-1\}$ values. Further, it can be appreciated that the parity-check matrix H of the above Equation 3 has n column blocks and m row blocks and therefore has a size of mL×nL.

Generally, a binary matrix having a size of m×n obtained by replacing each of the circulant permutation matrices and the 0-matrix in the parity-check matrix of the above Equation 3 with 1 and 0, respectively, is called a mother matrix M(H) of the parity-check matrix H and an integer matrix having a size of m×n obtained like the following Equation 4 by selecting only exponents of each of the a size of m×n or the 0-matrix is called an exponential matrix E(H) of the parity-check matrix H.

$$E(H) = \begin{bmatrix} a_{11} & a_{12} & \ldots & a_{1n} \\ a_{21} & a_{22} & \ldots & a_{2n} \\ \vdots & \vdots & \ddots & \vdots \\ a_{m1} & a_{m2} & \ldots & a_{mn} \end{bmatrix} \quad \text{Equation 4}$$

Meanwhile, the performance of the LDPC codes may be determined depending on the parity-check matrix. Therefore, there is a need to design the parity-check matrices of the LDPC codes having excellent performance. Further, the method for LDPC encoding and decoding capable of supporting various input lengths and code rates is required.

Describing the reference document [Myung2006], a method known as lifting for an effective design of the QC-LDPC code is used. The lifting is a method for setting an L value determining a size of circulant permutation matrix or 0-matrix from a given small mother matrix depending on a specific rule to efficiently design a very large parity-check matrix. The existing lifting method and the features of the QC-LDPC code designed by the lifting are briefly arranged as follows.

First, when an LDPC code $C_0$ is given, S QC-LDPC codes to be designed by the lifting method are set to be $C_1, \ldots, C_S$ and values corresponding to sizes of row blocks and column blocks of the parity-check matrices of each QC-LDPC code is set to be $L_k$. Here, $C_0$ corresponds to the smallest LDPC code having the mother matrix of $C_1, \ldots, C_S$ codes as the parity-check matrix and the Lo value corresponding to the size of the row block and the column block is 1. Further, for convenience, a parity-check matrix $H_k$ of each code $C_k$ has an exponential matrix $E(H_k)=(e_{i,j}^{(k)})$ having a size of m×n and each exponent $e_{i,j}^{(k)}$ is selected as one of the $\{-1, 0, 1, 2, \ldots, L_k-1\}$ values.

Describing the reference document [Myung2006], the lifting consists of steps or operations like $C_0 \rightarrow C_1 \rightarrow \ldots \rightarrow C_S$ and has features like $L_{k+1}=q_{k+1}L_k$ ($q_{k+1}$ is a positive integer, k=0, 1, . . . , S−1). Further, if only a parity-check matrix Hs of $C_S$ is stored by the characteristics of the lifting process, all of the QC-LDPC codes $C_0, C_1, \ldots, C_S$ may be represented by the following Equation 5 according to the lifting method.

$$E(H_k) \equiv \left\lfloor \frac{L_k}{L_S} E(H_S) \right\rfloor \quad \text{Equation 5}$$

$$E(H_k) \equiv E(H_S) \mod L_k \quad \text{Equation 6}$$

According to the lifting method of the above Equation 5 or 6, $L_k$ values corresponding to the sizes of the row blocks or the column blocks of the parity-check matrices of each QC-LDPC code $C_k$ have a multiple relationship with each other, and thus the exponential matrix is also selected by the specific scheme. As described above, the existing lifting method helps facilitate a design of the QC-LDPC code having improved error floor characteristics by making algebraic or graphical characteristics of each parity-check matrix designed by the lifting good.

However, there is a problem in that each of the $L_k$ values has a multiple relationship with each other and therefore the lengths of each code are greatly limited. For example, if it is assumed that the lifting method like $L_{k+1}=2 \times L_k$ is minimally applied to each of the $L_k$ values, the sizes of the parity-check matrices of each QC-LDPC code may have only $2^k m \times 2^k m$. That is, when the lifting is applied in 10 operations (S=10), the parity-check matrix may have only 10 sizes.

For this reason, the existing lifting method has slightly unfavorable characteristics in designing the QC-LDPC code supporting various lengths. However, the mobile communication systems generally used require length compatibility of a very high level in consideration of various types of data transmission. For this reason, the existing method has a problem in that the LDPC code is hardly applied to the mobile communication system.

The method for encoding a QC-LDPC code will be described in more detail with reference to the next reference document [Myung2005].

Reference [Myung2005]
S. Myung, K. Yang, and J. Kim, "Quasi-Cyclic LDPC Codes for Fast Encoding," IEEE Transactions on Information Theory, vol. 51, No. 8, pp. 2894-2901, Aug. 2005.

FIG. 3 is a diagram illustrating a basic structure of the parity-check matrix according to an embodiment of the present disclosure.

Describing the above reference document [Myung2005], a parity-check matrix having a special form consisting of the circulant permutation matrix as illustrated in FIG. 3 is defined. Further, if the parity-check matrix of FIG. 3 satisfies the relationship of the next Equation 7 or 8, the efficient encoding can be made.

$$x \equiv \sum_{i=1}^{m} b_i \bmod Z \text{ and } y \equiv -\sum_{i=l+1}^{m} b_i \bmod Z \quad \text{Equation 7}$$

$$\sum_{i=1}^{m} b_i \equiv 0 \bmod Z \text{ and } x \equiv y + \sum_{i=l+1}^{m} b_i \bmod Z \quad \text{Equation 8}$$

In the above Equations 7 and 8, a I(≠l,m) value means a position of a row at which $P^y$ is positioned.

As described above, it was well known that if the parity-check matrix satisfies the above Equations 7 and 8, a matrix defined as y in the above reference document [Myung2005] becomes an identity matrix, and thus the encoding may be efficiently made during the encoding.

For convenience, the embodiment of the present disclosure describes that the circulant permutation matrix corresponding to one block is only one, but it is to be noted that the same disclosure may be applied even to the case in which several circulant permutation matrices are included in one block.

Figure 4:
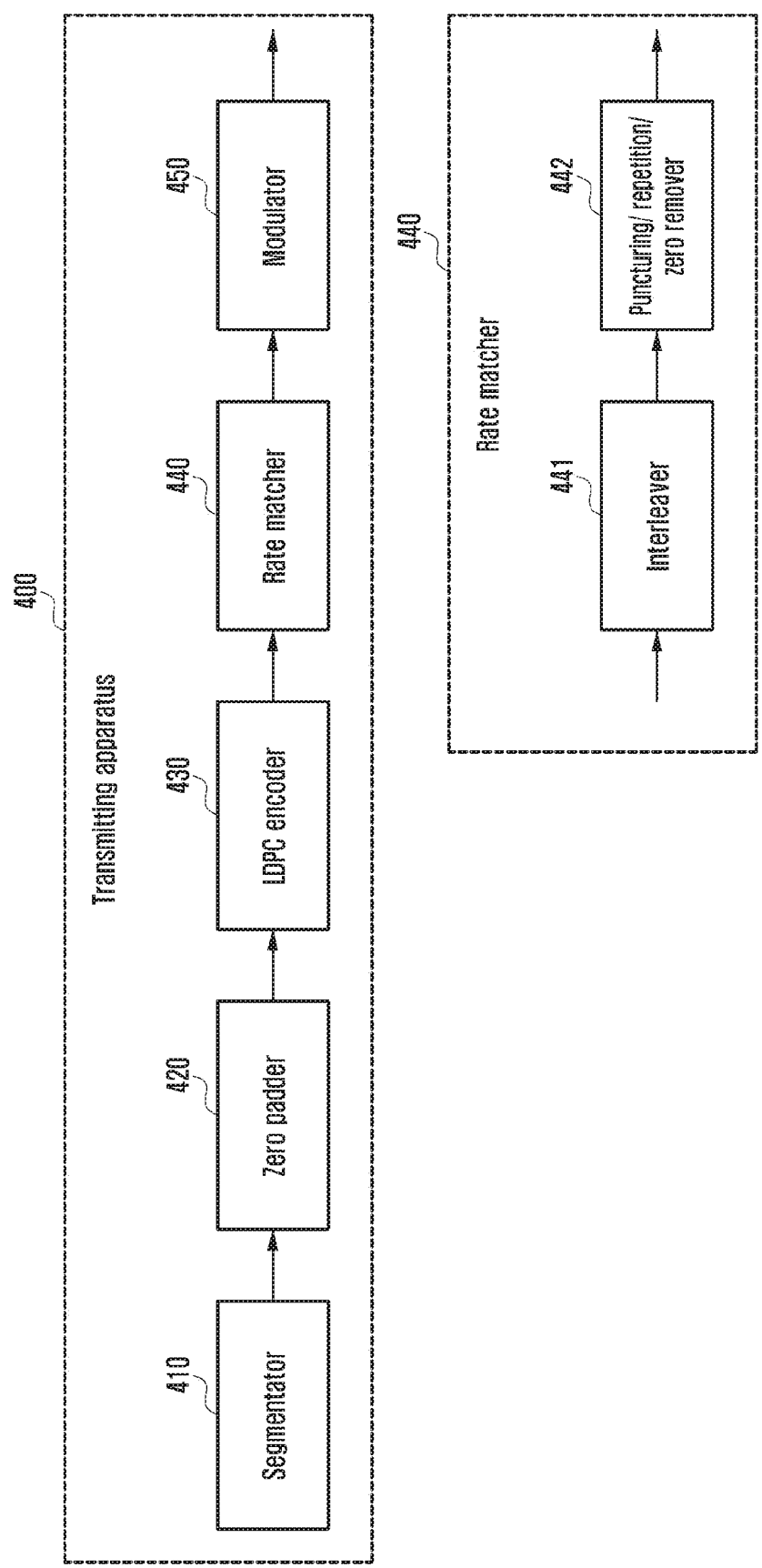
FIG. 4 is a block configuration diagram of a transmitting apparatus according to an embodiment of the present disclosure.

FIG. 4 is a block configuration diagram of a transmitting apparatus according to an embodiment of the present disclosure.

Referring to FIG. 4, a transmitting apparatus 400 may include a segmentator 410, a zero padder 420, an LDPC encoder 430, a rate matcher 440, and a modulator 450 to process variable length input bits.

Further, although not illustrated in the present drawing, the segmentator 410, the zero padder 420, the LDPC encoder 430, the rate matcher 440, and the modulator 450 of the transmitting apparatus are included in the controller (at least one processor) and may be operated according to the control of the controller. The controller may control the operation of the transmitting apparatus described in the present disclosure. Further, the transmitting apparatus may further include a transceiver for transmitting and receiving a signal.

Here, the components illustrated in FIG. 4 are components for performing encoding and modulation on the variable length input bits, which is only one example. In some cases, some of the components illustrated in FIG. 4 may be omitted or changed and other components may also be added.

Figure 5:
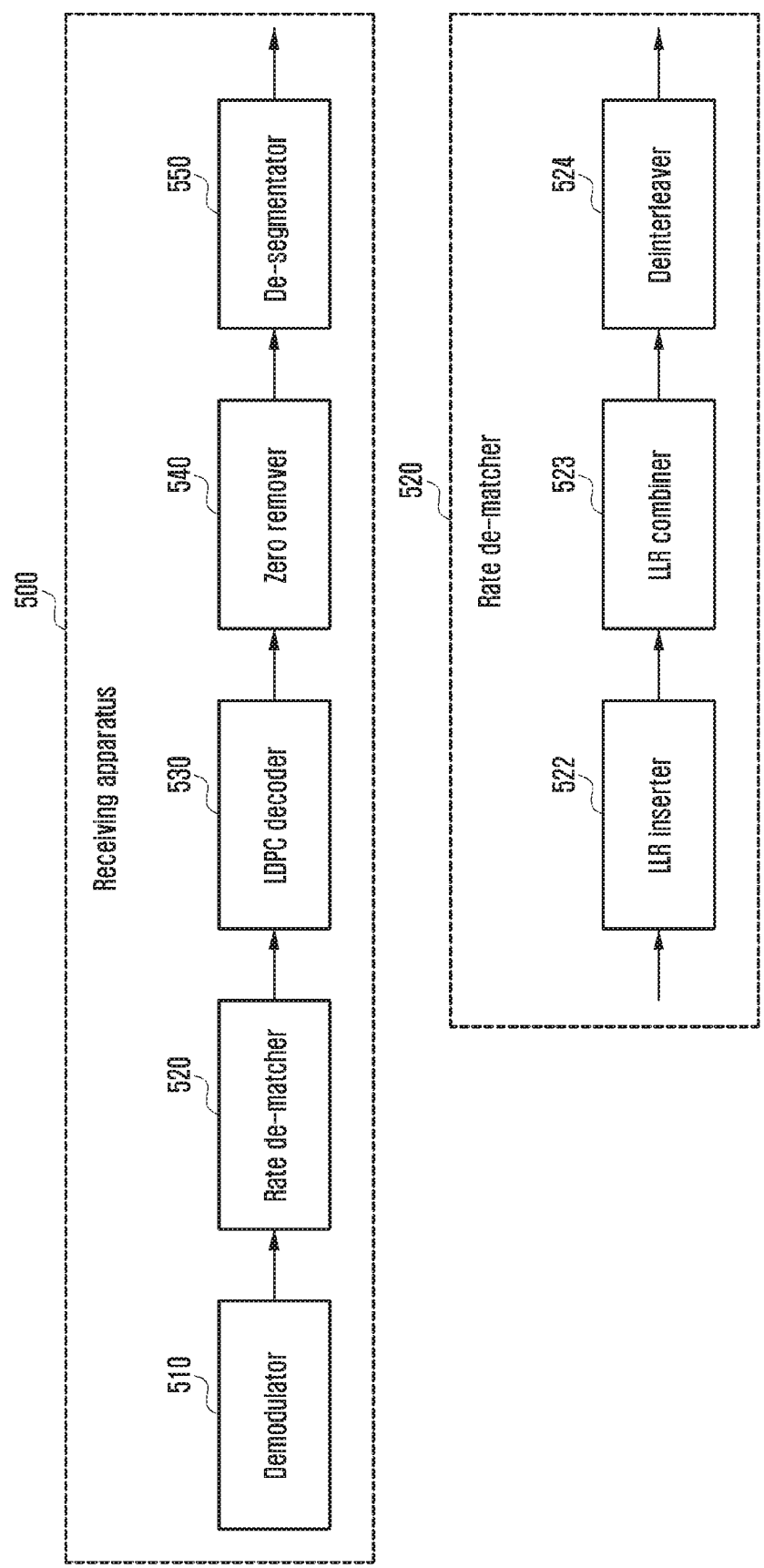
FIG. 5 is a block configuration diagram of a receiving apparatus according to an embodiment of the present disclosure.

FIG. 5 is a block configuration diagram of a receiving apparatus according to an embodiment of the present disclosure.

Referring to FIG. 5, a receiving apparatus 500 may include a demodulator 510, a rate de-matcher 520, an LDPC decoder 530, a zero remover 540, and a de-segmentator 550 to process variable length information.

Further, although not illustrated in the present drawing, the demodulator 510, the rate dematcher 520, the LDPC decoder 530, and the zero remover 540 of the transmitting apparatus are included in the controller and may be operated according to the control of the controller. The operation of the receiving apparatus described in the present disclosure may be controlled. Further, the receiving apparatus may further include the transceiver for transmitting and receiving a signal.

Here, the components illustrated in FIG. 5 are components performing the functions corresponding to components illustrated in FIG. 4, which is only an example and in some cases, some of the components may be omitted and changed and other components may also be added.

A detailed embodiment of the present disclosure is as follows.

First, the S LDPC codes to be designed by the lifting method are set to be $C_1, \ldots, C_S$, and a value corresponding to a size of row blocks and column blocks of the parity-check matrix $C_i$ of each LDPC code is set to be Z. Further, for convenience, the parity-check matrix $H_z$ of each code $C_i$ has the exponential matrix $E(H_z)=e_{i,j}^{(Z)}$) having a size of m×n. Each of the exponents is selected as one of $\{-1, 0, 1, 2, \ldots, Z-1\}$ values. (For convenience, in the present disclosure, the exponent representing the 0-matrix is represented as −1 but may be changed to other values according to the convenience of the system.

Therefore, an exponential matrix of the LDPC code $C_S$ having the largest parity-check matrix is defined as $E(H_{Z_{max}})$. (Here, $Z_{max}$ is defined as a maximum value of the Z values). In this case, when the Z value is smaller than $Z_{max}$, the exponents representing the circulant permutation matrix and the 0-matrix configuring the parity-check matrices of each LDPC code may be determined depending on the following Equation 9.

$$e_{i,j}^{(Z)} = \begin{cases} e_{i,j}^{(Z_{max})} & \text{if } e_{i,j}^{(Z_{max})} \leq 0 \\ \bmod(e_{i,j}^{(Z_{max})}, Z) & \text{if } e_{i,j}^{(Z_{max})} > 0 \end{cases} \quad \text{Equation 9}$$

$$e_{i,j}^{(Z)} = \begin{cases} e_{i,j}^{(Z_{max})} & \text{if } e_{i,j}^{(Z_{max})} < 0 \\ \bmod(e_{i,j}^{(Z_{max})}, Z) & \text{if } e_{i,j}^{(Z_{max})} \geq 0 \end{cases} \quad \text{Equation 10}$$

In the above Equation 9 or 10, $\bmod(e_{i,j}^{(Z_{max})}, Z)$ represents the remainder obtained by dividing $e_{i,j}^{(Z_{max})}$ by Z.

However, [Myung2006] limits Z values so that the Z values satisfy the multiple relationship with each other, and therefore is not suitable to support various lengths. For example, the number n of columns of the exponential matrix $E(H_z)$ or the mother matrix $M(H_z)$ of the parity-check matrix $H_z$ is 36 and a kind of lengths that may obtain the Z values by the lifting of 8 operations like $1, 2, 4, 8, \ldots, 128$ is 36, $72, 144, \ldots, 4608 (=36 \times 2^7)$, such that a difference between the shortest length and the longest length is very large.

An embodiment of the present disclosure may apply the exponential method applied to the above Equation 9 or 10, even when the Z values do not have the multiple relationship with each other and the present disclosure proposes a method for designing a parity-check matrix with little performance deterioration. For reference, the method proposed in the Equation 9 or 10 is an exponential transformation method in the case in which the lifting method based on a modulo operation is applied and it is apparent that various methods based on a flooring operation or other operations as described in the reference document [Myung2006] may be present. The next Equation 11 or 12 represents the exponential transformation method of the parity-check matrix designed by applying the lifting based on the flooring operation when the Z values are smaller than $Z_{max}$.

$$e_{i,j}^{(Z)} = \begin{cases} e_{i,j}^{(Z_{max})} & \text{if } e_{i,j}^{(Z_{max})} \leq 0 \\ \left\lfloor \frac{Z}{Z_{max}} e_{i,j}^{(Z_{max})} \right\rfloor & \text{if } e_{i,j}^{(Z_{max})} > 0 \end{cases} \quad \text{Equation 11}$$

$$e_{i,j}^{(Z)} = \begin{cases} e_{i,j}^{(Z_{max})} & \text{if } e_{i,j}^{(Z_{max})} < 0 \\ \left\lfloor \frac{Z}{Z_{max}} e_{i,j}^{(Z_{max})} \right\rfloor & \text{if } e_{i,j}^{(Z_{max})} \geq 0 \end{cases} \quad \text{Equation 12}$$

Hereinafter, a method for designing a parity-check matrix and a use method thereof for solving the problem of the existing lifting method having the length compatibility will be described.

First, the present disclosure defines the changed lifting process as follows.

1) The maximum value among the Z values is defined as $Z_{max}$.
2) One of divisors of Z. is defined as D. ($Z_{max}$=D·S)
3) Z has one of D, 2D, 3D, . . . , SD (=$Z_{max}$) values.

(For convenience, the parity-check matrix corresponding to Z=k×D is defined as $H_k$ and the LDPC code corresponding to the parity-check matrix is defined as $C_k$.)

The existing lifting method affects only the parity designed by the lifting just before the parity-check matrix is designed. That is, to design a (k+1)-th parity-check matrix while the Z values has the multiple relationship with each other in each lifting process, only a k-th parity-check matrix is affected and a (k−1)-th parity-check matrix is no longer used. This occurs due to the multiple relationship between the Z values and the detailed matters thereof are well described in the reference document [Myung2006].

However, the changed lifting method proposed in the present disclosure may improve the optimal parity-check matrix, like the method described in the reference document [Myung2006], since the Z values do not generally have the multiple relationship with each other. Therefore, the present disclosure proposes a method for designing a sub-optimal parity-check matrix as follows.

For convenience, the mother matrix for applying the lifting is defined as M(H) and each entry of the exponential matrix for the mother matrix is defined as $e_{i,j}^{(0)}$. Further, the Z value for the case in which Z=k×D is defined as $Z_k$ and the entries of the exponential matrix corresponding thereto are defined as $e_{i,j}^{(Z_k)}$.

The method for designing a parity-check matrix according to the changed lifting method is as follows.

Operation 1) If $e_{i,j}^{(0)}$=−1, $e_{i,j}^{(Z_k)}$=−1 (k=1, 2, . . . , S) for $E(H_{Z_k})=(e_{i,j}^{(Z_k)})$.

Operation 2) In the case of k=1,
$E(H_{Z_1})$ is obtained by the same method as the reference document [Myung2006] based on the mother matrix M(H).

In this case, each entry of the $e_{i,j}^{(Z_l)}$ of the $E(H_{Z_l})$ has one of 0, 1, 2, . . . , $Z_l$−1 values and a cycle characteristic profile for the tanner graph of $H_{Z_l}$ for each entry $e_{i,j}^{(Z_l)}$ is analyzed. Here, it is to be noted that the positions of the 0-matrices are first determined by operation 1.)

The cycle characteristic profile means the following matters.

i) Size of a cycle girth on the tanner graph generated by each entry ii) The total sum of orders of the variable nodes generated by each entry and configuring the cycle of the girth size iii) The number of variable nodes generated by each entry and configuring the cycle of the girth size In an embodiment of the present disclosure, a girth may mean a shortest cycle on a tanner graph. That is, the cycle characteristics profile may mean the size of the shortest cycle on the tanner graph, a total sum of orders of variable nodes configuring the shortest cycle, and the number of variable nodes configuring the shortest cycle.

Further, each of the entries $e_{i,j}^{(Z_l)}$ is temporarily determined as a value of the case having the best cycle characteristics. Here, the meaning that the cycle characteristics are good represents satisfying the following conditions.

iv) The sizes of the girth on the tanner graph are equal.
v) The total sum of the orders of the variable nodes configuring the cycle having the girth is large.
vi) When the iv) and v) are equal, the number of variable nodes configuring the girth size cycle is small.

In detail, as the cycle is getting shorter, it is highly likely not to detect an error, and therefore the larger the cycle on the tanner graph, the better the cycle characteristics. Therefore, the larger the size of the shortest cycle and the larger the total sum of the order of the variable nodes configuring the shortest cycle may mean the larger the cycle on the tanner graph, which may mean that the cycle characteristics are good. Further, as the number of variable nodes configuring the shortest cycle is getting smaller, the number of short cycles is not many, and therefore the cycle characteristics are good.)

Therefore, when the entries $e_{i,j}^{(Z_l)}$ satisfying the conditions are present in plural, all the values are temporarily stored as candidate values.

For 1<k≤S, the processes of operations 3) and 4) are repeated.

Operation 3) Each of the elements $e_{i,j}^{(Z_k)}$ of $E(H_{Z_k})$ is set to be $e_{i,j}^{(Z_{k-1})}$ temporarily determined to analyze the cycle characteristic profile for $H_{Z_k}$. In this case, it is to be noted that the value of $e_{i,j}^{(Z_k)}$ has one of 0, 1, 2, . . . , $Z_{k-1}$−1. Next, the values for each of the entries $e_{i,j}^{(Z_k)}$ of $E(H_{Z_k})$ are changed to $Z_{k-1}$, $Z_{k-1}$+1, . . . , $Z_k$−1 to analyze the cycle characteristic profile.

The case in which each of the entries $e_{i,j}^{(Z_k)}$ has the best cycle characteristics is selected.

Operation 4) When $e_{i,j}^{(Z_l)}$=mod($e_{i,j}^{(Z_k)}$,$Z_l$) (l=1, 2, . . . , k−1) is applied to the $e_{i,j}^{(Z_k)}$ values selected in the operation 3) and then the cycle characteristics for the tanner graph of all $H_{Z_l}$ are improved, the corresponding $e_{i,j}^{(Z_k)}$ value is temporarily determined as the candidate value of the entry of $E(H_{Z_k})$. It is to be noted that the $e_{i,j}^{(Z_k)}$ values temporarily determined may be present in plural.

Operation 5) $E(H_{Z_S})$ is determined based on the final result of the operation 4). When choice probability for the entry $e_{i,j}^{(Z_S)}$ of $E(H_{Z_S})$ is present in plural during the processes of the operations 3) and 4), the smallest value among the candidate values is determined as the final value.

The example of the parity-check matrix designed by the above design method is shown in the following Tables 1 to 6. The following Tables, Table 1 to Table 6, represent the exponential matrices of each of the parity-check matrices. (Small empty block represents the 0-matrix having a size of Z×Z.) For convenience of design, the number of columns of the mother matrix is fixed as 36 and in the following Tables 1 and 2, a code rate is set to be 8/9, in the following Tables 3 and 4, a code rate is set to be 2/3, and in the following Tables 5 and 6, a code rate is set to be 4/9. Further, it is assumed that the Z values for the lifting are set to be 12, 24, 36, 48, 60, 72, 84, and 96 to support a total of 8 lengths.

TABLE 1

| 62 | 5  | 8  | 51 | 23 | 95 | 19 | 83 | 44 | 91 | 38 | 13 | 47 | 58 | 24 | 94 | 44 | 16 |
|----|----|----|----|----|----|----|----|----|----|----|----|----|----|----|----|----|----|
| 21 | 75 | 32 | 7  | 63 | 32 | 7  | 48 | 58 | 82 | 46 | 66 | 64 | 36 | 19 | 40 | 6  | 9  |
| 62 | 79 | 52 | 94 | 20 | 34 | 44 | 18 | 72 | 53 | 29 | 75 | 65 | 90 | 78 | 82 | 29 | 33 |
| 22 | 26 | 10 | 66 | 72 | 3  | 14 | 15 | 37 | 38 | 20 | 59 | 36 | 52 | 81 | 93 | 64 | 21 |
| 45 | 25 |    | 81 | 48 | 15 | 16 |    | 85 | 90 |    | 34 | 68 | 27 | 1  | 0  |    |    |
|    |    | 90 | 92 | 75 | 45 | 13 | 52 | 75 | 43 | 78 | 54 | 67 |    |    | 0  | 0  |    |
| 91 | 78 | 16 |    | 37 | 90 |    | 68 |    | 58 | 86 |    | 70 | 83 | 0  |    | 0  | 0  |
| 35 | 28 | 50 | 69 |    |    | 7  | 58 | 72 |    | 19 | 30 |    | 61 | 1  |    |    | 0  |

TABLE 2

| 50 | 47 | 35 | 49 | 24 | 13 | 85 | 30 | 58 | 84 | 93 | 44 | 86 | 65 | 89 | 57 | 60 | 15 |
|----|----|----|----|----|----|----|----|----|----|----|----|----|----|----|----|----|----|
| 33 | 48 | 26 | 3  | 59 | 11 | 33 | 19 | 67 | 0  | 27 | 61 | 26 | 23 | 55 | 13 | 40 | 20 |
| 27 | 76 | 41 | 24 | 85 | 54 | 29 | 28 | 73 | 16 | 30 | 92 | 81 | 61 | 5  | 95 | 21 | 45 |
| 20 | 73 | 23 | 87 | 73 | 33 | 16 | 26 | 75 | 42 | 61 | 63 | 25 | 86 | 71 | 8  | 25 | 20 |
| 21 | 8  |    | 55 | 67 | 79 | 34 |    | 86 | 3  |    | 28 | 44 | 29 | 1  | 0  |    |    |
|    |    | 83 | 78 | 77 | 76 | 5  | 91 | 65 | 35 | 33 | 41 | 12 |    |    | 0  | 0  |    |
| 71 | 15 | 71 |    | 85 | 89 |    | 84 |    | 11 | 8  |    | 71 | 50 | 0  |    | 0  | 0  |
| 67 | 95 | 52 | 35 |    |    | 42 | 70 | 93 |    | 63 | 61 |    | 63 | 1  |    |    | 0  |

TABLE 3

| 33 | 47 | 9  | 24 | 1  | 21 |    |    |    |    | 54 |    |    |    |    |    |    |
|----|----|----|----|----|----|----|----|----|----|----|----|----|----|----|----|----|
| 23 | 45 | 16 | 2  | 2  | 85 | 57 |    |    | 54 | 45 |    |    |    |    | 16 | 72 |
| 43 | 76 | 68 | 88 | 72 | 19 |    | 40 |    |    |    |    |    | 1  |    | 21 |    |
| 78 | 82 | 49 | 53 | 91 | 83 |    |    | 83 |    |    | 59 |    |    | 54 | 90 | 80 |
| 41 | 52 | 33 | 63 | 60 | 75 |    | 43 | 48 |    |    |    |    |    |    |    | 89 |
| 15 | 42 | 65 | 94 | 53 | 95 | 16 |    |    |    | 42 |    |    | 32 | 3  |    |    |
| 66 | 91 | 87 | 82 | 46 | 15 |    |    |    | 59 |    | 77 | 1  |    | 75 |    |    |
| 4  | 93 | 86 | 89 | 76 | 79 | 10 |    |    |    |    |    | 65 |    |    | 23 |    |
| 70 | 40 | 28 | 66 | 58 | 83 |    |    | 87 |    | 83 |    | 42 |    |    |    |    |
| 49 | 35 | 0  | 85 | 35 | 44 |    |    |    | 41 |    |    |    |    |    |    | 11 |
| 23 | 46 | 43 | 16 | 44 | 82 |    |    | 46 |    |    |    |    |    |    |    |    |
| 38 | 6  | 41 | 52 | 46 | 20 |    | 54 |    |    |    |    | 5  |    |    |    |    |
| 33 |    | 85 |    | 71 | 12 |    | 1  | 0  |    |    |    |    |    |    |    |    |
|    |    |    |    |    |    |    |    | 0  | 0  |    |    |    |    |    |    |    |
|    |    | 8  |    |    | 42 |    |    | 0  | 0  |    |    |    |    |    |    |    |
|    |    |    |    |    |    |    |    |    | 0  | 0  |    |    |    |    |    |    |
|    |    |    |    | 61 |    |    |    |    | 0  | 0  |    |    |    |    |    |    |
|    |    | 68 |    |    |    |    |    |    | 0  | 0  |    |    |    |    |    |    |
|    |    |    |    | 0  |    |    |    |    |    | 0  | 0  |    |    |    |    |    |
| 66 |    |    | 31 |    |    |    |    |    |    |    | 0  | 0  |    |    |    |    |
| 86 |    |    |    |    | 63 |    |    |    |    |    |    | 0  | 0  |    |    |    |
|    |    | 87 | 85 |    | 55 |    |    |    |    |    |    |    | 0  | 0  |    |    |
|    |    | 40 |    | 16 | 61 |    |    |    |    |    |    |    |    | 0  | 0  |    |
|    |    |    |    | 1  |    |    |    |    |    |    |    |    |    |    |    | 0  |

TABLE 4

| 29 | 86 | 48 | 36 | 34 | 14 |    |    |    |    | 52 |    |    |    |    |    |    |
|----|----|----|----|----|----|----|----|----|----|----|----|----|----|----|----|----|
| 54 | 34 | 78 | 3  | 10 | 24 | 9  |    |    | 13 | 29 |    |    |    | 34 | 60 |    |
| 9  | 94 | 75 | 58 | 83 | 62 |    | 21 |    |    |    |    | 68 |    | 14 |    |    |
| 42 | 48 | 67 | 30 | 65 | 66 |    |    | 94 |    |    | 17 |    | 77 |    | 45 | 88 |
| 10 | 10 | 3  | 57 | 45 | 8  |    | 49 | 31 |    |    |    |    |    |    |    | 38 |
| 36 | 44 | 45 | 58 | 6  | 3  | 25 |    |    |    | 76 |    |    | 8  | 35 |    |    |
| 57 | 64 | 44 | 53 | 94 | 77 |    |    |    | 94 |    | 55 | 86 |    | 84 |    |    |
| 39 | 2  | 73 | 41 | 54 | 71 | 63 |    |    |    |    |    | 83 |    |    | 37 |    |
| 27 | 85 | 39 | 42 | 58 | 40 |    |    | 9  |    | 3  |    | 89 |    |    |    |    |
| 66 | 80 | 22 | 36 | 54 | 49 |    |    |    | 43 |    |    |    |    |    |    | 13 |
| 62 | 41 | 83 | 43 | 72 | 61 |    |    | 22 |    |    |    |    |    |    |    |    |
| 20 | 1  | 52 | 81 | 76 | 60 |    | 27 |    |    |    |    | 89 |    |    |    |    |

TABLE 4-continued

```
64   1      37  28        1   0
                              0   0
         17      53        0   0
                              0   0   0
                    82        0   0
                                  0   0
         31                     0   0
                 0                  0   0
91           89                       0   0
69              95                      0   0
    52  22      16                        0   0
    50      93  40                          0   0
                 1                              0
```

TABLE 5

```
50  39      46  37                  22                              1   0
        23  14                  20  30              36                  0
                        30              78      22  42  49
19          34  25              82  88
88  93      26                  73  78
        14      73  67  21              43
17   2  54  88                  17
        84  20  82  27                      81
    25   4   9  33  32
19      84  44  72                              68
66  92  21              13                          0
53   9   3      61          79
    86  71      31                  34
13  45  32  43          14
 4      75  45  30      95
                51  90  37      30          88
57  33  41      72      46
84  35      36  73                      20
70  76      55  53      35
        32  30   8  90              82              1
 0
 0   0
     0   0
         0   0
             0   0
                 0   0
                     0   0
                         0   0
                             0   0
                                 0   0
                                     0   0
                                         0   0
                                             0   0
                                                 0   0
                                                     0   0
                                                         0   0
                                                             0   0
                                                                 0   0
                                                                     0   0
                                                                         0
```

TABLE 6

```
50  39      22  49              43                              1   0
        23      86          39  82                      85          0
                        28              85      32  45  29
63          29      56              0       93
13  80      68                      68      88
        88      44  89  33                      91
53  86  42  40                      89
        60  85  55  58                      82
    37  82  91   9  36
46      48  14  72                                  17
71  16  21              78                              0
45  33  39      61           4
        75  28      46                      93
```

TABLE 6-continued

| | | | | | | | | | | | | | | | | | | | | | | |
|---|---|---|---|---|---|---|---|---|---|---|---|---|---|---|---|---|---|---|---|---|---|---|
| 13 | 93 | 92 | 31 | | | | | | 16 | | | | | | | | | | | | | |
| 42 | | 74 | 45 | 52 | | | | | 53 | | | | | | | | | | | | | |
| | | | | | 65 | 76 | 91 | | | | | 55 | | | 34 | | | | | | | |
| 78 | 34 | 41 | | 48 | | 27 | | | | | | | | | | | | | | | | |
| 72 | 83 | | 24 | 53 | | | | | | | | | | | 2 | | | | | | | |
| 54 | 40 | | 7 | 73 | | 87 | | | | | | | | | | | | | | | | |
| | 20 | 54 | | 7 | 14 | | | | | | 60 | | | | 1 | | | | | | | |

```
0
0  0
   0  0
      0  0
         0  0
            0  0
               0  0
                  0  0
                     0  0
                        0  0
                           0  0
                              0  0
                                 0  0
                                    0  0
                                       0  0
                                          0  0
                                             0  0
                                                0  0
                                                   0
```

Another example of the designed parity-check matrix is shown in the following Tables, Table 7 to Table 12. Table 7 to Table 12 represent the exponential matrices of each of the parity-check matrices. (Small empty block corresponds to the 0-matrix having a size of Z×Z.) For convenience of design, the number of columns of the mother matrix is fixed as 37 and in Table 7 and Table 8, a code rate is set to be 32/37, in Table 9 and Table 10, a code rate is set to be 24/37, and Table 11 and Table 12, a code rate is set to be 16/37. Further, it is assumed that the Z values for the lifting are set to be 12, 24, 36, 48, 60, 72, 84, and 96 to support a total of 8 lengths.

TABLE 7

| 65 | 83 | 71 | 35 | 13 | 64 | 42 | 23 | | 95 | 12 | 87 | 41 | | 59 | 55 | 83 | 62 |
| --- | --- | --- | --- | --- | --- | --- | --- | --- | --- | --- | --- | --- | --- | --- | --- | --- | --- |
| 40 | 22 | 36 | 53 | 59 | 31 | 0 | | 32 | 52 | 93 | | | 46 | | 95 | | 11 |
| 68 | 93 | 73 | 68 | 28 | | | 4 | 81 | | | 95 | | 51 | 72 | | 59 | 50 |
| 91 | 47 | 55 | 84 | 29 | 68 | 89 | 81 | 54 | 88 | | | 23 | 54 | | | 53 | 34 |
| 88 | 89 | 44 | 74 | 9 | | | | | 87 | 57 | 43 | | 63 | 24 | 70 | 15 | |

| | 37 | 41 | 43 | | | 26 | 52 | | | 10 | | | | 1 | 0 | | |
| --- | --- | --- | --- | --- | --- | --- | --- | --- | --- | --- | --- | --- | --- | --- | --- | --- | --- |
| | | | 5 | 53 | 70 | | 73 | 90 | 53 | 14 | 65 | 84 | | | 0 | 0 | |
| | | 60 | | 93 | 55 | 92 | | 8 | 48 | | 11 | 37 | 47 | 0 | | 0 | 0 |
| | 46 | 55 | 31 | 55 | 21 | | 95 | | | | | 50 | | | | 0 | 0 |
| | 69 | | 50 | | | 74 | 29 | 28 | 91 | 85 | | 65 | 1 | | | | 0 |

TABLE 8

| 43 | 15 | 3 | 56 | 59 | 47 | 59 | 34 | | 86 | 95 | 37 | 13 | | 32 | 82 | 24 | 80 |
| --- | --- | --- | --- | --- | --- | --- | --- | --- | --- | --- | --- | --- | --- | --- | --- | --- | --- |
| 36 | 62 | 85 | 43 | 44 | 93 | 21 | | 90 | 49 | 43 | | | 24 | | 25 | | 72 |
| 62 | 30 | 20 | 36 | 51 | | | 11 | 33 | | | 58 | | 43 | 79 | | 27 | 61 |
| 50 | 15 | 16 | 27 | 62 | 81 | 51 | 19 | 80 | 4 | | | 36 | 46 | | | 0 | 27 |
| 72 | 0 | 89 | 86 | 70 | | | | | 49 | 64 | 30 | | 64 | 81 | 25 | 39 | |

| | 56 | 62 | 18 | | | 77 | 33 | | | 41 | | | | 1 | 0 | | |
| --- | --- | --- | --- | --- | --- | --- | --- | --- | --- | --- | --- | --- | --- | --- | --- | --- | --- |
| | | | 75 | 52 | 33 | | 87 | 10 | 46 | 26 | 96 | 60 | | | 0 | 0 | |
| | | 4 | | 85 | 31 | 19 | | 78 | 93 | | 7 | 42 | 2 | 0 | | 0 | 0 |
| | 72 | 34 | 72 | 24 | 50 | | 52 | | | | | 76 | | | | 0 | 0 |
| | | | 0 | | 64 | | 42 | 24 | 33 | 11 | 64 | | 89 | 1 | | | 0 |

TABLE 9

| 15 | 39 | 25 | 37 | | 73 | 93 | | 93 | 43 | 95 | | | | | | | |
| --- | --- | --- | --- | --- | --- | --- | --- | --- | --- | --- | --- | --- | --- | --- | --- | --- | --- |
| 26 | 86 | 43 | | | | | 58 | | | | | 62 | | 80 | 54 | | |
| 57 | 10 | 36 | 21 | | | | | | | | 45 | | 80 | | | 68 | 87 |
| 82 | 86 | 89 | 89 | 79 | | 95 | | | 53 | | | | | | | | |
| 89 | 40 | 11 | 21 | | | 30 | | 37 | | | | | | | | | 70 |
| 90 | | 50 | 19 | | | | | 31 | 87 | | 33 | 63 | | | 25 | | |
| 19 | 82 | 31 | 6 | | 1 | | | | | | | 72 | | | | | |

TABLE 9-continued

| 83 | 32 | 68 | 25 | 19 |    |    | 61 |    | 89 |    |    | 12 | 57 |    |    |    |
|----|----|----|----|----|----|----|----|----|----|----|----|----|----|----|----|----|
| 46 | 40 | 84 | 32 |    |    |    |    |    |    |    | 50 | 26 |    |    | 91 |    |
| 35 | 45 |    | 16 | 72 |    |    |    |    | 49 |    |    |    |    |    |    | 59 |
| 18 | 25 | 5  | 75 | 8  |    |    |    |    |    |    |    |    | 29 |    |    |    |
| 7  | 48 | 35 | 61 |    | 72 | 11 |    |    | 15 |    | 4  |    |    |    |    |    |
| 30 | 32 | 55 | 86 | 5  |    |    |    |    |    |    |    |    |    | 61 | 57 | 52 |

|    |    |    |    |    | 1  | 0  |    |    |    |    |    |    |    |    |    |    |
|----|----|----|----|----|----|----|----|----|----|----|----|----|----|----|----|----|
|    |    |    | 48 | 33 |    | 0  | 0  |    |    |    |    |    |    |    |    |    |
|    | 95 |    |    |    |    |    | 0  | 0  |    |    |    |    |    |    |    |    |
|    |    | 50 | 4  |    |    |    |    | 0  | 0  |    |    |    |    |    |    |    |
|    | 26 |    | 51 |    |    |    |    |    | 0  | 0  |    |    |    |    |    |    |
|    |    | 39 |    |    |    |    |    |    |    | 0  | 0  |    |    |    |    |    |
|    | 49 |    |    | 88 | 0  |    |    |    |    |    | 0  | 0  |    |    |    |    |
|    |    |    |    |    |    |    |    |    |    |    |    | 0  | 0  |    |    |    |
|    |    |    | 58 | 33 |    |    |    |    |    |    |    |    | 0  | 0  |    |    |
|    |    |    |    | 64 |    |    |    |    |    |    |    |    |    | 0  | 0  |    |
|    |    |    |    |    | 22 |    |    |    |    |    |    |    |    |    | 0  | 0  |
|    |    | 89 |    |    |    |    |    |    |    |    |    |    |    |    |    | 0  |
|    |    |    |    |    | 1  |    |    |    |    |    |    |    |    |    |    |    |

TABLE 10

| 39 | 65 | 34 | 37 |    | 38 | 39 |    | 36 | 42 | 28 |    |    |    |    |    |    |    |    |
|----|----|----|----|----|----|----|----|----|----|----|----|----|----|----|----|----|----|----|
| 95 | 26 | 32 |    |    |    |    | 13 |    |    |    |    |    | 13 |    | 29 | 13 |    |    |
| 36 | 82 | 48 | 81 |    |    |    |    |    |    |    |    | 92 |    | 86 |    |    | 89 | 92 |
| 71 | 88 | 65 | 17 | 17 |    |    | 77 |    |    | 93 |    |    |    |    |    |    |    |    |
| 87 | 23 | 78 | 50 |    | 19 |    | 55 |    |    |    |    |    |    |    |    |    |    | 10 |
| 86 |    | 87 | 55 |    |    |    | 81 | 32 |    | 77 | 80 |    |    |    |    |    | 52 |    |
| 9  | 58 | 25 | 87 | 82 |    |    |    |    |    |    |    |    | 0  |    |    |    |    |    |
| 84 | 32 | 53 | 24 | 91 |    | 56 |    |    | 81 |    |    | 75 | 61 |    |    |    |    |    |
| 58 | 40 | 48 | 61 |    |    |    |    |    |    |    | 84 | 95 |    |    | 31 |    |    |    |
| 31 | 50 |    | 93 | 20 |    |    |    |    | 7  |    |    |    |    |    |    | 49 |    |    |
| 41 | 77 | 51 | 37 | 57 |    |    |    |    |    |    |    |    | 75 |    |    |    |    |    |
| 62 | 23 | 46 | 45 |    | 29 | 16 |    | 35 |    | 41 |    |    |    |    |    |    |    |    |
| 85 | 36 | 60 | 77 | 27 |    |    |    |    |    |    |    |    |    | 64 | 90 |    |    | 24 |

|    |    |    |    | 0  | 93 | 1  | 0  |    |    |    |    |    |    |    |    |    |    |    |
|----|----|----|----|----|----|----|----|----|----|----|----|----|----|----|----|----|----|----|
|    | 93 |    |    |    |    |    | 0  | 0  |    |    |    |    |    |    |    |    |    |    |
|    |    | 94 | 48 |    |    |    |    | 0  | 0  |    |    |    |    |    |    |    |    |    |
|    |    | 25 |    | 75 |    |    |    |    | 0  | 0  |    |    |    |    |    |    |    |    |
|    |    | 50 |    |    |    |    |    |    |    | 0  | 0  |    |    |    |    |    |    |    |
|    | 88 |    |    | 24 | 0  |    |    |    |    |    | 0  | 0  |    |    |    |    |    |    |
|    |    |    |    |    |    |    |    |    |    |    |    | 0  | 0  |    |    |    |    |    |
|    |    |    | 85 | 44 |    |    |    |    |    |    |    |    | 0  | 0  |    |    |    |    |
|    |    |    |    | 74 |    |    |    |    |    |    |    |    |    | 0  | 0  |    |    |    |
|    |    |    |    |    | 28 |    |    |    |    |    |    |    |    |    | 0  | 0  |    |    |
|    |    |    | 48 |    |    |    |    |    |    |    |    |    |    |    |    | 0  | 0  |    |
|    |    |    |    |    | 1  |    |    |    |    |    |    |    |    |    |    |    |    | 0  |

TABLE 11

| 41 | 47 | 46 | 4  |    |    |    | 48 |    |    |    |    |    |    |    |    | 1  | 0  |    |
|----|----|----|----|----|----|----|----|----|----|----|----|----|----|----|----|----|----|----|
| 9  |    | 28 | 55 |    | 14 | 94 |    |    |    |    |    |    |    |    |    |    | 0  | 0  |
| 82 |    |    | 84 |    |    |    |    | 30 |    |    |    |    |    |    |    |    |    | 0  |
| 53 |    | 17 | 81 |    |    |    |    |    | 45 | 23 |    |    |    |    |    |    |    |    |
| 13 |    |    |    |    |    |    |    |    |    |    | 82 | 38 |    | 79 | 49 |    |    |    |
| 81 | 12 | 19 | 38 |    |    |    |    |    |    |    |    | 79 |    |    |    |    |    |    |
| 52 |    | 60 |    |    |    |    |    |    |    | 33 |    |    |    |    |    |    |    |    |
| 19 | 62 |    |    | 62 |    |    |    |    |    |    |    | 46 | 32 |    |    |    |    |    |
| 60 | 4  | 2  |    | 47 |    |    |    |    |    |    |    |    |    | 68 |    |    |    |    |
| 14 | 48 |    | 35 |    | 80 |    |    |    |    |    |    |    |    |    |    |    |    |    |
| 30 |    | 0  |    | 58 | 53 |    |    |    |    |    |    |    |    | 0  |    |    |    |    |
| 50 | 61 |    |    | 67 |    | 18 | 78 |    |    |    |    |    |    |    |    |    |    |    |
| 6  | 95 | 51 | 26 |    | 39 |    |    |    |    |    |    |    |    |    |    |    |    |    |
| 9  |    | 56 | 69 |    | 50 |    | 7  |    |    |    |    |    |    |    |    |    |    |    |
| 30 |    |    |    | 2  | 37 |    | 56 |    | 90 |    |    |    |    |    |    |    |    |    |
| 92 | 33 | 21 | 93 |    |    |    |    | 50 |    |    |    |    |    |    |    |    |    |    |
| 93 | 23 | 48 |    |    |    |    |    |    | 50 |    |    |    | 69 |    |    |    |    |    |
| 49 | 22 |    | 52 |    |    |    |    |    |    |    |    | 30 |    |    | 12 |    |    |    |

TABLE 11-continued

| 59 | 23 |    | 18 | 14 |    |    |    |    | 10 |    |    |    |    |
|----|----|----|----|----|----|----|----|----|----|----|----|----|----|
| 82 | 18 | 50 | 64 |    |    |    |    |    |    |    |    | 26 |    |
| 62 |    |    |    | 95 |    | 3  |    | 8  |    |    |    |    | 1  |

| 0 |   |   |   |   |   |   |   |   |   |   |   |   |   |   |   |   |   |   |   |   |   |   |   |
|---|---|---|---|---|---|---|---|---|---|---|---|---|---|---|---|---|---|---|---|---|---|---|---|
| 0 | 0 |   |   |   |   |   |   |   |   |   |   |   |   |   |   |   |   |   |   |   |   |   |   |
|   | 0 | 0 |   |   |   |   |   |   |   |   |   |   |   |   |   |   |   |   |   |   |   |   |   |
|   |   | 0 | 0 |   |   |   |   |   |   |   |   |   |   |   |   |   |   |   |   |   |   |   |   |
|   |   |   | 0 | 0 |   |   |   |   |   |   |   |   |   |   |   |   |   |   |   |   |   |   |   |
|   |   |   |   | 0 | 0 |   |   |   |   |   |   |   |   |   |   |   |   |   |   |   |   |   |   |
|   |   |   |   |   | 0 | 0 |   |   |   |   |   |   |   |   |   |   |   |   |   |   |   |   |   |
|   |   |   |   |   |   | 0 | 0 |   |   |   |   |   |   |   |   |   |   |   |   |   |   |   |   |
|   |   |   |   |   |   |   | 0 | 0 |   |   |   |   |   |   |   |   |   |   |   |   |   |   |   |
|   |   |   |   |   |   |   |   | 0 | 0 |   |   |   |   |   |   |   |   |   |   |   |   |   |   |
|   |   |   |   |   |   |   |   |   | 0 | 0 |   |   |   |   |   |   |   |   |   |   |   |   |   |
|   |   |   |   |   |   |   |   |   |   | 0 | 0 |   |   |   |   |   |   |   |   |   |   |   |   |
|   |   |   |   |   |   |   |   |   |   |   | 0 | 0 |   |   |   |   |   |   |   |   |   |   |   |
|   |   |   |   |   |   |   |   |   |   |   |   | 0 | 0 |   |   |   |   |   |   |   |   |   |   |
|   |   |   |   |   |   |   |   |   |   |   |   |   | 0 | 0 |   |   |   |   |   |   |   |   |   |
|   |   |   |   |   |   |   |   |   |   |   |   |   |   | 0 | 0 |   |   |   |   |   |   |   |   |
|   |   |   |   |   |   |   |   |   |   |   |   |   |   |   | 0 | 0 |   |   |   |   |   |   |   |
|   |   |   |   |   |   |   |   |   |   |   |   |   |   |   |   | 0 |   |   |   |   |   |   |   |

TABLE 12

| 50 | 51 | 94 | 93 |    |    | 38 |    |    |    |    |    | 1  | 0  |    |    |    |    |    |    |    |    |    |    |
|----|----|----|----|----|----|----|----|----|----|----|----|----|----|----|----|----|----|----|----|----|----|----|----|
| 23 |    | 37 | 62 |    | 69 | 39 |    |    |    |    |    |    | 0  | 0  |    |    |    |    |    |    |    |    |    |
| 90 |    |    | 19 |    |    |    | 28 |    |    |    |    |    |    | 0  | 0  |    |    |    |    |    |    |    |    |
| 93 |    | 19 | 75 |    |    |    |    | 37 | 23 |    |    |    |    |    | 0  | 0  |    |    |    |    |    |    |    |
| 32 |    |    |    |    |    |    |    |    |    | 47 | 25 |    | 41 | 10 |    | 0  | 0  |    |    |    |    |    |    |
| 89 | 81 | 41 | 83 |    |    |    |    |    |    |    |    | 36 |    |    |    |    | 0  | 0  |    |    |    |    |    |
| 81 |    | 3  |    |    |    |    |    |    | 21 |    |    |    |    |    |    |    |    | 0  | 0  |    |    |    |    |
| 72 | 48 |    |    | 7  |    |    |    |    |    |    |    | 92 | 14 |    |    |    |    |    | 0  | 0  |    |    |    |
| 58 | 49 | 86 |    | 57 |    |    |    |    |    |    |    |    |    | 89 |    |    |    |    |    | 0  | 0  |    |    |
| 32 | 90 |    | 22 |    | 44 |    |    |    |    |    |    |    |    |    |    |    |    |    |    |    | 0  | 0  |    |
| 86 |    | 75 |    | 59 | 11 |    |    |    |    |    |    |    |    |    |    | 0  |    |    |    |    |    | 0  | 0  |
| 24 | 7  |    |    | 53 |    | 32 | 89 |    |    |    |    |    |    |    |    |    |    |    |    |    | 0  | 0  |    |
| 3  | 12 | 62 | 79 |    |    | 41 |    |    |    |    |    |    |    |    |    |    |    |    |    |    |    | 0  | 0  |
| 85 |    | 70 | 5  |    | 55 |    |    | 81 |    |    |    |    |    |    |    |    |    |    |    |    |    | 0  | 0  |
| 68 |    |    |    |    | 16 | 69 |    | 74 |    | 5  |    |    |    |    |    |    |    |    |    |    |    | 0  | 0  |
| 52 | 39 | 7  | 4  |    |    |    |    |    | 21 |    |    |    |    |    |    |    |    |    |    |    |    | 0  | 0  |
| 33 | 41 | 14 |    |    |    |    |    | 88 |    |    |    | 58 |    |    |    |    |    |    |    |    |    | 0  | 0  |
| 27 | 93 |    | 80 |    |    |    |    |    |    | 19 |    |    |    | 60 |    |    |    |    |    |    |    | 0  | 0  |
| 24 | 50 |    | 82 | 3  |    |    |    |    |    |    |    | 82 |    |    |    |    |    |    |    |    |    | 0  | 0  |
| 45 | 49 | 16 | 54 |    |    |    |    |    |    |    |    |    |    | 56 |    |    |    |    |    |    |    | 0  | 0  |
| 7  |    |    |    |    | 50 |    |    | 3  |    | 81 |    |    |    |    | 1  |    |    |    |    |    |    |    | 0  |

When the LDPC encoding is performed using the parity-check matrices shown in the above Tables, Table 7 to Table 12, in the case in which an information word bit corresponding to a first column block in a partial matrix corresponding to an information word is transmitted by being punctured, it can be appreciated that a final code rate seems to be the same as the case using the above Tables, Table 1 to Table 6, since a code rate is set to be 8/9 in the above Table 7 and Table 8, a code rate is set to be 2/3 in the above Tables, Table 9 and Table 10, and a code rate is 4/9 in the above Tables, Table 11 and Table 12. Generally, since the LDPC code may improve the performance when the puncturing of the information word is appropriately applied, the LDPC encoding using the above Tables, Table 7 to Table 12, may be applied for the performance improvement.

Figure 6:
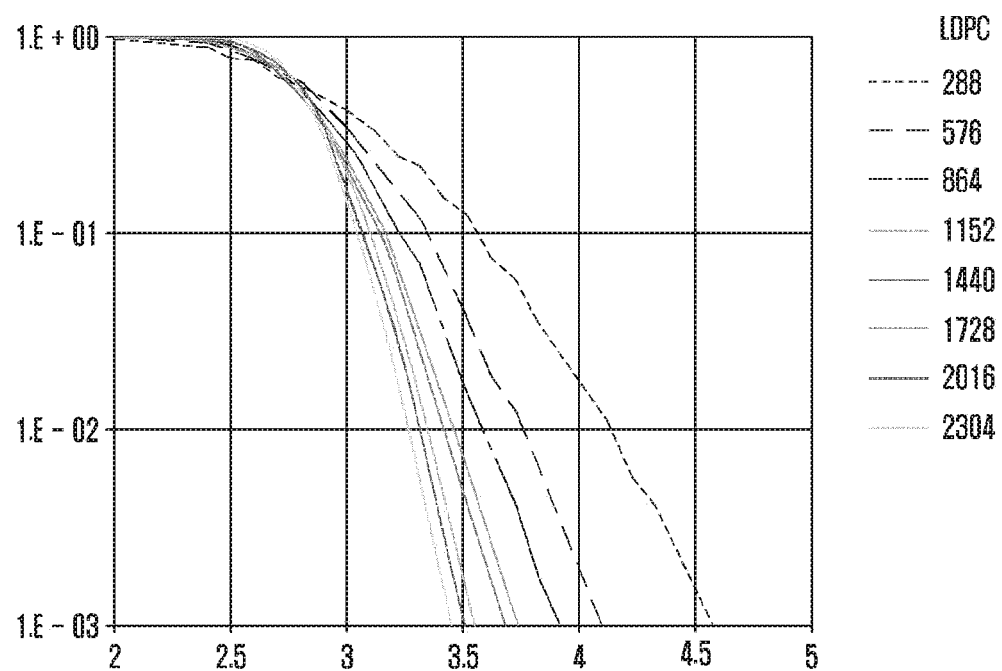
FIG. 6 is a diagram illustrating performance analysis results performed by applying Z=12, 24, 36, 48, 60, 72, 84, 96 to the parity-check matrix of Table 2 according to an embodiment of the present disclosure.

Some of computation experiment results of the performance of the parity-check matrix generated by the parity-check design method proposed in the present disclosure are illustrated in FIG. 6.

FIG. 6 is a diagram illustrating performance analysis results performed by applying Z=12, 24, 36, 48, 60, 72, 84, 96 to the parity-check matrix of the above Table 3, according to an embodiment of the present disclosure. Describing the performance, it can be appreciated that the LDPC encoding technique using 8 parity-check matrices generated from one exponential matrix is operated well. In particular, it can be confirmed that the good performance is shown without the error flooring phenomenon until a frame error rate reaches a region of 1/1000.

The exponential matrices shown in the above Tables, Table 1 to Table 12 are an exponential matrix designed under the assumption of the modulo lifting and the exponential matrices for each of the Z values may be derived by applying the above Equation 9 or 10 to each exponent.

Another example of the designed parity-check matrix is shown in the following Tables, Table 13 to Table 16. The following Tables, Table 13 to Table 16 represent the exponential matrices of each of the parity-check matrices. (Small empty block corresponds to the 0-matrix having a size of Z×Z.) For convenience of design, the number of columns of the mother matrix is fixed as 24 and in the following Table 13, a code rate is set to be 5/6, in the following Table 14, a code rate is set to be 3/4, in the following Table 15, a code rate is set to be 2/3, and in the following Table 16, a code rate is set to be 1/2. Further, the Z values for the lifting are set to be 81, 162, and 324 and mean the exponential matrices for the parity-check matrices of the supportable LDPD codes for at least three Z values.

TABLE 13

| 94 | 291 | 80 | 228 | 247 | 236 | 69 | 192 | 76 | 52 | 280 | 141 |  | 130 | 316 | 274 | 317 | 235 | 23 |  |  |  | 1 | 0 |
|---|---|---|---|---|---|---|---|---|---|---|---|---|---|---|---|---|---|---|---|---|---|---|---|
| 312 | 63 | 155 | 218 | 226 | 158 | 219 | 227 | 249 | 178 | 213 |  | 145 |  | 311 | 9 | 129 | 224 | 297 | 27 |  |  | 0 | 0 |
| 294 | 177 | 81 | 242 | 267 | 106 | 204 | 297 | 287 | 71 | 152 | 252 | 148 | 35 |  | 301 |  | 29 |  | 296 | 0 |  | 0 | 0 |
| 259 | 110 | 279 | 284 | 125 | 299 | 59 | 37 | 131 | 24 |  | 65 | 4 | 65 | 214 |  | 85 |  | 235 | 52 | 1 |  |  | 0 |

TABLE 14

| 48 | 272 | 28 | 120 | 252 | 223 |  |  | 63 | 288 | 242 |  |  |  | 280 | 275 | 265 | 1 | 0 |  |  |  |  |  |
|---|---|---|---|---|---|---|---|---|---|---|---|---|---|---|---|---|---|---|---|---|---|---|---|
| 166 | 130 | 42 | 48 | 254 | 111 |  |  | 130 | 179 | 41 | 37 | 177 |  | 54 |  |  | 0 | 0 |  |  |  |  |  |
| 35 | 238 | 321 | 294 | 118 | 278 | 21 |  | 260 | 307 |  |  | 221 | 250 |  | 275 |  |  | 0 | 0 |  |  |  |  |
| 252 | 65 | 44 | 171 | 297 | 137 | 235 | 34 | 42 |  |  | 278 |  |  | 127 | 120 | 0 |  |  | 0 | 0 |  |  |  |
| 84 | 224 | 88 | 80 | 149 | 26 |  | 323 | 298 |  | 279 |  | 188 |  | 90 |  | 153 |  |  |  | 0 | 0 |  |  |
| 188 | 75 | 33 | 264 | 312 | 302 | 3 | 38 |  |  | 35 |  | 305 | 279 | 26 |  |  | 1 |  |  |  |  | 0 |  |

TABLE 15

| 61 | 318 | 166 | 306 | 299 |  |  |  |  | 8 |  | 245 | 98 | 268 | 1 | 0 |  |  |  |  |  |  |  |  |
|---|---|---|---|---|---|---|---|---|---|---|---|---|---|---|---|---|---|---|---|---|---|---|---|
| 299 | 317 | 320 | 20 |  |  | 307 | 267 | 247 | 310 |  | 7 |  |  | 0 | 0 |  |  |  |  |  |  |  |  |
| 109 | 183 | 68 | 10 | 250 | 14 | 308 |  |  | 104 |  |  | 75 |  |  | 0 | 0 |  |  |  |  |  |  |  |
| 291 | 281 | 286 | 321 | 319 |  |  |  | 248 | 279 |  | 258 | 234 |  |  |  | 0 | 0 |  |  |  |  |  |  |
| 40 | 2 | 134 | 187 |  | 295 | 305 |  | 20 |  | 125 |  |  |  |  | 0 |  | 0 | 0 |  |  |  |  |  |
| 69 | 266 | 307 | 253 | 22 |  | 264 |  |  |  |  | 311 | 23 | 272 |  |  |  |  | 0 | 0 |  |  |  |  |
| 174 | 0 | 68 | 20 | 55 | 304 |  | 283 |  |  | 52 |  |  | 287 |  |  |  |  |  | 0 | 0 |  |  |  |
| 301 | 8 | 277 | 226 | 321 |  | 92 | 78 | 24 |  |  |  |  | 58 | 1 |  |  |  |  |  |  | 0 |  |  |

TABLE 16

| 57 |  |  | 131 |  | 11 |  | 50 |  | 322 |  | 1 | 0 |  |  |  |  |  |  |  |  |  |  |  |
|---|---|---|---|---|---|---|---|---|---|---|---|---|---|---|---|---|---|---|---|---|---|---|---|
| 246 |  | 28 |  | 243 |  |  | 298 | 250 |  |  | 0 | 0 |  |  |  |  |  |  |  |  |  |  |  |
| 273 |  |  |  | 105 | 280 |  | 218 | 95 |  |  |  | 0 | 0 |  |  |  |  |  |  |  |  |  |  |
| 62 | 296 |  |  | 296 |  | 246 | 35 |  |  |  |  |  | 0 | 0 |  |  |  |  |  |  |  |  |  |
| 202 |  |  | 20 | 147 |  | 22 | 28 |  |  |  |  |  |  | 0 | 0 |  |  |  |  |  |  |  |  |
| 243 |  |  |  | 251 |  | 123 | 50 |  | 8 |  |  |  |  |  | 0 | 0 |  |  |  |  |  |  |  |
| 312 | 241 | 322 |  |  | 299 |  | 52 |  |  | 0 |  |  |  |  |  | 0 | 0 |  |  |  |  |  |  |
| 65 |  |  |  | 38 | 300 |  | 153 |  | 270 |  |  |  |  |  |  |  | 0 | 0 |  |  |  |  |  |
| 64 |  |  |  | 95 | 295 |  | 111 |  |  | 275 |  |  |  |  |  |  |  | 0 | 0 |  |  |  |  |
|  | 45 |  | 151 | 0 |  |  | 239 | 90 |  |  |  |  |  |  |  |  |  |  | 0 | 0 |  |  |  |
| 245 | 299 |  |  | 57 | 197 |  |  | 255 |  |  |  |  |  |  |  |  |  |  |  | 0 | 0 |  |  |
| 267 |  | 304 |  | 60 |  | 108 | 294 |  | 16 | 1 |  |  |  |  |  |  |  |  |  |  |  | 0 |  |

Another example of the designed parity-check matrix is shown in the following Tables, Table 17 to Table 20. The following Tables, Table 17 to Table 20 represent the exponential matrices of each of the parity-check matrices. (Small empty block corresponds to the 0-matrix having a size of Z×Z.) For convenience of design, the number of columns of the mother matrix is fixed as 24 and in the following Table 17, a code rate is set to be 5/6, in the following Table 18, a code rate is set to be 3/4, in the following Table 19, a code rate is set to be 2/3, and in the following Table 20, a code rate is set to be 1/2. Further, the Z values for the lifting are set to be 81, 162, 324, and 648 and mean the exponential matrices for the parity-check matrices of the supportable LDPC codes for a total of four Z values.

TABLE 17

| 94 | 615 | 404 | 552 | 571 | 560 | 493 | 516 | 76 | 52 | 280 | 141 |  | 130 | 316 | 598 | 641 | 559 | 347 |  |  |  | 1 | 0 |
|---|---|---|---|---|---|---|---|---|---|---|---|---|---|---|---|---|---|---|---|---|---|---|---|
| 636 | 63 | 155 | 542 | 550 | 158 | 543 | 551 | 573 | 178 | 213 |  | 145 |  | 311 | 9 | 129 | 548 | 621 | 351 |  |  | 0 | 0 |
| 618 | 501 | 81 | 566 | 591 | 106 | 528 | 621 | 611 | 71 | 152 | 252 | 148 | 35 |  | 625 |  | 29 |  | 620 | 0 |  | 0 | 0 |
| 583 | 110 | 603 | 608 | 125 | 623 | 59 | 37 | 131 | 24 |  | 389 | 4 | 65 | 538 |  | 85 |  | 235 | 52 | 1 |  |  | 0 |

TABLE 18

| 48 | 596 | 28 | 444 | 576 | 223 |  |  | 63 | 612 | 242 |  |  |  | 604 | 599 | 589 | 1 | 0 |  |  |  |  |  |
|---|---|---|---|---|---|---|---|---|---|---|---|---|---|---|---|---|---|---|---|---|---|---|---|
| 166 | 454 | 42 | 48 | 578 | 111 |  |  | 130 | 503 | 41 | 37 | 501 |  | 54 |  |  | 0 | 0 |  |  |  |  |  |
| 35 | 562 | 321 | 618 | 442 | 602 | 21 |  | 584 | 631 |  |  | 545 | 574 |  | 599 |  |  | 0 | 0 |  |  |  |  |

TABLE 18-continued

| | | | | | | | | | | | | | | | | | | |
|---|---|---|---|---|---|---|---|---|---|---|---|---|---|---|---|---|---|---|
| 576 | 389 | 44 | 495 | 621 | 137 | 559 | 34 | 366 | | | 602 | | | 451 | 120 | 0 | 0 | 0 |
| 408 | 548 | 412 | 80 | 149 | 26 | | 647 | 622 | 603 | | 188 | | 414 | 153 | | | 0 | 0 |
| 512 | 75 | 33 | 588 | 636 | 626 | 3 | 38 | | | 359 | | 629 | 603 | 350 | | 1 | | 0 |

TABLE 19

| | | | | | | | | | | | | | | | | |
|---|---|---|---|---|---|---|---|---|---|---|---|---|---|---|---|---|
| 61 | 642 | 490 | 630 | 623 | | | | | 8 | | 569 | 98 | 592 | 1 | 0 | |
| 623 | 317 | 320 | 20 | | | 307 | 591 | 571 | 634 | 7 | | | | | 0 | 0 |
| 109 | 507 | 68 | 10 | 250 | 338 | 632 | | | 104 | | | 75 | | | 0 | 0 |
| 615 | 605 | 610 | 645 | 643 | | | 572 | 279 | | 582 | 558 | | | | 0 | 0 |
| 40 | 2 | 458 | 511 | | 619 | 629 | | 20 | | 125 | | | | 0 | | 0 0 |
| 393 | 590 | 631 | 577 | 22 | | 264 | | | | 635 | 23 | 596 | | | | 0 0 |
| 498 | 0 | 68 | 344 | 55 | 628 | | 607 | | | 52 | | | 611 | | | 0 0 |
| 625 | 332 | 277 | 550 | 321 | | | 92 | 78 | 24 | | | | 382 | 1 | | 0 |

TABLE 20

| | | | | | | | | | | | | | | | | |
|---|---|---|---|---|---|---|---|---|---|---|---|---|---|---|---|---|
| 57 | | | 455 | | 11 | | 374 | | 322 | | 1 | 0 | | | | |
| 570 | | 28 | 567 | | | | 622 | 574 | | | | 0 | 0 | | | |
| 273 | | | 105 | 604 | | | 542 | 419 | | | | | 0 | 0 | | |
| 62 | 296 | | 620 | | | 570 | 35 | | | | | | | 0 | 0 | |
| 526 | | 344 | 471 | | | 22 | 28 | | | | | | | | 0 | 0 |
| 243 | | | 575 | | 447 | | 374 | | 332 | | | | | | 0 | 0 |
| 636 | 565 | 322 | | | 299 | | 52 | | | 0 | | | | 0 | 0 | |
| 65 | | | 362 | 624 | | | 477 | | 594 | | | | | | 0 | 0 |
| 64 | | | 419 | 619 | | | 435 | | | 599 | | | | | | 0 0 |
| | 45 | 151 | 324 | | | | 563 | 414 | | | | | | | | 0 0 |
| 245 | 299 | | 57 | 521 | | | | 255 | | | | | | | | 0 0 |
| 591 | | 628 | 60 | | | 432 | 618 | | | 340 | 1 | | | | | 0 |

For reference, the exponential matrices shown in the above Tables, Table 13 to Table 20, are an exponential matrix designed under the assumption of the modulo lifting and the exponential matrices for each of the Z values may be derived by applying the above Equation 9 or 10 to each exponent and may be used for encoding. Further, it can be appreciated that if the exponential matrices of the above Tables, Table 17 to Table 20, take modulo 324, the exponential matrices of the above Tables, Table 13 to Table 16 may each be obtained and if the exponential matrices of the above Tables, Table 13 to Table 20 take modulo 81, the above Tables, Table 13 and Table 18, the above Tables, Table 14 and Table 18, the above Tables, Table 15 and Table 19, and the above Tables, Table 16 and Table 20, each have the same exponential matrix. In other words, it can be appreciated that the exponential matrices shown in the above Tables, Table 17 to Table 20, include the information on the exponential matrices shown in the above Tables, Table 13 to Table 16 and may apply the lifting using the same exponential matrix that may be obtained by taking modulo 81. The exponential matrices that may be obtained by applying the modulo 81 to the exponential matrices shown in the above Tables, Table 13 to Table 20, may support the parity-check matrix defined in the IEEE 802. 11n standard, which shows that by applying the lifting using the known parity-check matrix of the related art, a new parity-check matrix may be designed while the features of the existing parity-check matrix are maintained as they are.

All the exponential matrices shown in the above Tables, Table 1 to Table 20, are set to be $b_1=1$, $y=0$, $x=1$ in the format of the parity-check matrix illustrated in FIG. 3 to satisfy the above Equation 7 or 8. Therefore, it is well known that the matrix defined as y in the reference document [Myung2005] becomes the identity matrix and thus the efficient encoding can be made during the encoding process.

However, according to another embodiment of the present disclosure, the encoding method is represented as follows.

Referring to FIG. 3, the exponential value of the circulant matrix in the partial matrix corresponding to the parity is determined as the following Equation 13.

$$x \equiv \sum_{i=1}^{m} b_i \bmod Z \text{ and } y \not\equiv -\sum_{i=l+1}^{m} b_i \bmod Z \quad \text{Equation 13}$$

The above Equation 13 has different conditions for the y value in the above Equation 7 and thus a φ matrix defined in the reference document [Myung2005] is not the identity matrix. Therefore, there is a slight difference during the encoding process. Generally, however, the portion that affects the increase in complexity in the LDPC encoding complexity is the number of entries other than 0 that is present at T. According to the above Equation 13, φ becomes a circulant permutation matrix $P^a$ (a is integer) and thus it is apparent that $φ^{-1}$ is also a simple circulant permutation matrix $P^{-a}$. Therefore, it may be expected that the encoding complexity is little increased.

The encoding process will be described below in detail. At this point, the information word may be represented by a vector s (corresponding to partial matrices A and C of FIG. 3) and a parity vector may be represented by $p_1$ and $p_2$ respectively. ($p_1$ corresponds to partial matrices B and D of FIG. 3 and $p_2$ corresponds to partial matrices T and E of FIG. 3).

Operation 1) Calculate values of $As^T$ and $Cs^T$.

Operation 2) Calculate a value of $ET^{-1}As^T+Cs^T$. Here, the calculation may also be made using characteristics that are $ET^{-1}=[I\ I\ \ldots\ I]$.

Operation 3) Calculate a value of $p_1^T=\phi^{-1}(ET^{-1}As^T+Cs^T)$.

Operation 4) Calculate a value of $p_2$ using the relationship of $Tp_2^T=As^T+Bp_1^T$.

Actually, according to the reference document [Myung2005], a $\phi^{-1}$ operation is required during a process (operation 3) of obtaining a first parity of FIG. 3 and since the $\phi$ matrix is the identity matrix, the parity-check matrix satisfying the above Equation 7 does not require the $\phi^{-1}$ operation and thus the efficient encoding can be made. However, the first parity requires a $P^{b_1}$ related operation during a process (operation 4) of obtaining a second parity. The reason is that the matrix included in the B includes $P^{b_1}$ and the first parity requires the $P^{b_1}$ related operation during the process of calculating $Bp_1^T$. If the $P^{b_1}$ is set as the identity matrix, that is, bi is set to be 0 to simplify the operation, the cycle characteristics on the tanner graph may deteriorate. Therefore, to prevent the cycle characteristics from deteriorating, the $P^{b_1}$ related operation is performed on the first parity to obtain the second parity.

The detailed example of the case of the above Equation 13 will be described. For example, it is assumed that the exponents of the circulant permutations of the partial matrix corresponding to the parity of FIG. 3 are set like $b_1=b_2=\ldots=b_m=x=0, y\neq 0$ to satisfy the above Equation 13. In this case, $\phi=P^y$ and thus an operation of an inverse matrix of $P^y$ operation is required during the process of obtaining the first parity. However, the $b_1$ may be set to be 0, and therefore there is no need to perform the operation related to the circular permutation matrix on the first parity during the process of obtaining the second parity. Further, the y value may be set to prevent the cycle characteristics of the tanner graph from deteriorating. (Generally, to make the cycle characteristics good, the y value is set so that y and Z are relatively prime). Therefore, the increase in the encoding complexity may be disregarded without the deterioration in performance. In addition, $b_1=b_2=\ldots=b_m=x=0$ means that the matrix consists of the identity matrix and therefore it is greatly advantageous to implement the plurality of parity-check matrices as hardware.

The foregoing encoding process may be represented below in detail. As described above, the information word may be represented by a vector s (corresponding to partial matrices A and C of FIG. 3) and a parity vector may be represented by $p_1$ and $p_2$, respectively. ($p_1$ corresponds to partial matrices B and D of FIG. 3 and $p_2$ corresponds to partial matrices T and E of FIG. 3). The encoding process using the above Equation 13 is similar to the foregoing encoding process, but is different therefrom in the operations 3 and 4.

Operation 1) Calculate a value of $As^T$ and $Cs^T$.

Operation 2) Calculate of a value of $ET^{-1}As^T+Cs^T$. Here, The calculation may be made using the characteristics that are $ET^{-1}=[I\ I\ \ldots\ I]$.

Operation 3) Calculate a value of $p_1^T=P^{-y}(ET^{-1}As^T+Cs^T)$. ($\phi=P^y$, $\phi^{-1}=P^{-y}$), in which $P^{-y}$ may be easily implemented by a circular y bit shift.

Operation 4) Calculate a value of $p_2$ using the relationship of $Tp_2^T=As^T+Bp_1^T$.

Referring to the LDPC encoding process, the calculation value of the Equation consisting of the information word and some of the parity-check matrix is determined in Operation 1) and Operation 2). Next, in Operation 3), the appropriate circular shift is applied to determine the first parity $p_1$ and then in Operation 4), $p_2$ is determined based on the result.

In Operation 4), B consists of I, Py, a zero matrix, or the like, and therefore using the result of Operation 3), the calculation of $Bp_1^T$ may be easily implemented. For example, the $I\cdot p_1^T$ operation is the same as $p_1^T$, and therefore the result of Operation 3) may be used as is. Further, the $P^y p_1^T$ calculation is the same as the result of Operation 2), and therefore the additional calculation is not required.

Finally, $p_2^T$ may be obtained merely using $T^{-1}(As^T+Bp_1^T)$, but the computational complexity for calculating a $T^{-1}$ product is increased, and therefore $Tp_2^T$ is generally calculated using a back-substitution method.

Consequently, when the parity-check matrix of FIG. 3 is divided into the partial matrix corresponding to the information word and the partial matrix corresponding to the parity, and the parity matrix corresponding to the parity is again divided into a first section B consisting of the identity matrix, the circular permutation matrix, and the zero matrix, a second section D consisting of the identity matrix or the circular permutation matrix, a third section E consisting of the identity matrix or the circular permutation matrix, and a fourth section T in which the identity matrix or the circular permutation matrix is arranged in a dual diagonal form, the transmitting or receiving method and apparatus using the LDPC code using the parity-check matrix in which (E)(T−1)(B)+D is not the identity matrix but the circular permutation matrix may have low encoding complexity and may be easily implemented. Further, the structure of the parity-check matrix may select y as any integer between 1 and (Z−1) in $\phi=P^y$ and thus may select various exponents, thereby easily design a code having excellent cycle characteristics.

Another example of the parity-check matrix designed by the design method proposed in the present disclosure is illustrated in FIGS. 11A, 11B, 12A, 12B, 13A, 13B, 14A, 14B, 15A, 15B, 16A, and 16B.

FIGS. 11A, 11B, 12A, 12B, 13A, 13B, 14A, 14B, 15A, 15B, 16A, and 16B represent the exponential matrices of each of the parity-check matrices according to an embodiment of the present disclosure.

It is assumed that the small empty block means the 0-matrix having the size of Z×Z and the Z values for the lifting are set to be 12, 24, 36, 48, 60, 72, 84, and 96 to support a total of 8 lengths.

For reference, a 37-th column block to a final column block of FIG. 11 and a 38-th column block to a final column block of FIG. 14 all have an order of 1. For convenience, some of the blocks are omitted from the above Tables. Further, the column blocks having an order of 1 consist of the identity matrices.

Describing the parity-check matrix of FIG. 11, it can be appreciated that the partial matrix consisting of four row blocks and 36 column blocks of all the parity-check matrices coincides with the parity-check matrix corresponding to the above Table 2. That is, it can be appreciated that the parity-check matrix of FIG. 11 has the form extended by concatenating a plurality of single parity-check codes with the parity-check matrix corresponding to the above Table 2. Further, it can be easily appreciated that the parity-check matrices of FIGS. 12A to 16B each also have the form extended from the parity-check matrices of the above Table 4, Table 6, Table 8, Table 10, and Table 12.

Figure 17B:
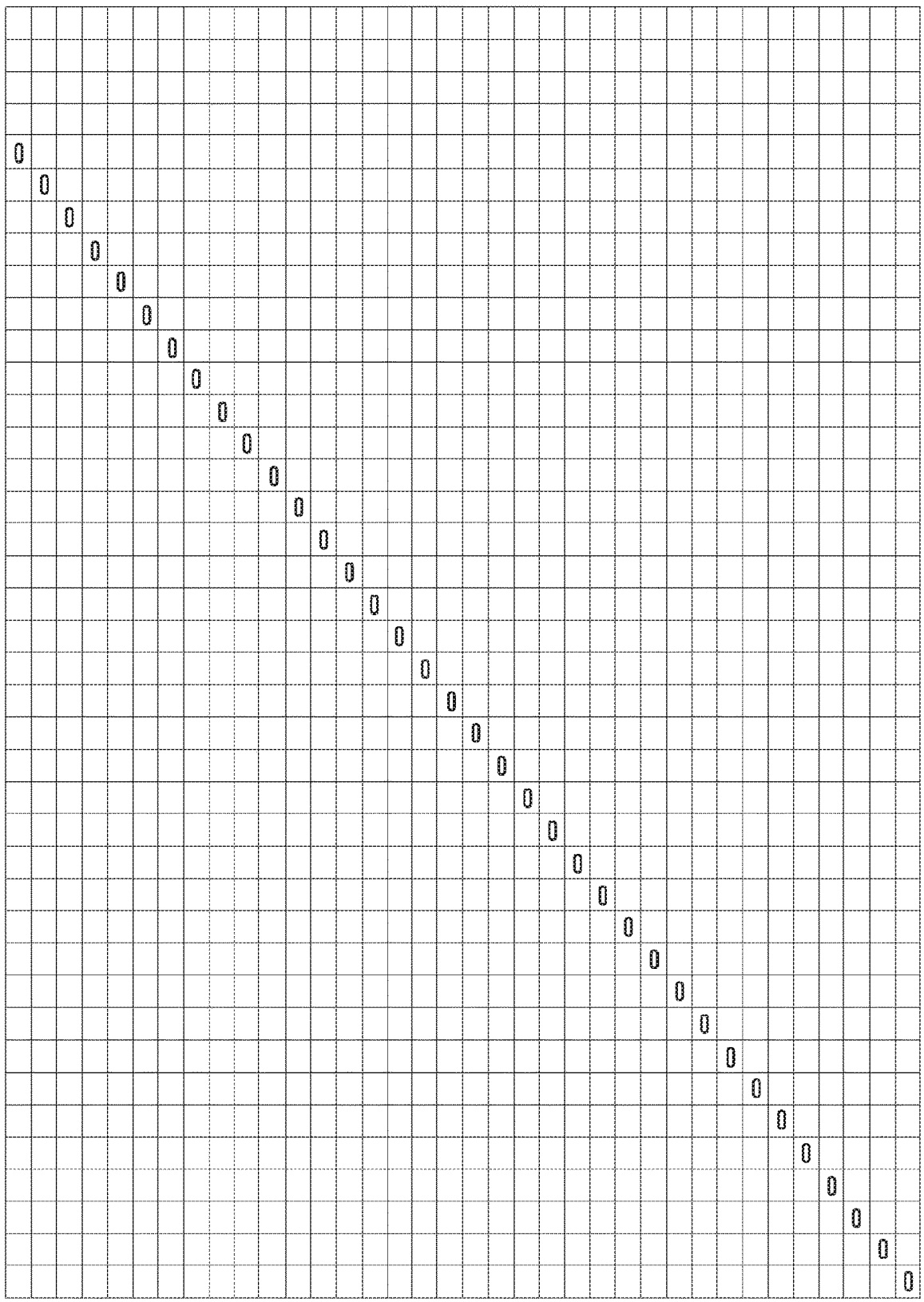

Another example of the parity-check matrix designed by the design method proposed in the present disclosure is illustrated in FIGS. 17A and 17B.

FIGS. 17A and 17B represent the exponential matrices of each of the parity-check matrices according to an embodiment of the present disclosure.

In the present disclosure, the parity-check matrix may be represented by a sequence having algebraically the same characteristics as well as an exponential matrix. In the present disclosure, for convenience, the parity-check matrix is represented by a sequence (or location of 1 of the circular permutation matrix configuring the parity-check matrix) indicating the location of 1 within the exponential matrix or the parity-check matrix, but a sequence notation that may identify a location of 1 or 0 included in the parity-check matrix is various and therefore is not limited to the notation in the present specification. Therefore, there are various sequence forms showing algebraically the same effect. It is assumed that the small empty block means the 0-matrix having the size of Z×Z and the Z values for the lifting are set to be 27, 54, and 81 to support a total of 3 lengths. For reference, a 25-th column block to a final column block of FIG. 17 all have an order of 1. Further, the column blocks having an order of 1 consist of the identity matrices.

The parity-check matrix to which the concatenation scheme with the single parity-check code is applied has easy extendibility, and therefore is advantageous in applying an incremental redundancy (IR) technique. The IR technique is an important technology for a hybrid automatic repeat reQuest support, and therefore the IR technique having efficient and excellent performance increases the efficiency of the hybrid automatic-repeat-request (HARQ) system. The LDPC codes based on the parity-check matrices uses a portion extended to the single parity-check code to generate a new parity and transmit the generated parity, thereby applying the IR technique having efficient and excellent performance.

For reference, the parity-check matrices designed by the design method proposed in an embodiment of the present disclosure means the exponential matrix for the Z value but it is apparent that when shortening and puncturing are appropriately applied to the LDPC code corresponding to the corresponding parity-check matrix, the LDPC encoding technique having various block lengths and code rates may be applied. In other words, lengths of various information words may be supported by applying the appropriate shortening to the LDPC code corresponding to the parity-check matrix corresponding to the drawings illustrated in FIGS. 11A to 17B, various code rates may be supported by appropriately applying the puncturing, and the single parity-check bit may be generated as much as the appropriate length and transmitted, thereby applying the efficiency IR technique.

Meanwhile, the LDPC code may be decoded using an iterative decoding algorithm based on a sum-product algorithm on the bipartite graph illustrated in FIG. 2 and the sum-product algorithm is a kind of message passing algorithm.

Hereinafter, the message passing operation generally used at the time of the LDPC decoding will be described with reference to FIGS. 7A and 7B.

Figure 7A:
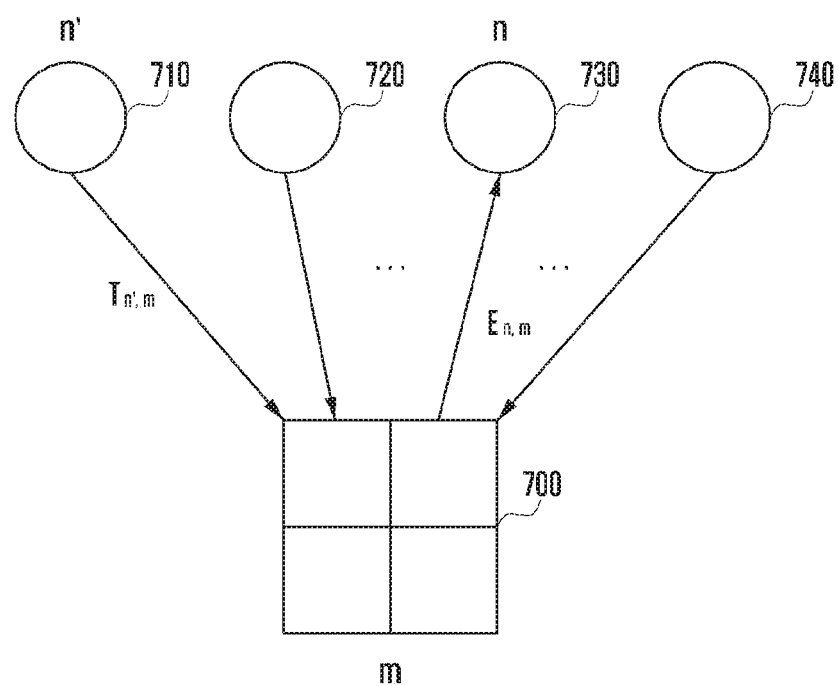
FIGS. 7A and 7B are message structure diagrams illustrating message passing operations performed at any check node and variable node for LDPC decoding according to an embodiment of the present disclosure.
Figure 7B:
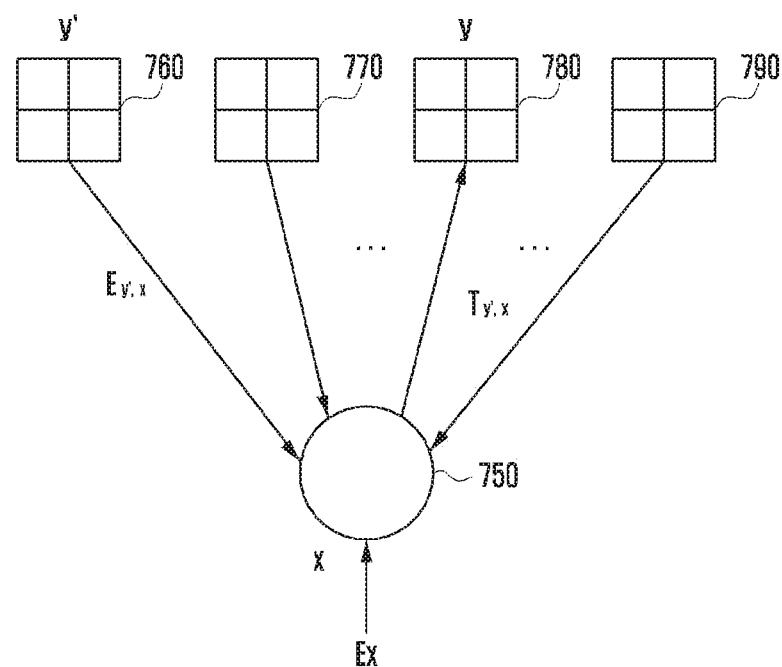

FIGS. 7A and 7B are message structure diagrams illustrating message passing operations performed at any check node and variable node for LDPC decoding according to an embodiment of the present disclosure.

Referring to FIG. 7A illustrates a check node m 700 and a plurality of variable nodes 710, 720, 730, and 740 connected to the check node m 700. Further, $T_{n',m}$ that is illustrated represents a massage passing from a variable node n' 710 to the check node m 700 and $E_{n,m}$ represents a message passing from the check node m 700 to the variable node n 730. Here, a set of all the variable nodes connected to the check node m 700 is defined as N(m) and a set other than the variable node n 730 from the N(m) is defined as N(m)/n.

In this case, a message update rule based on the sum-product algorithm may be represented by the following Equation 14.

$$|E_{n,m}| = \Phi\left[\sum_{n' \in N(m)\backslash n} \Phi(|T_{n',m}|)\right] \quad \text{Equation 14}$$

$$\text{Sign}(E_{n,m}) = \prod_{n' \in N(m)\backslash n} \text{sign}(T_{n',m})$$

In the above Equation 14, Sign ($E_{n,m}$) represents a sign of $E_{n,m}$ and $|E_{n,m}|$ represents a magnitude of message $E_{n,m}$. Meanwhile, a function $\Phi(x)$ may be represented by the following Equation 15.

$$\Phi(x) = -\log\left(\tanh\left(\frac{x}{2}\right)\right) \quad \text{Equation 15}$$

Meanwhile, FIG. 7B illustrates a variable node x 750 and a plurality of check nodes 760, 770, 780, and 790 connected to the variable node x 750. Further, $E_{y',x}$ that is illustrated represents a massage passing from a check node y' 760 to the variable node x 750 and $T_{y,x}$ represents a message passing from the variable node m 750 to the variable node n 780. Here, a set of all the variable nodes connected to the variable node x 750 is defined as M(x) and a set other than the check node y 780 from the M(x) is defined as M(x)/y. In this case, the message update rule based on the sum-product algorithm may be represented by the following Equation 16.

$$T_{y,x} = E_x + \sum_{y' \in M(x)\backslash y} E_{y',x} \quad \text{Equation 16}$$

In the above Equation 16, $E_x$ represents an initial message value of the variable node x.

Further, upon determining a bit value of the node x, it may be represented by the following Equation 17.

$$P_x = E_x + \sum_{y' \in M(x)} E'_y, x \quad \text{Equation 17}$$

In this case, the encoding bit corresponding to the node x may be decided based on a $P_x$ value.

The method illustrated in FIGS. 7A and 7B is the general decoding method and therefore the detailed description thereof will be no longer described. However, in addition to the method described in FIGS. 7A and 7B, other methods for determining a passing message value at a variable node and a check node may also be applied (Frank R. Kschischang, Brendan J. Frey, and Hans-Andrea Loeliger, "Factor Graphs and the Sum-Product Algorithm," IEEE TRANSACTIONS ON INFORMATION THEORY, VOL. 47, NO. 2, February 2001, pp 498-519).

Hereinafter, an operation of a transmitter will be described in detail with reference to FIG. 4.

In detail, as illustrated in FIG. 4, a transmitting apparatus 400 may include a segmentator 410, a zero padder 420, an LDPC encoder 430, a rate matcher 440, and a modulator 450 to process variable length input bits.

Here, the components illustrated in FIG. 4 are components for performing encoding and modulation on the variable length input bits, which is only one example, and is not limited thereto. In some cases, some of the components illustrated in FIG. 4 may be omitted or changed and other components may also be added.

Figure 8:
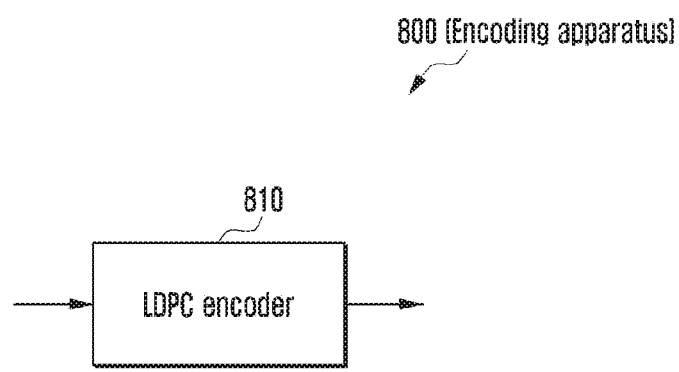
FIG. 8 is a block diagram for describing a configuration of an LDPC encoder according to an embodiment of the present disclosure.

Meanwhile, the LDPC encoder 430 illustrated in FIG. 4 may perform operations performed by an LDPC encoder 810 illustrated in FIG. 8.

The transmitting apparatus 400 may determine required parameters (for example, input bit length, modulation and code rate (ModCod), parameter for zero padding, code rate/code length of an LDPC code, parameter for interleaving, parameter for repetition, parameter for puncturing, modulation scheme, or the like) and perform the encoding based on the determined parameters and transmit the encoded parameters to a receiving apparatus of FIG. 5.

Since the number of input bits is variable, when the number of input bits is larger than the preset value, the input bit may be segmented to have a length that is equal to or less than the preset value. Further, each of the segmented blocks may correspond to one LDPC coded block. However, when the number of input bits is equal to or smaller than the preset value, the input bit is not segmented. The input bits may correspond to one LDPC coded block.

Hereinafter, the segmentation method will be described in more detail with reference to FIG. 18. When the number of input bits is B and the B is larger than $K_{max}$ that is the preset value, the segmentation is performed. Hereinafter, the segmentation is performed on the input bit based on the maximum number of input bits of the LDPC code and the number of blocks. The maximum number of input bits and the number of blocks may be as the following Table 21.

TABLE 21

| Code Rate | $K_{max}$ | $K_{min}$ | $N_{ldpc\_b}$ | $K_{ldpc\_b}$ |
|---|---|---|---|---|
| 5/6 | 1620 | 540 | 24 | 20 |
| 3/4 | 1458 | 486 | 24 | 18 |
| 2/3 | 1296 | 432 | 24 | 16 |
| 1/2 | 972 | 324 | 24 | 12 |
| 1/3 | 1620 | 540 | 60 | 20 |

In the above Table 21, the $K_{max}$ is the number of LDPC information word bits corresponding to the parity-check matrix of the largest LDPC code and is the maximum number of input bits required to generate the largest one LDPC codeword and $K_{min}$ is the maximum number of LDPC information word required to generate one LDPC codeword from the parity-check matrix of the smallest LDP code.

For convenience, the $K_{max}$ represents the maximum number of LDPC input bits (or information bits) that may perform the encoding using the largest parity-check matrix given in the system and $K_{min}$ represents the maximum number of LDPC input bits (or information bits) that may perform the encoding using the smallest parity-check matrix given in the system.

It is to be noted that the $K_{min}$ does not mean a bit number of a code block having a minimum size that may be input in the system. The transmitting apparatus may perform the LDPC encoding on the code block having the size smaller than the $K_{min}$ by appropriately applying the shortening method to the smallest LDPC code or the parity-check matrix.

$N_{ldpc\_b}$ represents the number of column blocks of the parity-check matrix and $K_{ldpc\_b}$ represents the number of column blocks of the information word part of the parity-check matrix. In the above Equation 3, n is equal to the $N_{ldpc\_b}$ and m is equal to $(N_{ldpc\_b}-K_{ldpc\_b})$.

When the number of segmented blocks is set to be C, a C value may be represented like the following Equation 18.

$$C=\lceil B/K_{max}\rceil \quad \text{Equation 18}$$

In the above Equation 18, the $K_{max}$ value represents the maximum number of input bits of the LDPC code when the Z value of the LDPC code is maximal. For example, it may be as the above Table 21. The $K_{max}$ value is different depending on the code rate to be applied. Generally, to transmit data in the system, a modulation and coding scheme (MCS) is determined depending on the channel condition and therefore it may be assumed that the code rate information is already defined. Therefore, the transmitting apparatus uses the $K_{max}$ value corresponding to the corresponding code rate.

When output bits of a code block segmentation are set to be $C_{r0}, C_{r1}, C_{r2}, C_{r3}, \ldots, C_{r(K_r-1)}$, r represents an r-th code block and $K_r$ represents the number of bits of the r-th code block.

The transmitting apparatus may obtain a J value is obtained like the following Equation 19 based on the number B of input bits of the segmented blocks and the C of the above Equation 18. The J value is a value temporarily obtaining the length of the code block before an insertion of a padding bit. Therefore, the J value may be referred to as the size of the code block other than the padding bit.

$$J=\lceil B/C\rceil \quad \text{Equation 19}$$

Hereinafter, the transmitting apparatus adjusts the J to be the number that is a multiple of product of the $K_{ldpc\_b}$ of the LDPC code by the smallest Z value. Hereinafter, it is assumed that in the following Equation 20, the smallest Z value is 27 and other Z values are a multiple of 27.

$$K'=\lceil J/(27\times K_{ldpcb})\rceil \times 27\times K_{ldpc\_b} \text{ or}$$

$$K'=\lceil J/(Z_{min}\times K_{ldpcb})\rceil \times Z_{min}\times K_{ldpc\_b} \quad \text{Equation 20}$$

In the above Equation 20, $Z_{min}\times K_{ldpc\_b}$ is equal to the $K_{min}$. The Equations 19 and 20 are a process of determining the number of information bits to which LDPC encoding will be applied and may be considered as the same process as the process of determining an LDPC code to which encoding will be applied. The above Equation means that if the length J of the code block is larger than $K_{min}$ and smaller than $2K_{min}$, $J/K_{min}$ is a number between 1 and 2, and therefore the number of information bits to which the encoding will be applied is determined as $K'=2K_{min}$.

Depending on the Equations, the transmitting apparatus may pad '0' to make the length of the code block equal to the number of information word bits of the LDPC code. Therefore, in the present disclosure, the bit number K' of LDPC encoding information words may be called the length of the code block or the size of the code block.

Therefore, the transmitting apparatus may calculate bits to which '0' is padded based on the following Equation 21. The padding bit is a multiple of the number (=C) of code blocks and the number of LDPC input bits. The number of padding bits is as the following Equation 21.

$$F'=K'\times C-B \quad \text{Equation 21}$$

This is the Equation to obtain the total number of padding bits and when the number of code blocks is multiplied by the number of information bits to which the LDPC encoding will be applied, the total number of information bits is calculated. Here, when the number of input bits is subtracted, a bit to which 0 will be padded may be calculated.

Further, to equally distribute the padding bits in each code block if possible and make the number of padding bits of the code blocks equal, the transmitting apparatus obtains the number of code blocks to make the number of padding bits $F=\lceil F'/C \rceil$ like the following Equation 22.

$$\gamma = F' \bmod C \qquad \text{Equation 22}$$

Hereinafter, the transmitting apparatus determines the length of the padding bit at each code block $K_r$ based on the values derived from the above Equations 18, 19, 20, 21, and 22.

$(C-\gamma)$ code blocks consist of $\lceil B/C \rceil$ input bits and $F=\lceil F'/C \rceil$ padding bits. Therefore, the number of bits of the code block is as the following Equation 23.

$$K_r = \lceil B/C \rceil + F \text{ and } F = \lceil F'/C \rceil \qquad \text{Equation 23}$$

The transmitting apparatus is configured so that (Y) code blocks consist of $\lfloor B/C \rfloor$ input bits and $F=\lceil F'/C \rceil$ padding bits. Therefore, the number of bits of the code blocks is as the following Equation 24.

$$K_r = \lfloor B/C \rfloor + f \text{ and } F = \lceil F'/C \rceil \qquad \text{Equation 24}$$

In the above description, the case in which there is no segmentation is as follows. The number of blocks considering the padding bit is as the following Equation 25.

$$K' = \lceil B/(27 \times K_{ldpc\_b}) \rceil \times 27 \times K_{ldpc\_b} \qquad \text{Equation 25}$$

The padding bit F may be obtained as the following Equation 26.

$$F = K' - B \qquad \text{Equation 26}$$

The number of bits of the code block including the padding bit is as the following Equation 27.

$$K_r = B + F = K' \qquad \text{Equation 27}$$

The operation may be described as follows.

```
if C=1,
    K' = ⌈B/(27× K_ldpc_b)⌉× 27 × K_ldpc_b
    F = K'−B
    K_r = B+F
else
    J = ⌈B/C⌉
    K' = ⌈J/(27 × K_ldpc_b)⌉× 27 × K_ldpc_b
    F' = K'×C − B
    γ = F' mod C
end if
    s = 0
    for r = 0 to C−1
        if r ≤ C − γ − 1
            F = ⌊F' /C⌋
            K_r = ⌈B/C⌉+ F
        else
            F = ⌈F' /C⌉
            K_r = ⌊B/C⌋+ F
        end if
        for k =0 to K_r − F − 1
            c_rk = b_s
            s = s + 1
        end for k
        The filler bits <NULL> shall be inserted end of the each code block
        for k = K_r − F − 1 to K_r−1.
            cr_k = <NULL>
        end for k
    end for r
```

In the above process, it is to be noted that $27 \times K_{ldpc\_b}$ is substituted into $K_{min}$.

As described above, upon the segmentation, all the lengths of the padded code blocks are equal. The lengths of the segmented code blocks may be equal to make the encoding and decoding parameters of the LDPC codes of each code block equal, thereby lowering the implementation complexity. Further, the padded '0' bits of each code block are equal if possible, thereby making the encoding performance excellent. The difference of the padding bit is 1 bit during the process.

Figure 18:
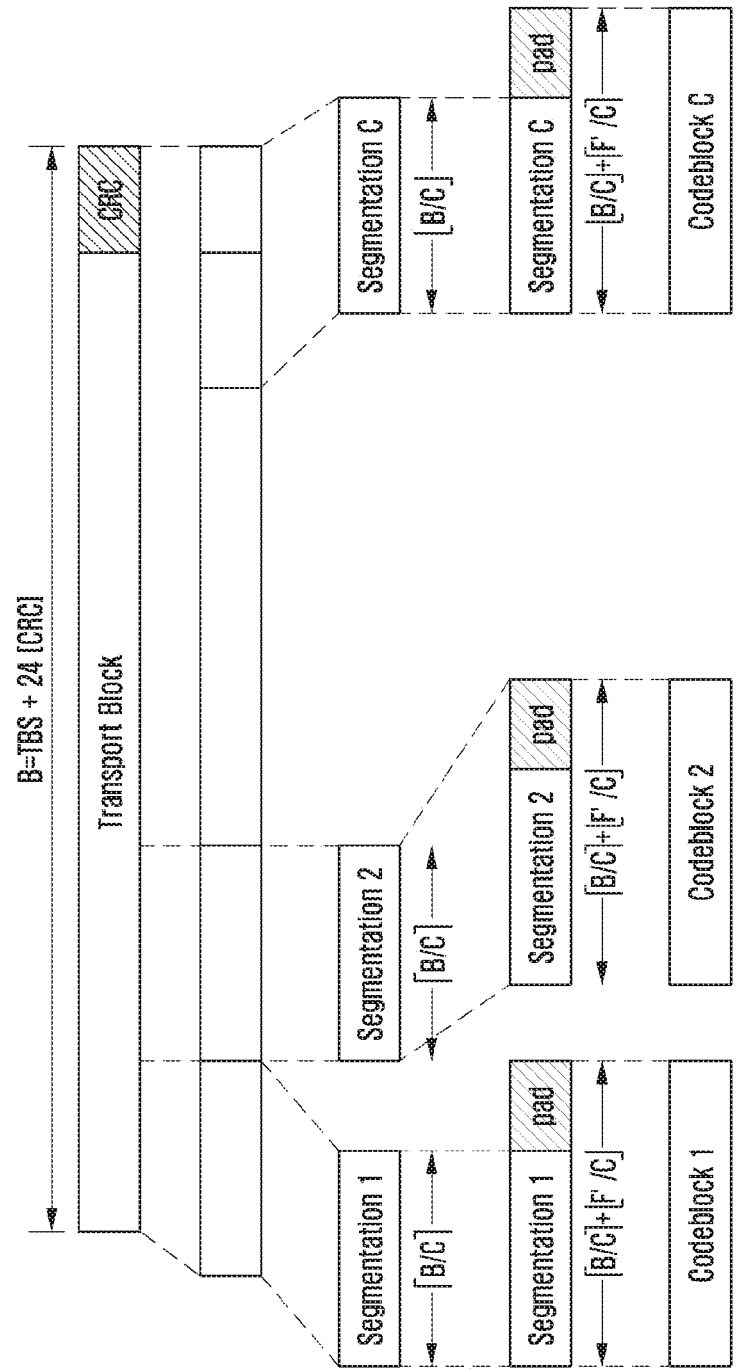
FIG. 18 is a diagram illustrating a segmentation method according to an embodiment of the present disclosure.

FIG. 18 schematically illustrates the process according to an embodiment of the present disclosure.

Further, the input bit $K_{ldpc}$ of the LDPC code is equal to $K_r$ and the size Z of the sub matrix is as the following Equation 28.

$$Z = \lceil K_{ldpc}/(27 \times K_{ldpc\_b}) \rceil 27 \qquad \text{Equation 28}$$

The segmentation process is briefly arranged as follows.

The transmitting apparatus identifies the number of input bits and then determines the number of code blocks based on the maximum number $K_{max}$ of LDPC input bits (or information bits) that may perform the encoding using the largest parity-check matrix given in the system.

Further, the transmitting apparatus may determine the size of the code block. That is, the transmitting apparatus may determine the size of the code block based on the maximum number $K_{min}$ of input bits (or information bits) that may perform the encoding using the smallest parity-check matrix given in the system.

Further, the transmitting apparatus determines the number of padding (shortening) bits based on the size of the code block. Further, the transmitting apparatus may determine the parity-check matrix that will perform the actual LDPC encoding depending on the size of the code block.

Next, the transmitting apparatus applies the padding (or shortening) as many as the determined number of padding (or shortening) number to determine the code block and then may perform the LDPC encoding using the determined parity-check matrix.

An embodiment of the present disclosure describes that the parity-check matrix is determined depending on the size of the code block, but the content of the present disclosure is not limited thereto. That is, the parity-check matrix may be defined depending on the range of the size of the input bit and the method for determining a parity-check matrix depending on the size of the input bit may also be available.

The segmentation based on the above Table 21 and the above Equations, Equation 18 to Equation 28, may be applied when the number of LDPC codeword bits or the number of information word bits of the LDPC code is increased at a predetermined size. For example, when the LDPC code to which the segmentation based on the above Table 21 and the above Equations, Equation 18 to Equation 28 are applied, the number of three codeword bits or the number of information bits are given, the number of codeword bits is constantly increased at an interval of 648 like 648, 1296, and 1944, and the number of information word bits is constantly increased at an interval of $K_{min}$ like $K_{min}$, $2 \times K_{min}$, and $3 \times K_{min}$ $(=K_{max})$ depending on the code rate.

When the given number of information bits of the LDPC codes is increased at a predetermined interval like $K_{min}$, the process of determining a parity-check matrix of an LDPC code based on $K_{min}$ during the segmentation process is simplified like the above Equation 20. That is, it can be appreciated that the process of determining a parity-check matrix is determined using the size of the largest code block determined based on the above Equation 19 or 20.

Next, when the given number of bits of the LDPC codeword or the number of information word bits of the LDPC code is not increased at a predetermined size, an embodiment of the segmentation method will be described.

First, when the number of input bits is B and the B is larger than the K. that is the preset value, the segmentation is applied similarly. Hereinafter, the embodiment in which the segmentation is performed based on the maximum number of input bits of the LDPC code will be described.

First, in an embodiment of the present disclosure, the maximum number K. of input bits of the LDPC code and the minimum number of information word bits of the LDPC code are as shown in the following Table 22.

TABLE 22

| Code Rate | $K_{max}$ | $K_{min}$ |
|---|---|---|
| 5/6 | 6480 | 540 |
| 3/4 | 5832 | 486 |
| 2/3 | 5184 | 432 |
| 1/2 | 3888 | 324 |
| 1/3 | 1620 | 540 |

For convenience of explanation, the maximum number of information bits that may perform the LDPC encoding using the parity-check matrices of each LDPC code given in the system is set to be four like $K_{min}$, $2 \times K_{min}$, $3 \times K_{min}$, and $K_{max}$. That is, since four given LDPC codes are present and $K_{max}$ is $12 \times K_{min}$, it can be appreciated that the number of bits is not increased at a predetermined interval. As another embodiment, the number of LDPC codeword information bits may also be set like $K_{min}$, $2*K_{min}$, $3*K_{min}$, $4*K_{min}$, $5*K_{min}$, and $7*K_{min}$ ($=K_{max}$).

As such, the above Table 22 in which $K_{max}$ is set to be $12 \times K_{min}$ is only one example and $K_{max}$ may be set based on $K_{min}$.

When the number of segmented blocks is set to be C, the C value may be represented like the above Equation 18. In the above Equation 18, the $K_{max}$ value represents the maximum number of input bits of the LDPC code as the value corresponding to the case in which the Z value of the LDPC code is maximal.

When the output bits of the code block segmentation are set to be $C_{r0}, C_{r1}, C_{r2}, C_{r3}, \ldots, C_{r(K_r-1)}$, the r represents the r-th code block and the $K_r$ represents the number of bits of the r-th code block.

The transmitting apparatus obtains the J value like the following Equation 19 based on the number B of input bits and the C of the above Equation 18. The J value is a value temporarily obtaining the length of the code block before an insertion of a padding bit, which may be referred to as the size of the code block other than the padding bit as described above.

Next, the transmitting apparatus may determine the size of the code block, determine the parity-check matrix depending on the size of the code block, and perform the LDPC encoding using the parity-check matrix.

The segmentation process under the above conditions is briefly arranged as follows.

The transmitting apparatus identifies the number of input bits and then determines the number of code blocks based on the maximum number $K_{max}$ of LDPC input bits (or information bits) that may perform the encoding using the largest parity-check matrix given in the system.

Further, the transmitting apparatus may determine the size of the code block. That is, the transmitting apparatus may determine the size of the code block based on the maximum number $K_{min}$ of input bits (or information bits) that may perform the encoding using the smallest parity-check matrix given in the system.

Further, the transmitting apparatus determines the number of padding (shortening) bits based on the size of the code block. Further, the transmitting apparatus may determine the parity-check matrix that will perform the actual LDPC encoding depending on the size of the code block.

Next, the transmitting apparatus may apply the padding (or shortening) as many as the determined number of padding (or shortening) number to determine the code block and then may perform the LDPC encoding using the determined parity-check matrix.

However, as described above, the parity-check matrix may be defined depending on the range of the size of the input bit and the method for determining a parity-check matrix depending on the size of the input bit may also be available.

Meanwhile, it can be appreciated that the process of determining a parity-check matrix of an LDPC code depending on a size of a code block during the segmentation process needs to be applied with different determination methods depending on the range of J that is the size of the code block other than the number of padding bits unlike the foregoing segmentation method. For example, in the example in which the number of LDPC codeword information bits is set to be $K_{min}$, $2*K_{min}$, $3*K_{min}$, $5*K_{min}$ ($=K_{max}$), a method for determining K' may be different depending on when the J value is larger than or not larger than $3 \times K_{min}$.

That is, the maximum number of information bits that may perform the LDPC encoding using the parity-check matrices of each LDPC code given in the system is not evenly increased, and when the increasing range satisfies a predetermined condition, it can be appreciated that at least two different methods are present to determine the K' or the parity-check matrix depending on the range of the J value that is the size of the largest code block.

In detail, when the number of code blocks is 1, the transmitting apparatus may determine K' using the foregoing method if the number of input bits is smaller than $3K_{min}$. On the other hand, if the number of input bits is larger than $3K_{min}$, K' may be determined as $K_{max}$. Therefore, in this case, the transmitting apparatus may perform 0 padding on all the rest bits other than the number of input bits at $K_{max}$.

On the other hand, when the number of code blocks is two, different methods may be used to determine the parity-check matrix depending on the range of the J value that is the size of the code block other than the number of padding bits.

When J is smaller than $3 \times K_{min}$, the transmitting apparatus may determine the number K' of information bits to which the LDPC encoding will be applied based on $\lceil J/(K_{min}) \rceil \times K_{min}$. The detailed content is as the foregoing.

On the other hand, when J is larger than $3 \times_{min}$, as described above, K' may be determined as $K_{max}$. The detailed segmentation process may be represented as follows.

```
if C = 1,
    if B ≤ 3K_min
        K_0 = ⌈B/K_min⌉ · K_min
    else
        K_0 = K_max
    F_0 = K_0 - B
else
    J = ⌈B/C⌉
    if J ≤ 3K_min
        K = ⌈J/K_min⌉ · K_min
    else
        K = K_max
    F = K · C - B
    γ = F mod C
    for r = 0 to C - 1
        if r ≤ C - γ - 1
            F_r = ⌊F /C⌋
            K_r = ⌊B/C⌋ + F_r
        else
            F_r = ⌈F /C⌉
            K_r = ⌊B/C⌋ + F_r
        end if
    end for r
end if
s = 0
for r = 0 to C - 1
    for k = 0 to K_r - F_r - 1,
        c_rk = b_s
        s = s +1
    end for k
```

The filler bits <NULL> shall be inserted end of e each code block

```
for k = K_r - F_r - 1 to K_r -1,
    crk = <NULL>
end for k
end for r
```

However, in the foregoing embodiment of the present disclosure, the following process may be omitted depending on the value of $K_{max}$.

```
if J ≤ 3K_min
    K = ⌈J/K_min⌉ · K_min
else
```

For example, each of the number of maximum information bits that may perform the LDPC encoding using the parity-check matrix of each LDPC code given in the system is set to be four like $K_{min}$, $2×K_{min}$, $3×K_{min}$, and $12×K_{min}$ ($=K_{max}$). Next, when $B>12×K_{min}$ is established, $C>1$. In this case, it is apparent that B/C is always equal to or larger than $6×K_{min}$. Therefore, the process is not required to consider the case in which the J value is smaller than $3×K_{min}$.

Hereinafter, another process of performing segmentation depending on the range of the J value will be described.

Figure 19:
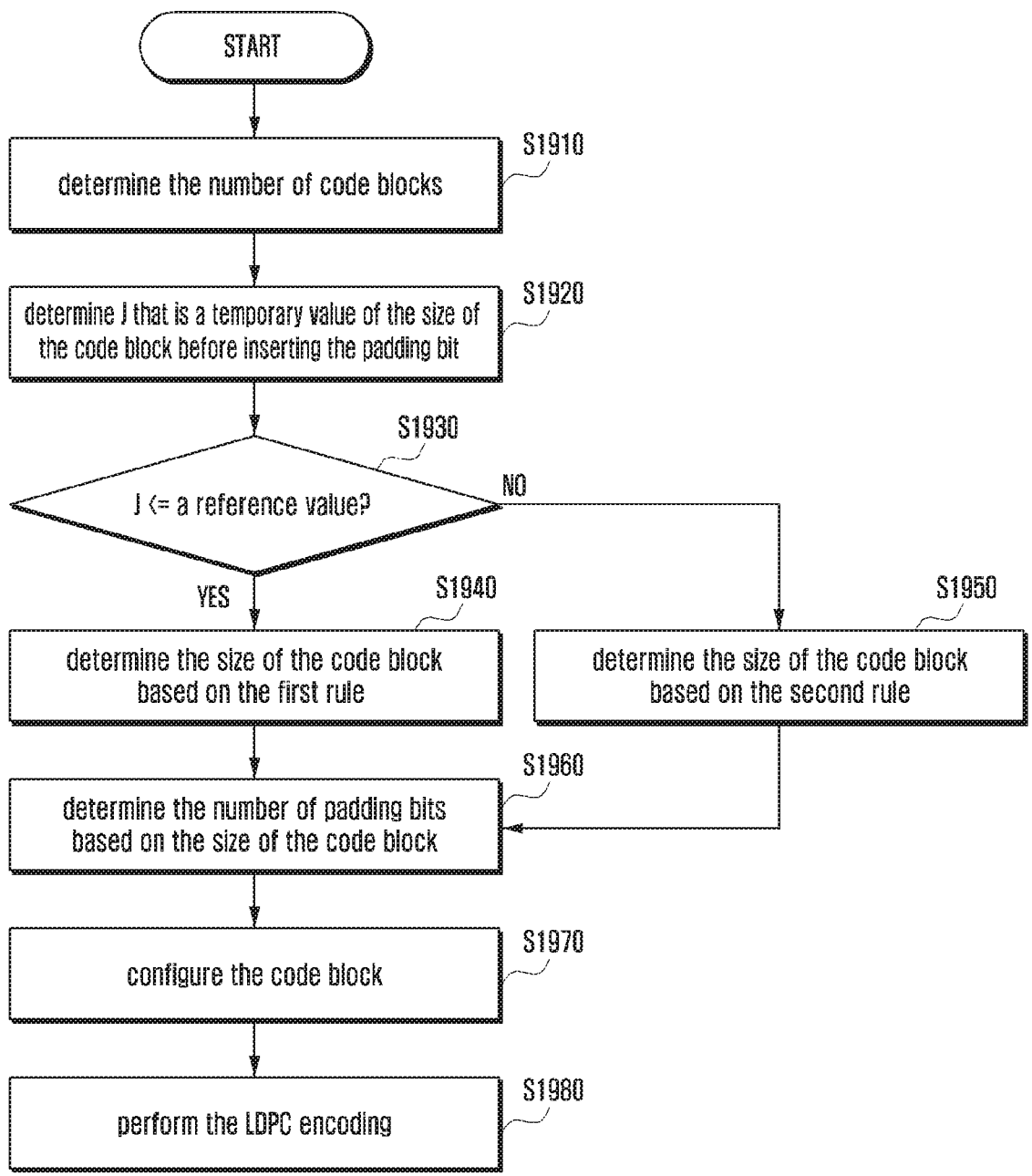
FIG. 19 is a diagram illustrating another process of segmentation according to an embodiment of the present disclosure.

FIG. 19 is a diagram illustrating another process of segmentation according to an embodiment of the present disclosure.

Unlike the foregoing, FIG. 19 describes a method for performing LDPC encoding depending on the range of the J value without determining whether the number of code blocks is larger than 1.

Referring to FIG. 19, the transmitting apparatus may determine the number of code blocks in operation S1910. As described above, the transmitting apparatus may determine the number of code blocks based on the number of input bits and the maximum number $K_{max}$ of LDPC input bits (or information bit).

Further, the transmitting apparatus may determine J that is a temporary value of the size of the code block before inserting the padding bit in operation S1920. In this case, when the number of code blocks is 1, the number of input bits may be J. The process of determining J is the same as the foregoing and will be omitted below.

Further, the transmitting apparatus may determine whether the J value is equal to or less than a reference value in operation S1930. At this time, the reference value may mean the second largest number of LDPC input bits.

If the J value is equal to or smaller than the reference value, the transmitting apparatus may determine the size of the code block based on the first rule in operation S1940.

At this time, the first rule may mean the method for determining a size of a code block using the Equation of $⌈J/(K_{min})⌉×K_{min}$.

On the other hand, if the J value is larger than the reference value, the transmitting apparatus may determine the size of the code block based on the second rule in operation S1950. At this point, the second rule means a method for setting $K_{max}$ to be a size of a code block.

In this case, the operations S1940 and S1950 may be replaced by a process of determining a parity-check matrix for applying LDPC encoding or an exponent matrix or a sequence corresponding thereto.

Describing the operations S1940 and S1950 by way of example, the number of LDPC codeword information bits is defined as $K_{min}$, $2*K_{min}$, $3*K_{min}$, $4*K_{min}$, $5*K_{min}$, and $7*K_{min}$ ($=K_{max}$), the reference value may be $5K_{min}$. Therefore, when the size of the input bit is $9K_{min}$, J is $4.5K_{min}$, and the J is smaller than $5K_{min}$ and therefore the transmitting apparatus may determine the size of the code block depending on the first rule. On the other hand, when the size of the input bit is $12K_{min}$, J is $6K_{min}$, and the J is smaller than $5K_{min}$ and therefore the transmitting apparatus may determine the size of the code block depending on the second rule.

Describing another example, the number of LDPC codeword information bits is defined as $K_{min}$, $2*K_{min}$, $3*K_{min}$, and $12*K_{min}$ ($=K_{max}$), the reference value may be $3K_{min}$. If the size of the input bit is $14K_{min}$, J is $7K_{min}$, and the J is larger than $3K_{min}$ and therefore the transmitting apparatus may determine the size of the code block depending on the second rule.

On the other hand, when the size of the input bit is $2.5K_{min}$, the number of code blocks is 1, and therefore J is $2.5K_{min}$ and the transmitting apparatus may determine the size of the code block depending on the first rule.

Next, the transmitting apparatus may determine the number of padding bits based on the size of the code block in operation S1960.

Further, the transmitting apparatus may configure the code block in the S1970 and perform the LDPC encoding in operation S1980. At this point, the transmitting apparatus may use the parity-check matrix determined based on the size of the code block to perform the LDPC encoding.

However, when the number of LDPC codeword information bits is increased at a predetermined interval, the operations S1930 and S1950 may be omitted.

Figure 20:
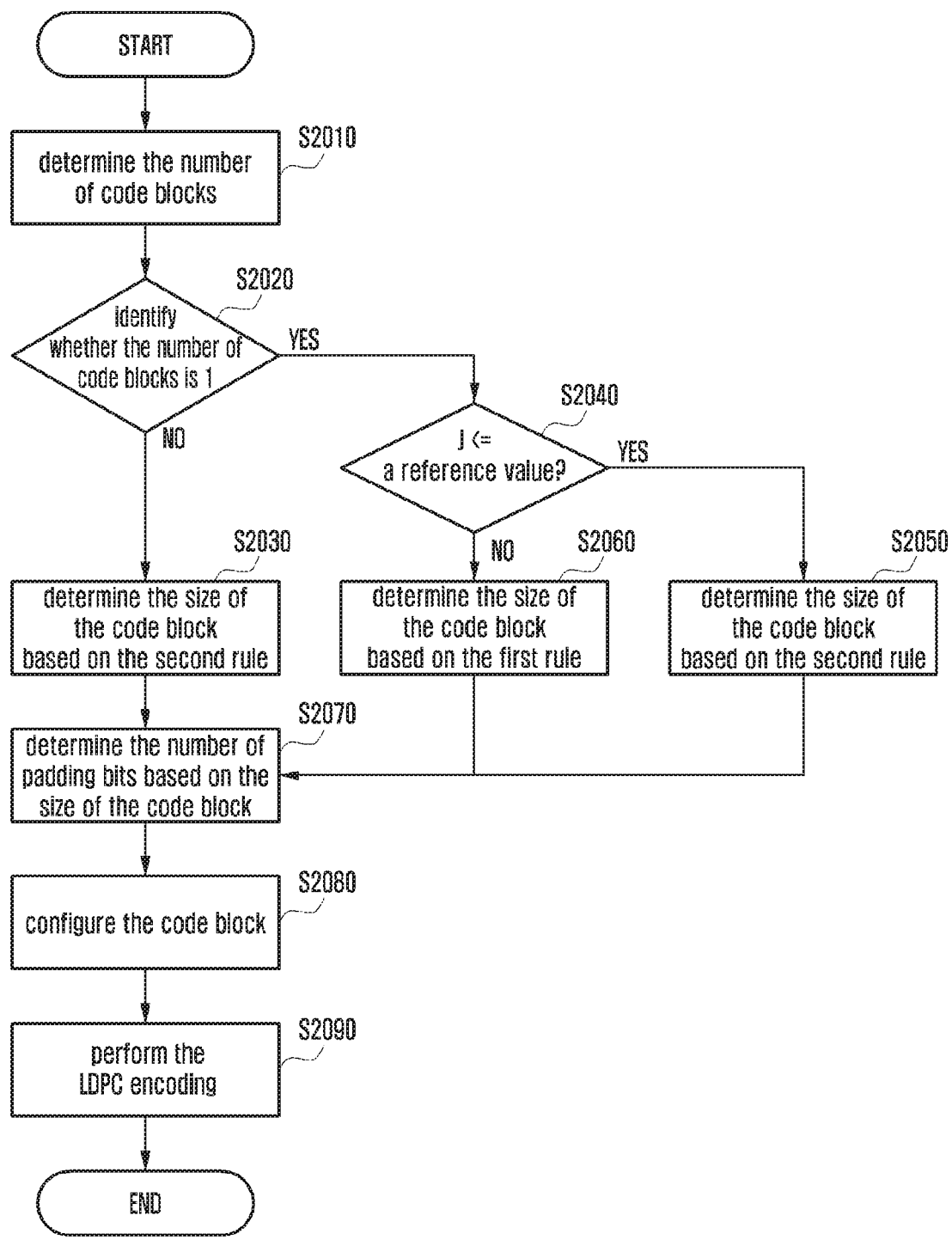
FIG. 20 is a diagram illustrating another process of segmentation according to an embodiment of the present disclosure.

FIG. 20 is a diagram illustrating another process of segmentation according to an embodiment of the present disclosure.

Unlike FIG. 19, in FIG. 20, it is determined whether the number of code blocks is larger than 1. However, the present method may be applied to the case in which K. is two times as large as the reference value. At this time, the reference value may mean the second largest number of LDPC input bits.

Referring to FIG. 20, the transmitting apparatus may determine the number of code blocks in operation S2010. As described above, the transmitting apparatus may determine the number of code blocks based on the number of input bits and the maximum number $K_{max}$ of LDPC input bits (or information bit).

Further, in operation S2020, the transmitting apparatus may identify whether the number of code blocks is 1.

At this point, when the number of code blocks is not 1, in operation S2030, the transmitting apparatus may determine the size of the code block based on the second rule. That is, the transmitting apparatus may determine $K_{max}$ as the size of the code block.

The reason is that when the $K_{max}$ is equal to or more than two times of the reference value and the number of code blocks is equal to or more than 2, there is no case in which the length of the code block is smaller than the reference value. For example, when the number of LDPC codeword information bits is set to be $K_{min}$, $2*K_{min}$, $3*K_{min}$, and $12*K_{min}$ ($=K_{max}$), to make the number of code blocks equal to or more than 2, the number of input bits needs to exceed $12K_{min}$. In this case, the J value exceeds $6K_{min}$, and therefore the size of the code block may also be determined as $K_{max}$.

On the other hand, when the number of code blocks is 1, in operation S2040, the transmitting apparatus may determine whether the J is equal to or less than the reference value. The J is a temporary value of the size of the code block before inserting the padding bit, and the number of code blocks is 1 and therefore the number of input bits may be J. The process of determining J is the same as the foregoing and will be omitted below.

If the J value is equal to or smaller than the reference value, the transmitting apparatus may determine the size of the code block based on the first rule in operation S2060.

At this time, the first rule may mean the method for determining a size of a code block using the Equation of $\lceil J/(K_{min})\rceil \times K_{min}$.

On the other hand, if the J value is larger than the reference value, the transmitting apparatus may determine the size of the code block based on the second rule in operation S2050. At this point, the second rule means a method for setting $K_{max}$ to be a size of a code block.

In this case, the operations S2030, S2050, and S2060 may be replaced by a process of determining a parity-check matrix for applying LDPC encoding or an exponent matrix or a sequence corresponding thereto.

Describing the operations S2050 and S2060 another example, the number of LDPC codeword information bits is defined as $K_{min}$, $2*K_{min}$, $3*K_{min}$, and $12*K_{min}$ ($=K_{max}$), the reference value may be $3K_{min}$. If the size of the input bit is $6K_{min}$, J is $6K_{min}$, and the J is larger than $3K_{min}$ and therefore the transmitting apparatus may determine the size of the code block as $12K_{min}$ depending on the second rule. On the other hand, when the size of the input bit is $2.5K_{min}$, J is $2.5K_{min}$ and the transmitting apparatus may determine the size of the code block as $3K_{min}$ depending on the first rule.

Next, the transmitting apparatus may determine the number of padding bits based on the size of the code block in operation S2070.

Further, the transmitting apparatus may configure the code block in the S2080 and perform the LDPC encoding in operation S2090. At this point, the transmitting apparatus may use the parity-check matrix determined based on the size of the code block to perform the LDPC encoding.

The decoding process may be implemented by an inverse process to the encoding process. For example, first, the receiving apparatus determines the size of the input bit before the segmentation is applied from the signal received by the receiver. The non-segmented input bits are applied depending on the system are named a transport block (or transmission block). Next, the receiving apparatus may determine the size of the code block. At this point, the receiving apparatus may determine the size of the code block based on the maximum number $K_{min}$ of input bits (or information bits) that may perform the encoding using the smallest parity-check matrix given in the system.

Further, the receiving apparatus determines the number of padding (shortening) bits based on the size of the code block. The parity-check matrix for performing the LDPC encoding may also be determined based on the size of the code block but may also be determined based on the size of the transport block. That is, the parity-check matrix to be used may be defined depending on the size of the input bit before the segmentation is applied and the parity-check matrix may be determined based on the size of the input bit before the segmentation is applied.

Further, generally, the received signal includes MCS information for transmission and given system resource size information, and therefore the parity-check matrix may also be determined even based on the system resource size information.

If the parity-check matrix is determined, the padding (or shortening) is applied as many as the determined number of padding (or shortening) bits to determine the code block for performing the LDPC decoding and a total number of encoding bits for transmitting one code block is determined based on the MCS information and/or the system resource size information and the determined size of the code block to perform the decoding.

Meanwhile, the parity-check matrix proposed in the present disclosure may be represented by other matrices or sequences that mathematically derive the same result. That is, the matrix or the sequence changed by the operation using the characteristics of the matrix in the parity-check matrix proposed in the present disclosure may be determined as the same as the matrix proposed in the present disclosure. The input bits of the rate matcher 440 is $C=(i_0, i_1, i_2, \ldots, i_{Kldpcp-1}, p_0, p_1, p_2, \ldots, p_{Nldpc-Kldpc-1})$ as the output bits of the LDPC encoder 430. And $i_k$ ($0 \le k < K_{ldpc}$) means the input bits of the LDPC encoder 430 and $p_k$ ($0 \le k < N_{ldpc}-K_{ldpc}$) means the LDPC parity bits. The rate matcher 440 includes an interleaver 441 and a puncturing/repetition/zero remover 442.

The modulator 450 modulates a bit string output from the rate matcher 440 and transmits the modulated bit string to a receiving apparatus (for example, 500 of FIG. 5).

In detail, the modulator 450 may demultiplex bits output from the rate matcher 440 and map the demultiplexed bits to constellation.

That is, the modulator 450 may perform a serial-to-parallel conversion on bits output from the rate matcher 440 and generate a cell consisting of a predetermined number of bits. Here, the number of bits configuring each cell may be equal to the number of bits configuring the modulation symbols mapped to the constellation.

Next, the modulator 450 may map the demultiplexed bits to the constellation. That is, the modulator 450 may modulate the demultiplexed bits by various modulation schemes such as quadrature phase shift keying (QPSK), 16-quadrature amplitude modulation (QAM), 64-QAM, 256-QAM, 1024-QAM to generate a modulation symbols and 4096-QAM and map the generated modulation symbols to constellation points. In this case, the demultiplexed bits configure the cell including the bit corresponding to the number of modulation symbols, and therefore each cell may be sequentially mapped to the constellation points.

Further, the modulator 450 may modulate the signal mapped to the constellation and transmit the modulated signal to the receiving apparatus 500. For example, the modulator 450 may map the signal mapped to the constellation to an orthogonal frequency division multiplexing (OFDM) frame using an OFDM scheme and transmit the mapped signal to the receiving apparatus 500 through an allocated channel.

Meanwhile, the transmitting apparatus 400 may previously store various parameters used for encoding, interleaving, and modulation. Here, the parameters used for the encoding may be information on the code rate of the LDPC code, the codeword length, and the parity-check matrix. Further, the parameters used for the interleaving may be the information on the interleaving rule and the parameters for the modulation may be the information on the modulation scheme. Further, the information on the puncturing may be a puncturing length. Further, the information on the repetition may be a repetition length. The information on the parity-check matrix may store the exponential value of the circulant matrix depending on the above Equations, Equation 3 and Equation 4, when the parity matrix proposed in the present disclosure is used.

In this case, each component configuring the transmitting apparatus 400 may perform the operations using the parameters.

Meanwhile, although not illustrated, in some cases, the transmitting apparatus 400 may further include a controller (at least one processor) (not illustrated) for controlling the operation of the transmitting apparatus 400.

FIG. 8 is a block diagram illustrating a configuration of an encoding apparatus according to an embodiment of the present disclosure. In this case, an encoding apparatus 800 may perform the LDPC encoding.

Referring to FIG. 8, the encoding apparatus 800 includes an LDPC encoder 810. The LDPC encoder 810 may perform the LDPC encoding on the input bits based on the parity-check matrix to generate the LDPC codeword.

$K_{ldpc}$ bits may form $K_{ldpc}$ LDPC information word bits) for the LDPC encoder 810. The LDPC encoder 810 may systematically perform the LDPC encoding on the $K_{ldpc}$ LDPC information word bits to generate the LDPC codeword $\Lambda=(c_0, c_1, \ldots, c_{N_{ldpc}-1})=(i_0, i_1, i_{K_{ldpc}-1}, p_0, p_1, \ldots, p_{N_{ldpc}-K_{ldpc}-1})$ consisting of the $N_{ldpc}$ bits. The generation process includes the process of determining a codeword so that as represented by the above Equation 1, the product of the LDPC codeword by the parity-check matrix is a zero vector. The parity-check matrix of the present disclosure may have the same structure as the parity-check matrix defined in FIG. 3.

In this case, the LDPC encoder 810 may use the parity-check matrix differently defined depending on the code rate (that is, code rate of the LDPC code) to perform the LDPC encoding.

For example, the LDPC encoder 810 may perform the LDPC encoding using the parity-check matrix defined by the exponent matrix as shown in the above Table 1 when the code rate is 8/9 and may perform the LDPC encoding using the parity-check matrix defined by the exponent matrix as shown in the above Table 2 when the code rate is 2/3. Further, the LDPC encoder 810 may perform the LDPC encoding using the parity-check matrix defined by the exponent matrix table like the above Table 3 when the code rate is 4/9.

Meanwhile, the detailed method for performing LDPC encoding is already described, and therefore the detailed overlapping description will be omitted.

Meanwhile, the encoding apparatus 800 may further include a memory (not illustrated) for pre-storing the information on the code rate of the LDPC code, the codeword length, and the parity-check matrix and the LDPC encoder 810 may use the information to perform the LDPC encoding. The information on the parity-check matrix may store the information on the exponent value of the circulant matrix when the parity matrix proposed in the present disclosure is used.

Hereinafter, the operation of the receiver will be described in detail with reference to FIG. 5.

A demodulator 510 demodulates the signal received from the transmitting apparatus 400.

In detail, the demodulator 510 is a component corresponding to the modulator 400 of the transmitting apparatus 400 of FIG. 4 and may demodulate the signal received from the transmitting apparatus 400 and generate values corresponding to the bits transmitted from the transmitting apparatus 400.

For this purpose, the receiving apparatus 500 may pre-store the information on the modulation scheme modulating the signal according to a mode in the transmitting apparatus 400. Therefore, the demodulator 510 may demodulate the signal received from the transmitting apparatus 400 according to the mode to generate the values corresponding to the LDPC codeword bits.

Meanwhile, the values corresponding to the bits transmitted from the transmitting apparatus 400 may be a log likelihood ratio (LLR) value. In detail, the LLR value may be represented by a value obtained by applying Log to a ratio of the probability that the bit transmitted from the transmitting apparatus 300 is 0 and the probability that the bit transmitted from the transmitting apparatus 300 is 1. Alternatively, the LLR value may be the bit value itself and the LLR value may be a representative value determined depending on a section to which the probability that the bit transmitted from the transmitting apparatus 300 is 0 and the probability that the bit transmitted from the transmitting apparatus 300 is 1 belongs.

Referring to FIG. 5, the demodulator 510 includes the process of performing multiplexing (not illustrated) on an LLR value. In detail, the demodulator 510 is a component corresponding to a bit demultiplexer (not illustrated) of the transmitting apparatus 400 and may perform the operation corresponding to the bit demultiplexer (not illustrated).

For this purpose, the receiving apparatus 500 may pre-store the information on the parameters used for the transmitting apparatus 400 to perform the demultiplexing and the block interleaving. Therefore, the multiplexer (not illustrated) may reversely perform the operations of the demultiplexing and the block interleaving performed by the bit demultiplexer (not illustrated) on the LLR value corresponding to the cell word to multiplex the LLR value corresponding to the cell word in a bit unit.

The rate de-matcher 520 may insert the LLR value into the LLR value output from the demodulator 510. In this case, the rate de-matcher 520 may insert previously promised LLR values between the LLR values output from the demodulator 510.

In detail, the rate de-matcher 520 is a component corresponding to the rate matcher 440 of the transmitting apparatus 400 (illustrated in FIG. 4) and may perform operations corresponding to the interleaver 441 and the zero removing and puncturing/repetition/zero remover 442.

First, the rate de-matcher 520 performs deinterleaving 521 to correspond to the interleaver 441 of the transmitter. The output values of the deinterleaving 521 may insert the LLR values corresponding to the zero bits into the location where the zero bits in the LDPC codeword are padded. In this case, the LLR values corresponding to the padded zero bits, that is, the shortened zero bits may be ∞ or −∞. However, ∞ or −∞ are a theoretical value but may actually be a maximum value or a minimum value of the LLR value used in the receiving apparatus 500.

For this purpose, the receiving apparatus 500 may pre-store the information on the parameters used for the transmitting apparatus 400 to pad the zero bits. Therefore, the rate de-matcher 520 may determine the locations where the zero bits in the LDPC codeword are padded and insert the LLR values corresponding to the shortened zero bits into the corresponding locations.

Further, the LLR inserter 520 of the rate de-matcher 520 may insert the LLR values corresponding to the punctured bits into the locations of the punctured bits in the LDPC codeword. In this case, the LLR values corresponding to the punctured bits may be 0.

For this purpose, the receiving apparatus 500 may pre-store the information on the parameters used for the transmitting apparatus 400 to perform the puncturing. Therefore, the LLR inserter 522 may insert the LLR value corresponding thereto into the locations where the LDPC parity bits are punctured.

The LLR combiner 523 may combine, that is, sum the LLR values output from the LLR inserter 522 and the demultiplexer 510. In detail, the LLR combiner 523 is a component corresponding to the puncturing/repetition/zero remover 442 of the transmitting apparatus 400 and may perform the operation corresponding to the repeater or the puncturing/repetition/zero remover 442. First, the LLR combiner 523 may combine the LLR values corresponding to the repeated bits with other LLR values. Here, the other LLR values may be bits which are a basis of the generation of the repeated bits by the transmitting apparatus 400, that is, the LLR values for the LDPC parity bits selected as the repeated object.

That is, as described above, the transmitting apparatus 400 selects bits from the LDPC parity bits and repeats the selected bits between the LDPC information bits and the LDPC parity bits and transmits the repeated bits to the receiving apparatus 500.

As a result, the LLR values for the LDPC parity bits may consist of the LLR values for the repeated LDPC parity bits and the LLR values for the non-repeated LDPC parity bits, that is, the LDPC parity bits generated by the encoding. Therefore, the LLR combiners 523 and 2640 may combine the LLR values with the same LDPC parity bits.

For this purpose, the receiving apparatus 500 may pre-store the information on the parameters used for the transmitting apparatus 400 to perform the repetition. Therefore, the LLR combiner 523 may determine the LLR values for the repeated LDPC parity bits and combine the determined LLR values with the LLR values for the LDPC parity bits that are a basis of the repetition.

Further, the LLR combiner 523 may combine LLR values corresponding to retransmitted or incremental redundancy (IR) bits with other LLR values. Here, the other LLR values may be the LLR values for the bits selected to generate the LDPC codeword bits which are a basis of the generation of the retransmitted or IR bits in the transmitting apparatus 400.

That is, as described above, when negative acknowledgement (NACK) is generated for the HARQ, the transmitting apparatus 400 may transmit some or all of the codeword bits to the receiving apparatus 500.

Therefore, the LLR combiner 523 may combine the LLR values for the bits received through the retransmission or the IR with the LLR values for the LDPC codeword bits received through the previous frame.

For this purpose, the receiving apparatus 500 may pre-store the information on the parameters used for the transmitting apparatus to generate the retransmitted or IR bits. As a result, the LLR combiner 523 may determine the LLR values for the number of retransmitted or IR bits and combine the determined LLR values with the LLR values for the LDPC parity bits that are a basis of the generation of the retransmitted bits.

The deinterleaver 524 may deinterleave the LLR value output from the LLR combiner 523.

In detail, the deinterleaver 524 is a component corresponding to the interleaver 441 of the transmitting apparatus 400 and may perform the operation corresponding to the interleaver 441.

For this purpose, the receiving apparatus 500 may pre-store the information on the parameters used for the transmitting apparatus 400 to perform the interleaving. As a result, the deinterleaver 524 may reversely perform the interleaving operation performed by the interleaver 441 on the LLR values corresponding to the LDPC codeword bits to deinterleave the LLR values corresponding to the LDPC codeword bits.

The LDPC decoder 530 may perform the LDPC decoding based on the LLR value output from the rate de-matcher 520.

In detail, referring to FIGS. 4 and 5, the LDPC decoder 530 is components corresponding to the LDPC encoder 430 of the transmitting apparatus 400 and may perform the operation corresponding to the LDPC encoder 430.

For this purpose, the receiving apparatus 500 may pre-store information on parameters used for the transmitting apparatus 400 to perform the LDPC encoding according to the mode. As a result, the LDPC decoder 530 may perform the LDPC decoding based on the LLR value output from the rate de-matcher 520 according to the mode.

For example, the LDPC decoder 530 may perform the LDPC decoding based on the LLR value output from the rate de-matcher 520 based on the iterative decoding scheme based on the sum-product algorithm and output the error-corrected bits depending on the LDPC decoding.

The zero remover 540 may remove the zero bits from bits output from the LDPC decoders 2460 and 2560.

In detail, the zero remover 540 is a component corresponding to the zero padder 420 of the transmitting apparatus 400 and may perform the operation corresponding to the zero padder 420.

For this purpose, the receiving apparatus 500 may pre-store the information on the parameters used for the transmitting apparatus 400 to pad the zero bits. As a result, the zero remover 540 may remove the zero bits padded by the zero padder 420 from the bits output from the LDPC decoder 530.

The de-segmentator 550 is a component corresponding to the segmentator 410 of the transmitting apparatus 400 and may perform the operation corresponding to the segmentator 410.

For this purpose, the receiving apparatus 500 may pre-store the information on the parameters used for the transmitting apparatus 400 to perform the segmentation. As a result, the de-segmentator 550 may combine the bits output from the zero remover 540, that is, the segments for the variable length input bits to recover the bits before the segmentation.

Figure 9:
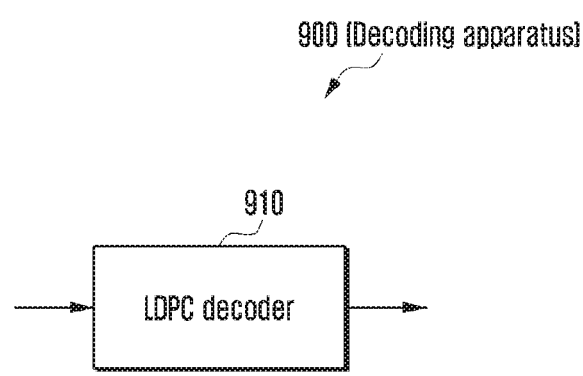
FIG. 9 is a structure diagram of an LDPC decoder according to an embodiment of the present disclosure.

FIG. 9 is a block diagram illustrating a configuration of a decoding apparatus according to an embodiment of the present disclosure. Referring to FIG. 9, a decoding apparatus 900 may include an LDPC decoder 910. Meanwhile, the decoding apparatus 900 may further include a memory (not illustrated) for pre-storing the information on the code rate of the LDPC code, the codeword length, and the parity-check matrix and the LDPC decoder 910 may use the information to perform the LDPC encoding. However, this is only an example, and the corresponding information may also be provided from the transmitting apparatus.

The LDPC decoder 910 performs the LDPC decoding on the LDPC codeword based on the parity-check matrix.

For example, the LDPC decoder 910 may pass the LLR value corresponding to the LDPC codeword bits using the iterative decoding algorithm to perform the LDPC decoding, thereby generating the information word bits.

Here, the LLR value is channel values corresponding to the LDPC codeword bits and may be represented by various methods.

For example, the LLR value may be represented by a value obtained by applying Log to a ratio of the probability that the bit transmitted from the transmitting side through the channel is 0 and the probability that the bit transmitted from the transmitting side through the channel is 1. Further, the LLR value may be the bit value itself determined depending on the soft decision and the LLR value may be a representative value determined depending on a section to which the probability that the bit transmitted from the transmitting side is 0 or 1 belongs.

In this case, as illustrated in FIG. 8, the transmitting side may use the LDPC encoder 810 to generate the LDPC codeword.

Meanwhile, the parity-check matrix used at the time of the LDPC decoding may have the same form as the parity-check matrix illustrated in FIG. 3.

In this case, referring to FIG. 9, the LDPC decoder 910 may use the parity-check matrix differently defined depending on the code rate (that is, code rate of the LDPC code) to perform the LDPC decoding.

For example, the LDPC decoder 910 may perform the LDPC decoding using the parity-check matrix defined by the table like the above Table 1 when the code rate is 8/9 and may perform the LDPC decoding using the parity-check matrix defined by the table like the above Table 2 when the code rate is 2/3. Further, the LDPC decoder 910 may perform the LDPC decoding using the parity-check matrix defined by the table like the above Table 3 when the code rate is 4/9.

Figure 10:
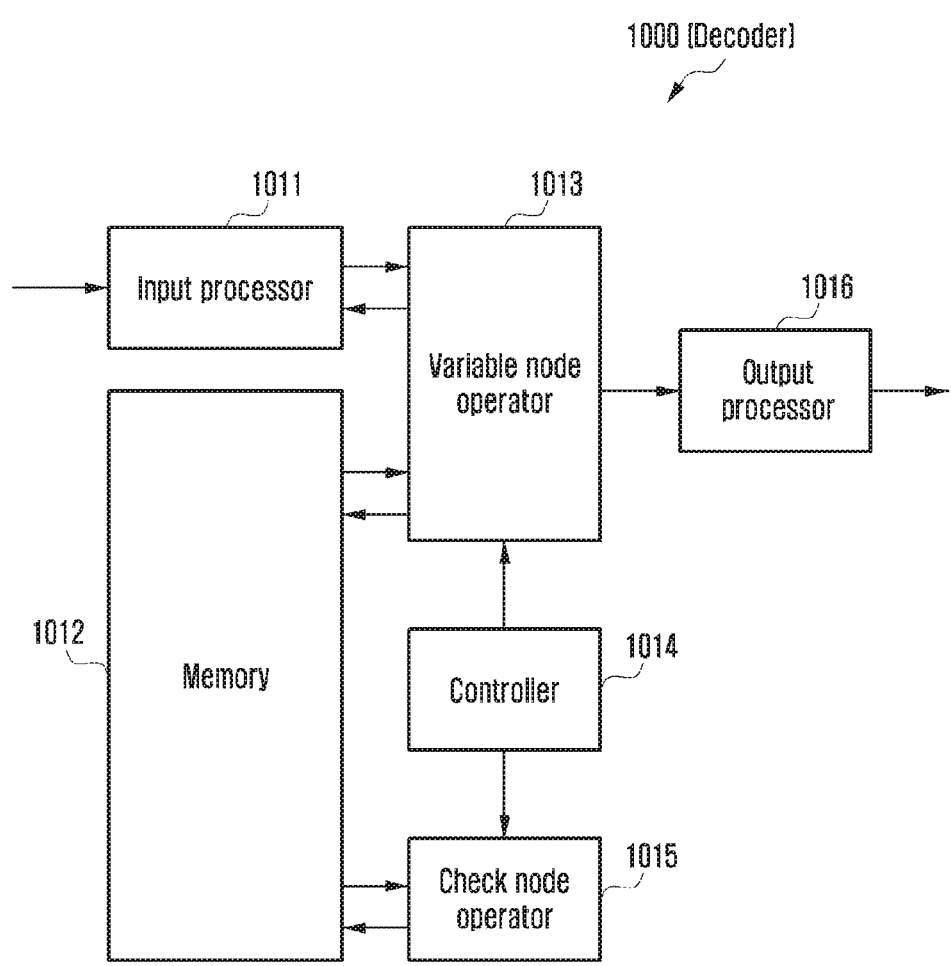
FIG. 10 is a structure diagram of an LDPC decoder according to another embodiment of the present disclosure.
Figure 12B:
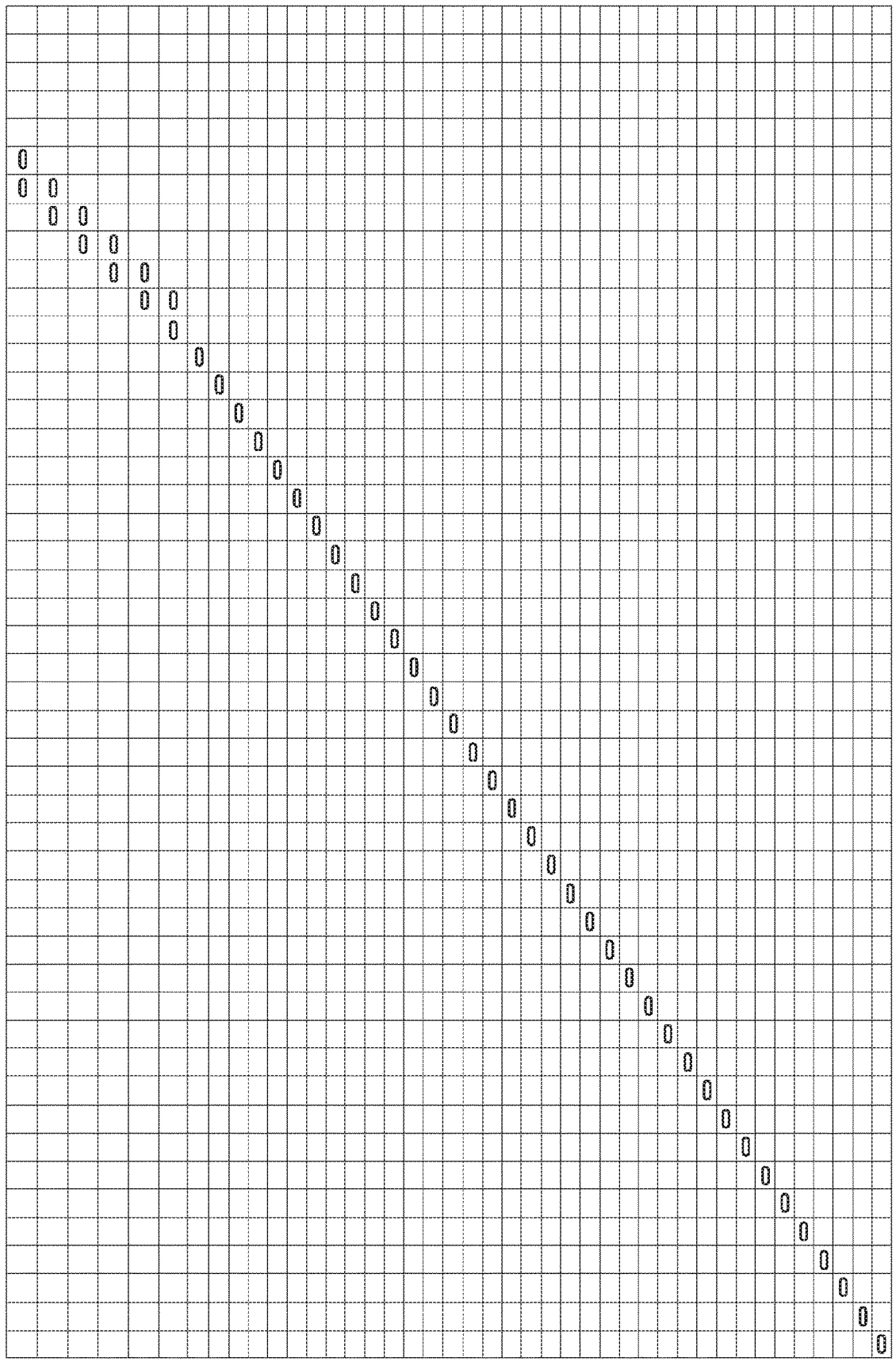
Figure 15B:
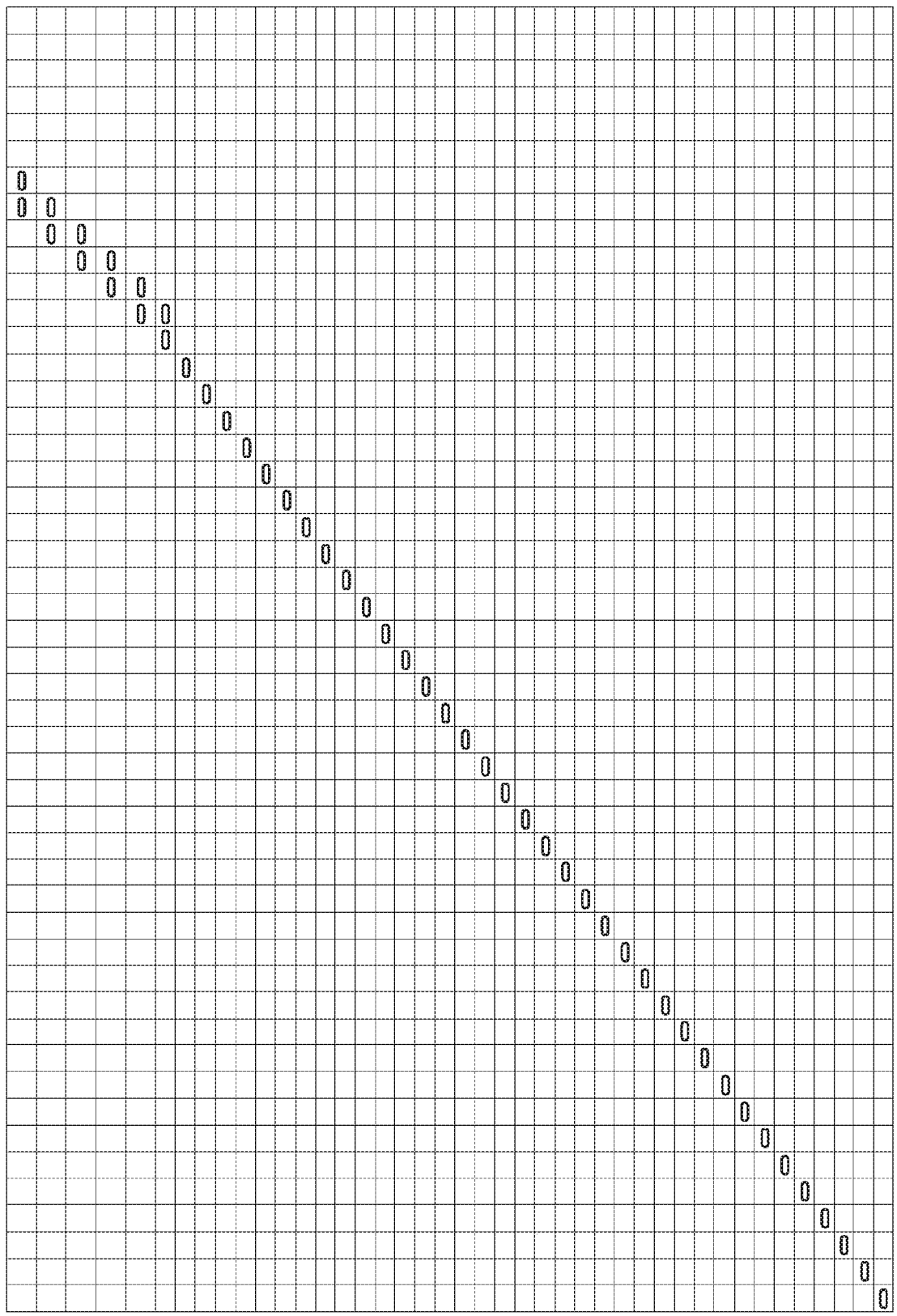

FIG. 10 illustrates a structure diagram of an LDPC decoder according to another embodiment of the present disclosure.

Meanwhile, as described above, the LDPC decoder 910 may use the iterative decoding algorithm to perform the LDPC decoding. In this case, the LDPC decoder 910 may configured to have the structure as illustrated in FIG. 10. However, the iterative decoding algorithm is already known and therefore the detailed configuration illustrated in FIG. 10 is only an example.

Referring to FIG. 10, a decoding apparatus 1000 includes an input processor 1011, a memory 1012, a variable node operator 1013, a controller 1014 (at least one processor), a check node operator 1015, and an output processor 1016.

The input processor 1011 stores the input value. In detail, the input processor 1011 may store the LLR value of the signal received through a radio channel.

The controller 1014 determines the block size (that is, codeword length) of the signal received through the radio channel, the number of values input to the variable node operator 1013 and address values in the memory 1012 based on the parity-check matrix corresponding to the code rate, the number of values input to the check node operation 1015 and the address values in the memory 1012, or the like.

According to the embodiment of the present disclosure, the decoding may be performed based on the parity-check matrix that is determined by the exponential matrices like the above Tables 1 to 3 corresponding to the index of the row where 1 is located in a 0-th column of an i-th column group.

The memory 1012 stores the input data and the output data of the variable node operator 1013 and the check node operator 1015.

The variable node operator 1013 receives data from the memory 1012 depending on the information on the addresses of input data and the information on the number of input data that are received from the controller 1014 to perform the variable node operation. Next, the variable node operator 1013 stores the results of the variable node operation based on the information on the addresses of output data and the information on the number of output data, which are received from the controller 1014, in the memory 1012 Further, the variable node operator 1013 inputs the results of the variable node operation based on the data received from the input processor 1011 and the memory 1012 to the output processor 1016. Here, the variable node operation is already described with reference to FIG. 8.

The check node operator 1015 receives the data from the memory 1012 based on the information on the addresses of the input data and the information on the number of input data that are received from the controller 1014, thereby performing the variable node operation. Next, the check node operator 1015 stores the results of the variable node operation based on the information on the addresses of output data and the information on the number of output data, which are received from the controller 1014, in the memory 1012 Here, the check node operation is already described with reference to FIG. 6.

The output processor 1016 performs the soft decision on whether the information word bits of the transmitting side are 0 or 1 based on the data received from the variable node operator 1013 and then outputs the results of the soft decision, such that the output value of the output processor 1016 is finally the decoded value. In this case, in FIG. 6, the soft decision may be performed based on a summed value of all the message values (initial message value and all the message values input from the check node) input to one variable node.

According to the embodiments of the present disclosure, it is possible to support the LDPC code that may be applied to the variable length and the variable rate.

While the present disclosure has been shown and described with reference to various embodiments thereof it will be understood by those skilled in the art that various changes in form and details may be made therein without departing from the spirit and scope of the present disclosure is defined by the appended claims and their equivalents.

What is claimed is:

1. A method of channel coding performed by a device in a communication system, the method comprising:

segmenting input bits into a plurality of blocks in case that a size (B) of the input bits is larger than a first predetermined size (Kmax) corresponding to a code rate;
determining a number of code blocks based on the size (B) of the input bits and the first predetermined size (Kmax),
determining a code block by inserting filler bits to a segmented block of the input bits; and
encoding the code block including the segmented block of the input bits and the filler bits using a low-density parity-check (LDPC) code,
wherein a total number of filler bits is determined based on the size (B) of the input bits, the number of code blocks, and a second predetermined size (Kmin), and
wherein the filler bits included in the code block are determined based on the total number of filler bits and the number of code blocks.

2. The method of claim 1,
wherein a size (Kr) of the code block is determined based on the size (B) of the input bits, the number of the code blocks, and a number of the filler bits,
wherein the LDPC code is determined based on a parity-check matrix having N_ldpc_b column blocks and (N_ldpc_b−K_ldpc_b) row blocks,
wherein the N_ldpc_b has a constant number regardless of code rates, and
wherein the K_ldpc_b has different values based on code rates.

3. The method of claim 2,
wherein the N_ldpc_b is fixed by 24 regardless of code rates,
wherein K_ldpc_b has a value of 20 for code rate 5/6, a value of 18 for code rate 3/4, a value of 16 for code rate 2/3, and a value of 12 for code rate 1/2,
wherein the column blocks and the row blocks consist of circulant permutation matrices having a size of Z×Z,
wherein Z is determined based on the size (Kr) of the code block and the second predetermined size (Kmin), and
wherein Z is determined based on Z=ceil(Kr/Kmin)×27.

4. The method of claim 1, wherein the first predetermined size (Kmax) and the second predetermined size (Kmin) have the values of (Kmax=1620, Kmin=540) for code rate 5/6, (Kmax=1458, Kmin=486) for code rate 3/4, (Kmax=1296, Kmin=432) for code rate 2/3, and (Kmax=972, Kmin=324) for code rate 5/6.

5. A method of channel decoding performed by a device in a communication system, the method comprising:
receiving a signal;
determining a size (B) of input bits before segmentation from the received signal;
determining a number of code blocks based on the size (B) of the input bits and a first predetermined size (Kmax) corresponding to a code rate; and
decoding a code block including a segmented block of the input bits and filler bits using a low-density parity-check (LDPC) code,
wherein a total number of filler bits is determined based on the size (B) of the input bits, the number of code blocks, and a second predetermined size (Kmin), and
wherein the filler bits included in the code block are determined based on the total number of filler bits and the number of code blocks.

6. The method of claim 5,
wherein a size (Kr) of the code block is determined based on the size (B) of the input bits, the number of the code blocks, and a number of the filler bits,
wherein the LDPC code is determined based on a parity-check matrix having N_ldpc_b column blocks and (N_ldpc_b−K_ldpc_b) row blocks,
wherein the N_ldpc_b has a constant number regardless of code rates, and
wherein the K_ldpc_b has different values based on code rates.

7. The method of claim 6,
wherein the N_ldpc_b is fixed by 24 regardless of code rates,
wherein K_ldpc_b has a value of 20 for code rate 5/6, a value of 18 for code rate 3/4, a value of 16 for code rate 2/3, and a value of 12 for code rate 1/2,
wherein the column blocks and the row blocks consist of circulant permutation matrices having a size of Z×Z,
wherein Z is determined based on the size (Kr) of the code block and the second predetermined size (Kmin), and
wherein Z is determined based on Z=ceil(Kr/Kmin)×27.

8. The method of claim 5, wherein the first predetermined size (Kmax) and the second predetermined size (Kmin) have the values of (Kmax=1620, Kmin=540) for code rate 5/6, (Kmax=1458, Kmin=486) for code rate 3/4, (Kmax=1296, Kmin=432) for code rate 2/3, and (Kmax=972, Kmin=324) for code rate 5/6.

9. A device for channel coding in a communication system, the device comprising:
a transceiver; and
a controller coupled with the transceiver and configured to:
  segment input bits into a plurality of blocks in case that a size (B) of the input bits is larger than a first predetermined size (Kmax) corresponding to a code rate,
  determine a number of code blocks based on the size (B) of the input bits and the first predetermined size (Kmax),
  determine a code block by inserting filler bits to a segmented block of the input bits, and
  encode the code block including the segmented block of the input bits and the filler bits using a low-density parity-check (LDPC) code,
wherein a total number of filler bits is determined based on the size (B) of the input bits, the number of code blocks, and a second predetermined size (Kmin), and
wherein the filler bits included in the code block are determined based on the total number of filler bits and the number of code blocks.

10. The device of claim 9,
wherein a size (Kr) of the code block is determined based on the size (B) of the input bits, the number of the code blocks, and a number of the filler bits,
wherein the LDPC code is determined based on a parity-check matrix having N_ldpc_b column blocks and (N_ldpc_b−K_ldpc_b) row blocks,
wherein the N_ldpc_b has a constant number regardless of code rates, and
wherein the K_ldpc_b has different values based on code rates.

11. The device of claim 10,
wherein the N_ldpc_b is fixed by 24 regardless of code rates,
wherein K_ldpc_b has a value of 20 for code rate 5/6, a value of 18 for code rate 3/4, a value of 16 for code rate 2/3, and a value of 12 for code rate 1/2,
wherein the column blocks and the row blocks consist of circulant permutation matrices having a size of Z×Z, wherein Z is determined based on the size (Kr) of the code block and the second predetermined size (Kmin), and wherein Z is determined based on Z=ceil(Kr/Kmin)×27.

12. The device of claim 9, wherein the first predetermined size (Kmax) and the second predetermined size (Kmin) have the values of (Kmax=1620, Kmin=540) for code rate 5/6, (Kmax=1458, Kmin=486) for code rate 3/4, (Kmax=1296, Kmin=432) for code rate 2/3, and (Kmax=972, Kmin=324) for code rate 5/6.

13. A device for channel decoding in a communication system, the device comprising:
  a transceiver; and
  a controller coupled with the transceiver and configured to:
    receive a signal,
    determine a size (B) of input bits before segmentation from the received signal,
    determine a number of code blocks based on the size (B) of the input bits and a first predetermined size (Kmax) corresponding to a code rate, and
    decode a code block including a segmented block of the input bits and filler bits using a low-density parity-check (LDPC) code,
  wherein a total number of filler bits is determined based on the size (B) of the input bits, the number of code blocks, and a second predetermined size (Kmin), and
  wherein the filler bits included in the code block are determined based on the total number of filler bits and the number of code blocks.

14. The device of claim 13,
  wherein a size (Kr) of the code block is determined based on the size (B) of the input bits, the number of the code blocks, and a number of the filler bits,
  wherein the LDPC code is determined based on a parity-check matrix having N_ldpc_b column blocks and (N_ldpc_b−K_ldpc_b) row blocks,
  wherein the N_ldpc_b has a constant number regardless of code rates, and
  wherein the K_ldpc_b has different values based on code rates.

15. The device of claim 14,
  wherein the N_ldpc_b is fixed by 24 regardless of code rates,
  wherein K_ldpc_b has a value of 20 for code rate 5/6, a value of 18 for code rate 3/4, a value of 16 for code rate 2/3, and a value of 12 for code rate 1/2,
  wherein the column blocks and the row blocks consist of circulant permutation matrices having a size of Z×Z,
  wherein Z is determined based on the size (Kr) of the code block and the second predetermined size (Kmin), and
  wherein Z is determined based on Z=ceil(Kr/Kmin)×27.

16. The device of claim 13, wherein the first predetermined size (Kmax) and the second predetermined size (Kmin) have the values of (Kmax=1620, Kmin=540) for code rate 5/6, (Kmax=1458, Kmin=486) for code rate 3/4, (Kmax=1296, Kmin=432) for code rate 2/3, and (Kmax=972, Kmin=324) for code rate 5/6.

17. A method for a channel decoding performed by an apparatus in a communication system, the method comprising:
  receiving, using a transceiver of the apparatus, a signal;
  determining, using at least one processor of the apparatus, a size of an input bit before segmentation from the received signal;
  determining, using the at least one processor of the apparatus, a number of code blocks based on the size of the input bit and a maximum number of information bits corresponding to a largest parity-check matrix;
  determining, using the at least one processor of the apparatus, a size of a code block based on the number of code blocks;
  determining, using the at least one processor of the apparatus, a parity-check matrix based on the size of the code block; and
  decoding, using a decoder of the apparatus, the input bits based on the parity-check matrix.

18. The method of claim 17,
  wherein the size of the code block is determined based on the maximum number of information bits corresponding to a smallest parity-check matrix when the number of code blocks is 1,
  wherein the parity-check matrix is determined as a following matrix, and the following matrix indicates a location of 1 in a parity-check matrix, and
  wherein the following matrix indicates a matrix in which A and A' are concatenated and B and B' are concatenated:

```
                                                                                                A
54 19 24 68 12  2 18 16 13 46 66 52 21  9        80 24        3 11  1  0
10 76 29 30  8 28 16 35 62 53 57 53 15 38 72 73     45 38 71        0  0
70 71 31 35 20 21  6 56 36 52 22 37 50 27 58 16 56 41                 0     0  0
41 24 25 49 28  6 28 60 22 70 11 27  1          67    22 78 76  5  1        0
27 70 45 45 28  9 29 30 39 29 56 80 29
   77  8 69 49 68 78    66  8  6 79 40
74 37 24 41  6 16 74 27 44 57 63 42 12             56
 9 20    25                18  3 59
         79     5 78     1              22                                  27
24 47           67 30              43       18        42
                78        58 51 70    35                                    64
          0     78    39     66 38           4                 63
         45     3                    12 11 38        80
         62    57 12       26                              27 35
29              34          23    51  3
         48                 44       54                 71 61
                 7    33       28              2
48       11                    64 42                    73              77 37
                73                   40 56                                  65
         51           12          40                           41
               53  5          77         32 68 52     11 57 39       29
                                 66                                  60
               22                 9                28
```

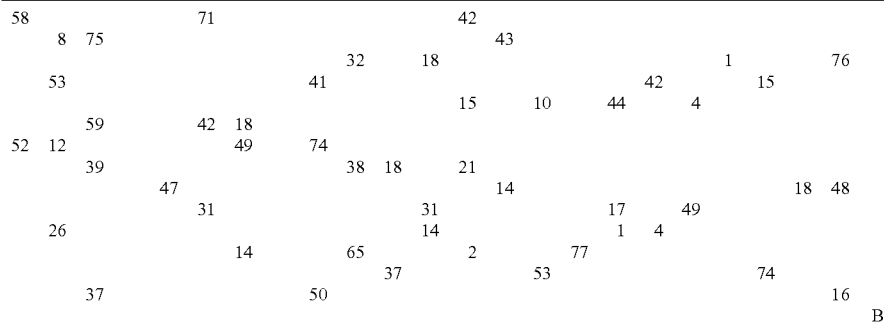

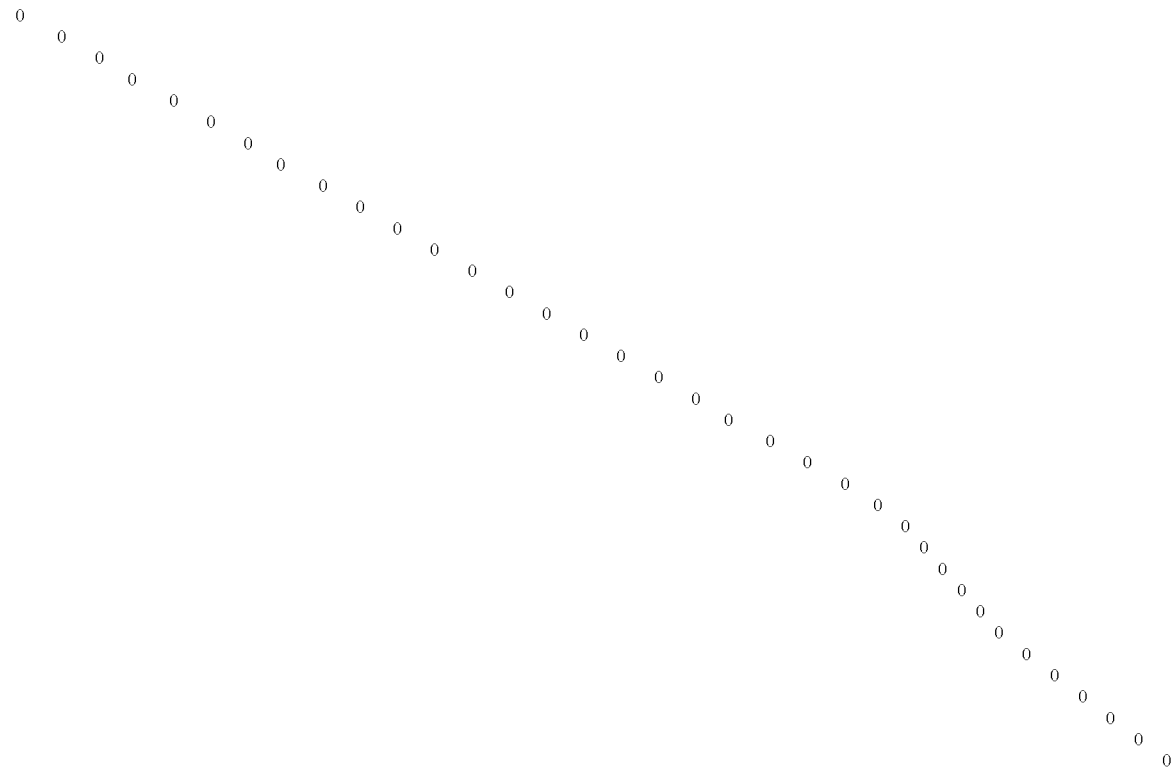

19. The method of claim 1, wherein the determining of the code block comprises:
   determining a total number of padding bits using the size of the code block and the number of input bits, and
   determining a number of padding bits to be applied to each code block using the total number of padding bits, and
   wherein the number of code blocks is determined by $C = \lceil B/K_{max} \rceil$, wherein the size of the code block other than the number of padding bits is determined by $J = \lceil B/C \rceil$,
   wherein the size of the code block is determined by $K' = \lceil J/(K_{min}) \rceil \times K_{min}$, wherein the total number of padding bits is determined by $K' = \lceil J/(K_{min}) \rceil \times K_{min}$, and wherein C indicates the number of code blocks, B indicates the number of input bits, $K_{max}$ indicates the maximum number of information bits corresponding to the largest parity-check matrix, J indicates the size of the code block other than the number of padding bits, K' indicates the size of the code block, F' indicates the total number of padding bits, and $K_{min}$ indicates the number of maximum information bits corresponding to a smallest parity-check matrix,
   wherein the parity-check matrix is further determined based on at least one of modulation and coding scheme (MCS) information and allocated system resource size information, and
   wherein the parity-check matrix is further determined based on the size of the code block or the size of the input bit before the segmentation is applied.

20. An apparatus for a channel decoding in a communication system, the apparatus comprising:
a transceiver configured to receive a signal;
at least one processor configured to:
    determine a size of an input bit before segmentation is applied from the received signal,
    determine a number of code blocks based on the size of the input bit and the maximum number of information bits corresponding to a largest parity-check matrix,
    determine a size of a code block based on the number of code blocks,
    determine a parity-check matrix based on the size of the code block; and
a decoder configured to:
    decode the input bits based on the parity-check matrix.

21. The apparatus of claim 20,
wherein the size of the code block is determined based on the maximum number of information bits corresponding to a smallest parity-check matrix when the number of code blocks is 1,
wherein the parity-check matrix is determined as a following matrix, and the following matrix indicates a location of 1 in a parity-check matrix, and
wherein the following matrix indicates a matrix in which A and A' are concatenated and B and B' are concatenated:

```
                                                                                                          A
54  19  24  68  12   2  18  16  13  46  66  52  21   9      80  24        3  11   1   0
10  76  29  30   8  28  16  35  62  53  57  53  15  38  72  73      45  38  71       0   0
70  71  31  35  20  21   6  56  36  52  22  37  50  27  58  16  56  41           0       0   0
41  24  25  49  28   6  28  60  22  70  11  27   1      67      22  78  76   5   1           0
27  70  45  45  28   9  29  30  39  29  56  80  29
    77   8  69  49  68  78      66   8   6  79  40
74  37  24  41   8  16  74  27  44  57  63  42  12              56
     9  20      25              18   3  59
                79       5  78   1              22
    24  47          67  30              43      18          42                              27
                78           58  51  70      35                                             64
     0          78      39   66  38               4                                    63
        45           3           12  11  38                  80
        62      57  12       26                                           27  35
    29                   34          23      51   3
        48                       44              54              71      61
                 7      33           28          64  42              2
    48      11
                73                           40  56      73                       77      37
    45
        51                  12                   40                                      41
                53   5          77           32  68      52      11  57  39          29
                                66                                       60
                    22                    9                  28
58                      71                              42
     8  75                                           43
                            32      18                                    1      76
    53                      41                                       42          15
                                             15      10      44       4
        59          42  18
52  12              49      74
        39                      38  18      21
                47                               14                      18  48
                    31                   31              17      49
    26                                   14               1   4
                        14       65       2          77
                                     37              53                  74
        37                   50                                              16
                                                                                          B
A'
```

```
0
  0
    0
      0
        0
          0
            0
              0
                0
                  0
                    0
                      0
                        0
                          0
                            0
```

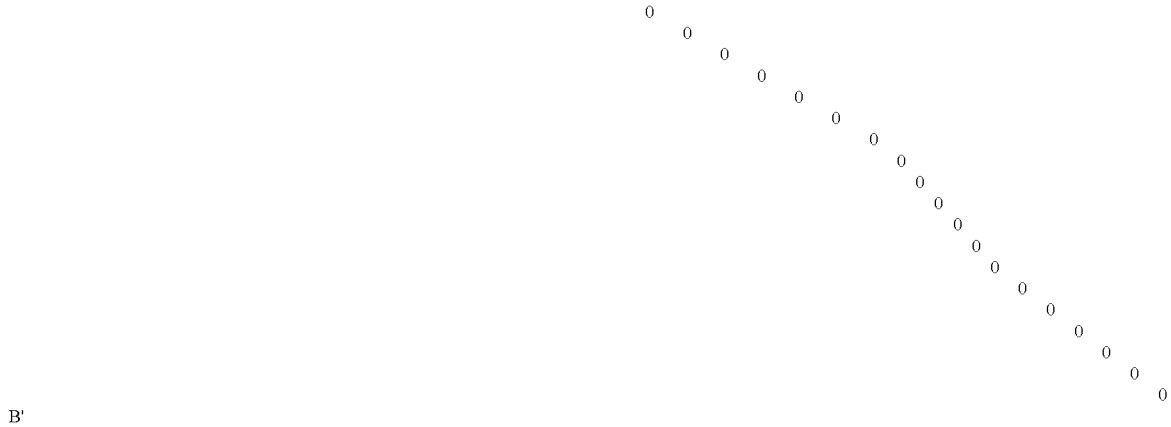

22. The apparatus of claim 20,
wherein the at least one processor is further configured to:
determine a total number of padding bits using the size of the code block and the number of input bits, and
determine the number of padding bits to be applied to each code block using a total number of padding bits,
wherein the number of code blocks is determined by $$C=\lceil B/K_{max}\rceil$$

wherein the size of the code block other than the number of padding bits is determined by $J=\lceil B/C\rceil$,
wherein the total number of padding bits is determined by $F'=K'\times C-B$,
wherein C indicates the number of code blocks, B indicates the number of input bits, $K_{max}$ indicates the maximum number of information bits corresponding to the largest parity-check matrix, J indicates the size of the code block other than the number of padding bits, K' indicates the size of the code block, F' indicates the total number of padding bits, and $K_{min}$ indicates the number of maximum information bits corresponding to a smallest parity-check matrix,
wherein the parity-check matrix is further determined based on at least one of modulation and coding scheme (MCS) information and allocated system resource size information, and
wherein the parity-check matrix is further determined based on the size of the code block or the size of the input bit before the segmentation is applied.

* * * * *